(12) United States Patent
Numata et al.

(10) Patent No.: US 8,032,997 B2
(45) Date of Patent: Oct. 11, 2011

(54) MANUFACTURING METHOD FOR A PIEZOELECTRIC VIBRATOR

(75) Inventors: Masashi Numata, Chiba (JP); Kiyoshi Aratake, Chiba (JP); Osamu Onitsuka, Chiba (JP); Junya Fukuda, Chiba (JP); Kazuyoshi Sugama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/857,234

(22) Filed: Aug. 16, 2010

(65) Prior Publication Data
US 2010/0308694 A1 Dec. 9, 2010

Related U.S. Application Data

(63) Continuation of application No. PCT/JP2008/069850, filed on Oct. 31, 2008.

(30) Foreign Application Priority Data

| Feb. 18, 2008 | (JP) | 2008-036422 |
| Jun. 24, 2008 | (JP) | 2008-164661 |
| Jun. 30, 2008 | (JP) | 2008-169961 |
| Jul. 3, 2008 | (JP) | 2008-174497 |

(51) Int. Cl.
*H04R 17/10* (2006.01)
*H01L 41/043* (2006.01)
(52) U.S. Cl. .......... 29/25.35; 29/852; 310/344; 310/366
(58) Field of Classification Search ........ 29/25.35, 29/852, 842, 847; 310/344, 348, 365, 366
See application file for complete search history.

(56) References Cited

U.S. PATENT DOCUMENTS
2005/0255234 A1* 11/2005 Kanda et al. ............. 29/25.35 X FOREIGN PATENT DOCUMENTS
JP 06-029049 A 2/1994
(Continued)

OTHER PUBLICATIONS
International Search Report for International Application No. PCT/JP2008/069850, dated Jan. 27, 2009, 2 pages.

*Primary Examiner* — A. Dexter Tugbang
(74) *Attorney, Agent, or Firm* — Brinks Hofer Gilson & Lione

(57) ABSTRACT

A process of manufacturing a piezoelectric vibrator comprises a base substrate; a lid substrate in which cavity recesses are formed and which is bonded to the base substrate in such a state that the recesses face the base substrate; a piezoelectric vibration member bonded to the upper face of the base substrate in such a state that it is housed in the cavity formed of the recess between the base substrate and the lid substrate; an external electrode formed on the lower face of the base substrate; a through-electrode formed in and through the base substrate and electrically connected with the external electrode with keeping the airtightness inside the cavity; and a routing electrode formed on the upper face of the base substrate to electrically connect the through-electrode to the bonded piezoelectric vibration member; wherein the through-electrode is formed in the base substrate by utilizing an electroconductive tack member having a tabular basis part and a core part extending from the basis part toward a direction perpendicular from a surface of the tabular basis part, where the core part is inserted into a through-hole formed in the base substrate and the basis part is removed by polishing the base substrate.

17 Claims, 62 Drawing Sheets

FOREIGN PATENT DOCUMENTS

| | | | | |
|---|---|---|---|---|
| JP | 06283951 A | * 10/1994 | | 29/25.35 |
| JP | 2002-124845 A | 4/2002 | | |
| JP | 2003-163562 A | 6/2003 | | |
| JP | 2003-209198 A | 7/2003 | | |
| JP | 2003-324166 A | 11/2003 | | |
| JP | 2006-148280 A | 6/2006 | | |
| JP | 2006-279872 A | 10/2006 | | |
| JP | 2007-013636 A | 1/2007 | | |

* cited by examiner

ENLARGED VIEW OF X PART

ENLARGED VIEW OF Y PART

MANUFACTURING METHOD FOR A PIEZOELECTRIC VIBRATOR

RELATED APPLICATIONS

This application is a continuation of PCT/JP2008/069850 filed on Oct. 31, 2008, which claims priority to Japanese Application Nos. 2008-036422 filed on Feb. 18, 2008, 2008-164661 filed on Jun. 24, 2008, 2008-169961 filed on Jun. 30, 2008, and 2008-174497 filed on Jul. 3, 2008. The entire contents of these applications are incorporated herein by reference.

BACKGROUND OF THE INVENTION

1. Field of the Invention

The present invention relates to a surface mount device-type (SMD) piezoelectric vibrator in which a piezoelectric vibration member is sealed up in a cavity formed between two bonded substrates, to an oscillator, an electronic device and a radio-controlled watch comprising the piezoelectric vibrator, to a piezoelectric vibrator manufacturing method for manufacturing the piezoelectric vibrator, and to a fixing jig for use in the method.

The present application is based on basic applications of Japanese Patent Application No. 2008-036422, Japanese Patent Application No. 2008-164661, Japanese Patent Application No. 2008-169961 and Japanese Patent Application No. 2008-174497, the entire contents thereof being hereby incorporated.

2. Description of the Related Art

In recent years, mobile telephones and portable information terminal devices employ a piezoelectric vibrator using quartz crystal or the like as a time source, a timing source of control signals or the like, a reference signal source, etc. As this type of piezoelectric vibrator, various ones are offered. As one of them, a surface mount device-type piezoelectric vibrator is known. As the piezoelectric vibrator of the type, generally known is a three-layer structure type one in which a piezoelectric substrate with a piezoelectric vibration member formed thereon is sandwiched between a base substrate and a lid substrate and bonded all together. In this case, the piezoelectric vibrator is housed in the cavity (sealed unit) formed between the base substrate and the lid substrate. Recently, not only the above-mentioned three-layer structure type one but also a two-layer structure type one has been developed.

The piezoelectric vibrator of the type has a two-layer structure in which the base substrate and the lid substrate are directly bonded to each other; and a piezoelectric vibration member is housed in the cavity formed between the two substrates. As compared with a three-layer structure one, the two-layer structure type piezoelectric vibrator is excellent in that it can be thinned, and is therefore favorably used. As one of such two-layer structure type piezoelectric vibrators, a piezoelectric vibrator is known, in which the piezoelectric vibration member is electrically connected to the external electrode formed on the base substrate using the electroconductive member formed to run through the base substrate (see Patent Reference 1 and Patent Reference 2).

The piezoelectric vibrator 600 comprises, as shown in FIG. 97 and FIG. 98, a base substrate 601 and a lid substrate 602 anodically-bonded to each other via a bonding film 607, and a piezoelectric vibration member 603 sealed up in the cavity C formed between the two substrates 601 and 602. The piezoelectric vibration member 603 is, for example, a tuning fork-type vibration member, and this is mounted on the upper face of the base substrate 601 via an electroconductive adhesive E in the cavity C.

The base substrate 601 and the lid substrate 602 are, for example, insulating substrates of ceramics, glass or the like. Of the two substrates 601 and 602, the base substrate 601 has through-holes 604 running through the base substrate 601. The through-hole 604 is filled with an electroconductive member 605 to seal up the through-hole 604. The electroconductive member 605 is electrically connected to the outer electrode 606 formed on the lower face of the base substrate 601, and is electrically connected to the piezoelectric vibration member 603 mounted in the cavity C.

Patent Reference 1: JP-A 2002-124845
Patent Reference 2: JP-A 2006-279872

In the above-mentioned, two-layer structure type piezoelectric vibrator, the electroconductive member 605 plays important two roles of blocking the through-hole 604 to thereby airtightly seal up the cavity C, and electrically connecting the piezoelectric vibration member 603 to the external electrode 606. In particular, in case where the adhesion to the through-hole 604 is insufficient, then the airtight sealing inside the cavity C may be lost; and in case where the contact with the electroconductive adhesive E or the external electrode 606 is insufficient, then the piezoelectric vibration member 603 may work erroneously. Accordingly, for evading such failures, the electroconductive member 605 must be formed in such a state that it completely blocks the through-hole 604 while kept in firm contact with the inner face of the through-hole 604 and it has no depression on the surface thereof.

However, Patent Reference 1 and Patent Reference 2 describe formation of the electroconductive member 605 with an electroconductive paste (Ag paste, Au—Sn paste, etc.), but have no description relating to a concrete manufacturing method of how to practically form it.

In general, in case where an electroconductive paste is used, it must be fired and hardened. In other words, after the through-hole 604 is filled with an electroconductive paste, it must be fired and hardened. When fired, however, the organic matter in the electroconductive paste may be lost through evaporation; and therefore, in general, the volume after firing decreases as compared with that before firing (for example, in case where an Ag paste is used as the electroconductive paste, the volume may decrease by about 20% or so). Accordingly, even when the electroconductive member 605 is formed with an electroconductive paste, the surface may have depressions formed thereon or, in some serious cases, there may be a risk of forming through-holes in the center.

As a result, the cavity C may lose its airtightness, or there is a possibility that the electric connection between the piezoelectric vibration member 603 and the external electrode 606 may be lost.

SUMMARY OF THE INVENTION

The present invention has been made in consideration of the situation as above, and its object is to provide a high-quality two-layer structure-type, surface-mount piezoelectric vibrator that surely maintains the airtightness inside the cavity and secures stable electric connection between the piezoelectric vibration member and the external electrode. The invention is also to provide a piezoelectric vibrator manufacturing method of efficiently manufacturing many such piezoelectric vibrators all at a time, and to provide an oscillator, an electronic device and a radio-controlled watch comprising the piezoelectric vibrator.

To solve the above-mentioned problems and to attain the objects, the invention provides the following means:

(1) The piezoelectric vibrator manufacturing method of the invention is a method for manufacturing a plurality of piezoelectric vibrators in which a piezoelectric vibration member is sealed up in a cavity formed between a base substrate and a lid substrate bonded to each other, all at once by utilizing a base substrate wafer and a lid substrate wafer, and the method comprises a recess forming step of forming, in the lid substrate wafer, a plurality of cavity recesses for forming cavities when the two wafers are overlaid; a through-electrode forming step of forming a plurality of through-electrodes in and through the base substrate wafer by utilizing an electroconductive tack member having a tabular basis part and a core part extending from the basis part toward the direction nearly perpendicular to the surface of the basis part; a routing electrode forming step of forming a plurality of routing electrodes connected electrically with the through-electrodes, on the upper face of the base substrate wafer; a mounting step of bonding the plural piezoelectric vibration members to the upper face of the base substrate wafer via the routing electrodes; an overlaying step of overlaying the base substrate wafer and the lid substrate wafer thereby to house the piezoelectric vibration members in the cavities surrounded by the recesses and the two wafers; a bonding step of bonding the base substrate wafer and the lid substrate wafer thereby to seal up the piezoelectric vibration members in the cavities; an external electrode forming step of forming a plurality of external electrodes connected electrically with the through-electrodes, on the lower face of the base substrate wafer; and a cutting step of cutting the two bonded wafers thereby to shred them into the plural piezoelectric vibrators, wherein the through-electrode forming step includes a through-hole forming step of forming a plurality of through-holes in and through the base substrate wafer; a setting step of inserting the core part of the tack member into these plural through-holes until the basis part thereof is kept in contact with the base substrate wafer, and disposing a connection member formed of a glass material in the space between the core part and the through-hole; a firing step of firing the connection member at a predetermined temperature to thereby integrally fix the through-hole, the connection member and the tack member to each other; and a polishing step of, after the firing, polishing at least the face of the upper and lower faces of the base substrate wafer, having the basis part disposed thereon, to thereby remove the basis part and to expose the core part out of both the upper and lower faces of the base substrate wafer.

According to the piezoelectric vibrator manufacturing method of the invention, the through-electrode is formed by utilizing the tack member and the connection member but not using an electroconductive paste, and therefore a high-quality two-layer structure-type, surface-mount piezoelectric vibrator that secures the airtightness in the cavity and secures stable electric connection between the piezoelectric vibration member and the external electrode can be produced. In addition, since a base substrate wafer and a lid substrate wafer are used, many such piezoelectric vibrators can be manufactured efficiently all at once, and their cost may be reduced.

(2) As the core part, one which is formed to extend to a length substantially equal to the thickness of the base substrate wafer and is formed to have a flat end may be used; as the connection member, a cylindrical body which is formed to have two flat ends and a thickness substantially equal to that of the base substrate wafer, may be used; in the setting step, the cylindrical body may be implanted in the plural through-holes and the core part of the tack member may be inserted into the center hole of the cylindrical body until the basis part thereof is kept in contact with the base substrate wafer; and in the polishing step, the basis part may be polished and removed.

In this case, first attained is the recess forming step for forming a plurality of cavity recesses in the lid substrate wafer. The recesses are those to be cavities when the two wafers are overlaid later.

At the same time or in a timing of before or after the step, a through-electrode forming step is attained for forming a plurality of through-electrodes in the base substrate wafer. In this stage, plural through-electrodes are formed so as to be housed in the cavities formed in the lid substrate wafer when the two wafers are overlaid later.

The through-electrode forming step is described in detail. First, a through-hole forming step is attained for forming a plurality of through-holes in and through the base substrate wafer. Subsequently, a setting step is attained for implanting a cylindrical body of a glass material in these plural through-holes by pushing it thereinto, and inserting the core part of the tack member into the center hole of the cylindrical body. In this stage, the core part is inserted until the basis part of the tack member is kept in contact with the base substrate wafer. Accordingly, the two ends of the core part can be substantially in a flat condition relative to the surface of the base substrate wafer.

In case where the core part not having a basis part is inserted into the center hole, its position must be so adjusted that the two ends of the core part could be in a flat condition relative to the surface of the base substrate wafer. However, since the tack member having the core part formed on the basis part thereof is used, the two ends of the core part can be surely and readily kept in a flat condition relative to the surface of the base substrate wafer merely in a simple operation of pushing the tack member until the basis part thereof is kept in contact with the base substrate wafer. Accordingly, the workability in the setting step can be enhanced.

Moreover, by keeping the basis part in contact with the surface of the base substrate wafer, the position of the cylindrical body previously pushed and inserted prior to the tack body can be adjusted at the same time. Accordingly, the two ends of the cylindrical body can be made substantially in a flat condition relative to the surface of the base substrate wafer.

In that manner, in the setting step, the two ends of both the cylindrical body and the core part can be easily and surely in a substantially flat condition relative to the surface of the base substrate wafer.

Further, since the basis part is formed to be tabular, even when the base substrate wafer is put on a flat face such as a desk or the like after the setting step and before the subsequent firing step, it may be kept stable but is not shaky. In this point, the workability can be enhanced.

Subsequently, a firing step is attained for firing the implanted cylindrical body at a predetermined temperature. Accordingly, the through-hole, the cylindrical body implanted in the through-hole and the tack member inserted in the cylindrical body firmly stick to each other. In firing, the basis part is also fired together with them, and therefore the two ends of the cylindrical body and the core part can be all integrally fixed to each other while kept substantially in a flat condition relative to the surface of the base substrate wafer. Subsequently, after the firing, a polishing step is attained for polishing and removing the basis part of the tack member. Accordingly, the basis part that has played a role of positioning the cylindrical body and the core part can be removed, and only the core part can be left inside the cylindrical body.

As a result, a plurality of through-electrodes can be formed, in which the cylindrical body and the core part are integrally fixed to each other.

In particular, in forming the through-electrodes, no paste is used but a cylindrical body of a glass material and an electroconductive core part are used to form the through-electrodes, different from conventional ones. In case where a paste is used, the organic matter in the paste may evaporate in firing with the result that the paste volume may remarkably decrease as compared with that before firing. Accordingly, in case where only a paste is implanted in the through-hole, then the paste surface may have large depressions after firing.

However, since the cylindrical body and the core part are used but a paste is not used as so mentioned in the above, there is no risk of forming any great depressions in the surface after firing. By firing, the volume of the cylindrical body may reduce in some degree; however, differing from the case with a paste, the reduction is not so much remarkable and the resulting depressions can be on an ignorable level.

Accordingly, the surface of the base substrate wafer and the two ends of the cylindrical body and the core part can be substantially in a flat condition, as so mentioned in the above. In other words, the surface of the base substrate wafer and the surface of the through-electrode can be substantially in a flat condition.

Next, a routing electrode forming step is attained for forming a plurality of routing electrodes connected electrically with the through-electrodes by patterning an electroconductive material on the upper face of the base substrate wafer. In this stage, the routing electrode is so formed that it can be housed in the recess formed in the lid substrate wafer when the two wafers are overlaid later.

In particular, the through-electrode comprising the cylindrical body and the core part is substantially in a flat condition relative to the upper face of the base substrate wafer as so mentioned in the above. Accordingly, the routing electrode as patterned on the upper face of the base substrate wafer is kept in airtight contact with the through-electrode with no space therebetween. This secures the electric connection between the routing electrode and the through-electrode.

Next, a mounting step is attained for bonding a plurality of piezoelectric vibration members to the upper face of the base substrate wafer each via the routing electrode. Accordingly, the bonded piezoelectric vibration members are electrically connected to the through-electrodes via the routing electrodes. After the mounting operation, an overlaying step is attained for overlaying the base substrate wafer and the lid substrate wafer. Accordingly, the bonded plural piezoelectric vibration members are kept housed in the cavities surrounded by the recesses and the two wafers.

Next, a bonding step is attained for bonding the overlaid two wafers to each other. Accordingly, the two wafers adhere firmly to each other and therefore the piezoelectric vibration members can be sealed up in the cavities. In this stage, the through-holes formed in the base substrate wafer are blocked up with the through-electrodes, and therefore the airtightness inside the cavities is not broken through the through-holes. In particular, the cylindrical body and the core part are integrally fixed to each other by firing and these are firmly fixed to the through-holes, therefore surely securing the airtightness inside the cavities.

Next, an external electrode forming step is attained for forming a plurality of external electrodes electrically connected with the respective through-electrodes by patterning an electroconductive material on the lower face of the base substrate wafer. Also in this case, the through-electrodes are kept substantially in a flat condition relative to the lower face of the base substrate wafer like in the formation of the routing electrodes, and therefore, the patterned external electrodes are kept in airtight contact with the through-electrodes with no space therebetween. Accordingly, the electric connection between the external electrode and the through-electrode can be secured. As a result of this step, the piezoelectric vibration members sealed up in the cavities can be activated as utilizing the external electrodes.

Finally, a cutting step is attained for cutting the base substrate wafer and the lid substrate wafer bonded to each other, to thereby shred them into a plurality of piezoelectric vibrators.

As a result, a plurality of two-layer structure-type surface-mount piezoelectric vibrators with piezoelectric vibration members sealed up in cavities formed between a base substrate and a lid substrate bonded to each other can be manufactured all at once.

In particular, since the through-electrodes can be formed substantially in a flat condition relative to the base substrate, the through-electrodes can be surely kept in airtight contact with the routing electrodes and the external electrodes. As a result, stable electric connection between the piezoelectric vibration members and the external electrodes can be secured, and the reliability of operation performance can be enhanced to attain high-quality devices. Moreover, since the through-electrode is constituted with the electroconductive core part, it secures extremely stable electroconductivity.

In addition, since the airtightness inside the cavities is surely kept, the high quality of the devices is secured in this respect.

(3) As the cylindrical body, one previously temporary-fired before firing may be used.

In this case, since the cylindrical body is previously temporary-fired, it hardly deforms or its volume hardly reduces in the subsequent firing. Accordingly, through-electrodes of higher quality can be formed, and the airtightness inside the cavities can be secured more. As a result, piezoelectric vibrators having further higher quality can be manufactured.

(4) As the connection member, a pasty glass frit may be used; in the setting step, the core part of the tack member may be disposed in the plural through-holes and the glass frit may be applied onto the face opposite to the face on which the basis part is disposed of the upper and lower faces of the base substrate wafer to thereby fill the glass frit into the space between the through-hole and the core part of the tack member; in the polishing step, the basis part may be removed by polishing the face of the upper and lower faces of the base substrate wafer on which the basis part is disposed, and the core part may be exposed out by polishing the face on the opposite side of the base substrate wafer; and the length of the core part before the polishing step may be shorter than the thickness of the base substrate wafer.

In this case, in forming the through-electrodes in the base substrate wafer, the tack member of which the length of the core part is shorter than the thickness of the through-electrode is used, the core part is protected from being inclined through contact with anything before the glass frit is fired and the through-hole, the glass frit and the core part of the tack member are integrally fixed to each other, and therefore, stable electric connection between the piezoelectric vibration member and the external electrode can be secured and the yield ratio can be increased.

(5) The setting step may include a glass frit removing step of removing the glass frit excessively given to the opposite face with a squeegee; and the length of the core part may be so defined that the squeegee and the core part of the tack member are not brought into contact with each other in the glass frit removing step.

In general, when the through-hole is filled with a pasty glass frit, the glass frit not filled in the through-hole may overflow to the face of the upper and lower faces of the base substrate wafer on the opposite side to the face on which the basis part is disposed, and therefore, before firing, the excessive glass frit is preferably removed; and in this case, using a squeegee, the glass frit can be filled and removed. In addition, the length of the core part of the tack member is made shorter than the thickness of the base substrate wafer so that the core part is not brought into contact with the squeegee, and accordingly, the core part is surely protected from being inclined in the glass frit removing step. Therefore, the stable electric connection between the piezoelectric vibration member and the external electrode can be secured, and the yield ratio can be increased.

(6) The length of the core part may be shorter by at least 0.02 mm than the thickness of the base substrate wafer.

In this case, the core part can be more surely protected from being in contact with the squeegee in the glass frit removing step.

(7) As the connection member, a glass frit may be used; the setting step may include a core part inserting step of inserting the core part of the tack member into the inside of the plural through-holes formed in the base substrate wafer, from one side of the base substrate wafer; a fixing jig disposing step of disposing a fixing jig that is to regulate the posture of the tack member by putting the basis part of the tack member in the state having the core part thereof inserted into the base substrate wafer, between the base substrate wafer and the jig, on one side of the base substrate wafer; a frit filling step of filling a glass frit so as to block up the space between the inner peripheral wall of the through-hole and the tack member; a tucking step of tucking the basis part of the tack member into the space between the base substrate wafer and the fixing jig by a holding jig of mutually closely holding the fixing jig and the base substrate wafer, to thereby make the surface of the basis part kept in contact with the base substrate wafer so as to regulate the posture of the tack member in such a manner that the axial line of the core part of the tack member can be in parallel to the axial line of the through hole; in the firing step, the firing may be attained while the basis part of the tack member is kept tucked in the space between the base substrate wafer and the fixing jig by the holding jig; in the polishing step, the basis part of the tack member may be removed by polishing and the two faces of the base substrate may be polished.

In this case, in the setting step, first the core part inserting step is attained for inserting the core part of the tack member into the inside of the plural through-holes formed in the base substrate wafer, from one side of the base substrate wafer.

At the same time or in a timing of before or after the core part inserting step, a fixing jig disposing step is attained for disposing a fixing jig on one side of the base substrate wafer.

Next, a frit filling step is attained for filling a glass frit so as to block up the space between the inner peripheral wall of the through-hole and the tack member.

In a timing of before or after the frit filling step, a tucking step is attained for tucking the basis part of the tack member into the space between the base substrate wafer and the fixing jig. Accordingly, the surface of the basis part is kept in contact with the base substrate wafer and the posture of the tack member can be regulated so that the axial line of the core part of the tack member can be in parallel to the axial line of the through-hole.

Next, a firing step is attained for heating and firing the glass frit. Accordingly, the through-hole, the tack member and the glass frit can be integrally fixed to each other.

In particular, since the firing is attained in the condition that the basis part of the tack member is tucked in the space between the base substrate wafer and the fixing jig by the holding jig that mutually keep the fixing jig in close contact with the base substrate wafer, the tucked condition of the basis part of the tack member can be surely secured.

Accordingly, the firing is attained while the surface of the basis part of the tack member is kept in contact with the base substrate wafer, and the basis part is fixed to the base substrate wafer with no inclination.

In addition, the firing is attained in the condition that the axial line of the core part of the tack member is kept in parallel to the axial line of the through-hole, and the core part is fixed to the through-hole with no inclination between the axial line of the core part and the axial line of the through-hole. Accordingly, since the space inside the through-hole is not non-uniformly divided by the core part, and since the glass frit is not filled in a broad space, a risk of forming a depressed area in the surface of the glass frit by firing and a risk of forming a hollow part inside the glass frit may be evaded.

Next, a polishing step is attained for polishing and removing the basis part of the tack member and for polishing the two faces of the base substrate wafer.

In particular, since the basis part of the tack member is fixed to the base substrate wafer with no inclination, the contact area between the base substrate wafer and the tack member is broad, and when the basis part is removed by polishing, the force acting on the base substrate wafer is not locally concentrated. Therefore, the base substrate wafer is prevented from cracking.

In addition, since the formation of a depressed part or a hollow in the glass frit is inhibited, the bumps that may remain on the surface of the glass frit after the polishing step may be extremely reduced, and the glass frit can be made in a substantially flat condition relative to the base substrate wafer. Accordingly, the thickness of the routing electrodes to be formed on the surface of the glass frit can be prevented from fluctuating to be locally thinned, and the reliability of the routing electrodes can be enhanced. Therefore, stable electric connection between the piezoelectric vibration member and the through-electrode can be secured, and more stable electric connection between the piezoelectric vibration member and the external electrode can be secured.

In addition, since the axial line of the core part of the tack member is not inclined relative to the axial line of the through-hole, the necessary thickness of the base substrate wafer can be secured even after the core part is exposed out via the polishing step.

(8) In the tucking step, the fixing jig and the base substrate wafer overlaid with each other may be held by the holding jig on the respective outer surfaces.

In this case, the fixing jig and the base substrate wafer overlaid with each other are held by the holding jig on the respective outer surfaces, whereby the two can be mutually kept in close contact with each other.

(9) As the connection member, a glass frit may be used; in the setting step, the core part of the tack member may be inserted into the inside of each of the plural through-holes until the basis part thereof is kept in contact with the substrate wafer, and the glass frit may be filled so as to block up the space between the inner peripheral wall of the through-hole and the tack member; in the polishing step, the basis part of the tack member may be polished and removed and the two faces of the base substrate wafer may be polished; and the through-electrode forming step may include a flat face forming step after the polishing step for implanting an implant member into the depressions of the upper face of the glass frit and forming a flat face on the upper face side of the glass frit.

In this case, first attained is a recess forming step for forming a plurality of cavity recesses in the lid substrate wafer. The recesses are those to be cavities when the two wafers are overlaid later.

At the same time or in a timing of before or after the step, a through-electrode forming step is attained for forming a plurality of through-electrodes in the base substrate wafer. In this stage, plural through-electrodes are formed so as to be housed in the cavities formed in the lid substrate wafer when the two wafers are overlaid later.

The through-electrode forming step is described in detail. First, a through-hole forming step is attained for forming a plurality of through-holes in and through the base substrate wafer. Subsequently, a setting step is attained for inserting the core part of a tack member into each of these plural through-holes and filling a glass frit so as to block up the space between the inner peripheral wall of the through-hole and the tack member. In this stage, the core part is inserted until the basis part of the tack member is kept in contact with the base substrate wafer.

Next, a firing step is attained for firing the implanted glass frit. Accordingly, the through-hole, the tack member and the glass frit firmly stick to each other. After the firing, a polishing step is attained for polishing and removing the basis part of the tack member, and polishing the two faces of the base substrate wafer until the core part of the tack member is exposed out. As a result, the core part acts as a through-electrode that is formed to run through the base substrate wafer. The through-electrode is formed of the electroconductive core part and secures stable electric conductivity.

In the polishing step, the part hardened to surround the bubbles inside the fired glass frit may be exposed out on the surface as fine depressions. Accordingly, next, a flat face forming step is attained for implanting the depressions in the upper face of the glass frit with an implant member and for forming a flat face on the upper face side of the glass frit.

In the above, the through-electrode forming step is finished.

Next, a routing electrode forming step is attained for forming a plurality of routing electrodes electrically connected with through-electrodes on the upper face of the base substrate wafer. In this case, the routing electrodes are so formed as to be housed in the recesses formed in the lid substrate wafer when the two wafers are overlaid later.

Next, a mounting step is attained for bonding a plurality of piezoelectric vibration members to the upper face of the base substrate wafer each via the routing electrode. Accordingly, the bonded piezoelectric vibration members are electrically connected to the through-electrodes via the routing electrodes. After the mounting operation, an overlaying step is attained for overlaying the base substrate wafer and the lid substrate wafer. Accordingly, the bonded plural piezoelectric vibration members are kept housed in the cavities surrounded by the recesses and the two wafers. Next, a bonding step is attained for bonding the overlaid two wafers to each other. Accordingly, the piezoelectric vibration members can be sealed up in the cavities.

Next, an external electrode forming step is attained for forming a plurality of external electrodes electrically connected with through-electrodes, on the lower face of the base substrate wafer. As a result of this step, the piezoelectric vibration members sealed up in the cavities can be operated as utilizing the external electrodes.

Finally, a cutting step is attained for cutting the base substrate wafer and the lid substrate wafer bonded to each other, to thereby shred them into a plurality of piezoelectric vibrators.

As a result, a plurality of two-layer structure-type surface-mount piezoelectric vibrators with piezoelectric vibration members sealed up in cavities formed between a base substrate and a lid substrate bonded to each other can be manufactured all at once.

In particular, even when fine depressions are formed in the upper face of the glass frit, a flat face can be formed on the upper face side of the glass frit by the flat face forming step, and therefore, the routing electrodes can be formed in a uniform thickness. Accordingly, the risk of local breakage of the routing electrode owing to time degradation or the like may be extremely reduced, and as a result, more stable electric connection between the piezoelectric vibration member and the external electrode can be secured, and the reliability of the piezoelectric vibrator can be thereby increased.

(10) As the implant member, an electroconductive material may be used.

In this case, an electroconductive material is used as the implant member, and therefore, even when the implant member is disposed between the through-electrode and the routing electrode, the electric connection between the two electrodes can be maintained. Accordingly, in the flat face forming step, even when the flat face is formed by covering the through-electrode with the implant member, the above-mentioned electric connection can be still secured. In other words, it is unnecessary to implant the implant member limitatively into only the depressions of the upper face of the glass frit, and therefore the flat face forming step may be simplified.

(11) The flat face forming step may include an implanting step of implanting the implant member into the depressions in the upper face of the glass frit; and a planarizing step of polishing the implant member to thereby form the flat face that is on the same level as that of the upper face of the base substrate wafer by the surface of the implant member and the upper face of the glass frit.

In this case, as the flat face forming step, first attained is the implanting step of implanting an implant member into the depressions of the upper face of the glass frit. This is followed by the planarizing step of polishing the implant member. In this stage, the surface of the implant member and the upper face of the glass frit form a flat face that is on the same level as that of the upper face of the base substrate wafer. In other words, the surface of the implant member, the upper face of the glass frit and the upper face of the base substrate wafer are all in a flat condition.

In particular, in the planarizing step, the implant member is polished so that the surface of the implant member and the upper face of the glass frit are made to form a flat face. Accordingly, in implanting the implant member into the depressions of the upper face of the glass frit in the implanting step, even when the implant member is implanted to cover the through-electrode, the part thereof that covers the through-electrode can be removed in the planarizing step, and therefore the electric connection between the through-electrode and the routing electrode can be still secured. In other words, it is unnecessary to implant the implant member limitatively into only the depressions of the upper face of the glass frit, and therefore the flat face forming step may be simplified.

(12) As the implant member, one of which the thermal expansion coefficient is substantially equal to that of the glass frit may be used.

In this case, since the thermal expansion coefficient of the implant member is substantially equal to that of the glass frit, the adhering state of the two can be stably maintained even when the implant member and the glass frit are heated in bonding the piezoelectric vibration member thereto. Accordingly, the adhering state of the routing electrode and the through-electrode can be maintained and the electric connection between the two can be surely secured.

(13) As the implant member, one of which the melting point is lower than that of the glass frit may be used.

In this case, the implant material to be used has a lower melting point than that of the glass frit, and therefore, in implanting the depressions of the upper face of the glass frit with the implant member in the flat face forming step, even when a melted implant material is used, the depressions can be implanted with it not melting the glass frit.

(14) As the base substrate wafer and the core part, those of which the thermal expansion coefficient is substantially equal to that of the connection member may be used.

In this case, as the base substrate wafer and the core part, those of which the thermal expansion coefficient is substantially equal to that of the connection member are used, and therefore, the three can thermally expand similarly to each other in firing. Accordingly, through-electrodes of higher quality can be formed. As a result, the quality of the piezoelectric vibrators can be further increased.

(15) As the base substrate wafer, one formed of the same glass material as that of the connection member may be used; and as the core part, one of which the thermal expansion coefficient is substantially equal to that of the connection member may be used.

In this case, as the base substrate wafer, one formed of the same glass material as that of the connection member is used, and as the core part, one of which the thermal expansion coefficient is substantially equal to that of the connection member is used; and therefore, the three can thermally expand similarly to each other in firing. Accordingly, through-electrodes of higher quality can be formed. As a result, the quality of the piezoelectric vibrators can be further increased.

(16) Prior to the mounting step, the method may comprise a bonding film forming step of forming, on the upper face of the base substrate wafer, a bonding film to surround the periphery of the recesses when the base substrate wafer and the lid substrate wafer are overlaid; and in the bonding step, the two wafers may be anodically bonded via the bonding film.

In this case, since the base substrate wafer and the lid substrate wafer are anodically bonded via a bonding film, the two wafers can be more tightly bonded to each other to increase the airtightness inside the cavities. Accordingly, the piezoelectric vibration members can be vibrated with a higher degree of accuracy, and the devices can have further higher quality.

(17) In the mounting step, the piezoelectric vibration members may be bump-bonded with an electroconductive bump.

In this case, since the piezoelectric vibration members are bump-bonded, the piezoelectric vibration members can be spaced above from the upper face of the base substrate by the thickness of the bump. Accordingly, the required minimum vibration gap necessary for vibration of the piezoelectric vibration members can be naturally secured. Therefore, the reliability of the operation performance of the piezoelectric vibrators can be further enhanced.

(18) The fixing jig of the invention is a fixing jig for use in carrying out the piezoelectric vibration manufacturing method of any one of the above (1) to (17); which comprises a tabular fixing jig body; a positioning part for positioning the base substrate wafer relative to the surface of the fixing jig body; and a plurality of tack recesses which are so formed that they have a flat bottom, that their depth is substantially equal to the thickness of the basis part of the tack member and that the inner diameter of the inner peripheral wall on the bottom side thereof is substantially equal to the outer diameter of the basis part, in the position facing the through-holes of the base substrate wafer as positioned by the positioning part, in the surface of the fixing jig body.

The fixing jig of the invention comprises a fixing jig body having a positioning part; and therefore, it facilitates the positioning of the base substrate wafer relative to the fixing jig.

The tack recess is formed in the position facing to the through-hole of the base substrate wafer positioned by the positioning part, and therefore, by positioning the base substrate wafer relative to the fixing jig in the condition that the basis part of the tack member is disposed in the tack recess, the core part of the tack member can be readily disposed in the through-hole.

In addition, the tack recess is formed to have a flat bottom and have a depth substantially equal to the thickness of the basis part, and therefore, by mutually keeping the fixing jig and the base substrate wafer in close contact with each other in the condition that the basis part of the tack member is disposed in the tack recess, the surface of the basis part of the tack member can be readily kept in contact with the base substrate wafer.

Further, the tack recess is so formed that the inner diameter of the inner peripheral wall on the bottom side thereof is substantially equal to the outer diameter of the basis part, and therefore, by positioning the basis part of the tack member in the tack recess, the peripheral face of the basis part of the tack member can be held by the inner peripheral wall on the bottom side of the tack recess. Accordingly, even when any external force is given to the tack member, the posture of the tack member is prevented from changing.

(19) The tack recess may be tapered in such a manner that the diameter of the open end thereof gradually decreases toward the bottom side of the tack recess.

In this case, as the fixing jig, used is one in which the open end of the tack recess is tapered in such a manner that the diameter of the open end thereof gradually decreases toward the bottom side of the tack recess; and therefore, the basis part of the tack member can be smoothly inserted into the tack recess. Accordingly, when the basis part is inserted into the tack recess, the basis part does not incline, and therefore the posture of the tack member can be more stably regulated.

(20) The piezoelectric vibrator of the invention comprises a base substrate; a lid substrate in which cavity recesses are formed and which is bonded to the base substrate in such a state that the recesses face the base substrate; a piezoelectric vibration member bonded to the upper face of the base substrate in such a state that it is housed in the cavity formed of the recess between the base substrate and the lid substrate; an external electrode formed on the lower face of the base substrate; a through-electrode formed in and through the base substrate and electrically connected with the external electrode with keeping the airtightness inside the cavity; and a routing electrode formed on the upper face of the base substrate to electrically connect the through-electrode to the bonded piezoelectric vibration member; wherein the through-electrode is formed of a cylindrical body, which is formed of a glass material to have two flat ends and a thickness substantially equal to that of the base substrate, and is implanted in the through-hole running through the base substrate; and an electroconductive core member which is formed to have two flat ends and a thickness substantially equal to that of the base substrate and is inserted into the center hole of the cylindrical body; and the through-hole, the cylindrical body and the core member are integrally fixed to each other by firing.

The piezoelectric vibrator of the invention can exhibit the same advantage and effect as those of the piezoelectric vibrator manufacturing method of the above (1).

(21) The cylindrical body may be previously temporary-fired before firing.

In this case, the same advantage and effect as those of the piezoelectric vibrator manufacturing method of the above (3) can be attained.

(22) The thermal expansion coefficient of the base substrate and the core part may be substantially equal to that of the cylindrical body.

In this case, the same advantage and effect as those of the piezoelectric vibrator manufacturing method of the above (14) can be attained.

(23) The base substrate may be formed of the same glass material as that of the cylindrical body; and the core part may have a thermal expansion coefficient substantially equal to that of the cylindrical body.

In this case, the same advantage and effect as those of the piezoelectric vibrator manufacturing method of the above (15) can be attained.

(24) The piezoelectric vibrator of the invention comprises a base substrate; a lid substrate in which cavity recesses are formed and which is bonded to the base substrate in such a state that the recesses face the base substrate; a piezoelectric vibration member bonded to the upper face of the base substrate in such a state that it is housed in the cavity formed of the recess between the base substrate and the lid substrate; an external electrode formed on the lower face of the base substrate; a through-electrode formed in the through-hole that runs through the base substrate in the vertical direction thereof, so as to run through the base substrate, and connected electrically with the external electrode; a routing electrode formed on the upper face of the base substrate to electrically connect the through-electrode to the bonded piezoelectric vibration member; which comprises a glass frit filled to block up the space between the inner peripheral wall of the through-hole formed in the base substrate and the through-electrode, and formed to have depressions in the upper face thereof; and an implant member implanted in the depressions of the upper face of the glass frit to form a flat face on the upper face side of the glass frit.

The piezoelectric vibrator of the invention can exhibit the same advantage and effect as those of the piezoelectric vibrator manufacturing method of the above (9).

(25) The implant member may be an electroconductive material.

This case can exhibit the same advantage and effect as those of the piezoelectric vibrator manufacturing method of the above (10).

(26) The implant member may be such that the surface of the implant member and the upper face of the glass frit form a flat face that is in a flat condition relative to the upper face of the base substrate.

This case can exhibit the same advantage and effect as those of the piezoelectric vibrator manufacturing method of the above (11).

(27) The implant member may have a thermal expansion coefficient substantially equal to that of the glass frit.

This case can exhibit the same advantage and effect as those of the piezoelectric vibrator manufacturing method of the above (12).

(28) The implant member may have a melting point lower than that of the glass frit.

This case can exhibit the same advantage and effect as those of the piezoelectric vibrator manufacturing method of the above (13).

(29) The base substrate and the lid substrate may be anodically bonded to each other via the bonding film formed between the two substrates so as to surround the periphery of the recesses.

This case can exhibit the same advantage and effect as those of the piezoelectric vibrator manufacturing method of the above (16).

(30) The piezoelectric vibration member can be bump-bonded with an electroconductive bump.

This case can exhibit the same advantage and effect as those of the piezoelectric vibrator manufacturing method of the above (17).

(31) The oscillator of the invention comprises, as the oscillation member therein, the piezoelectric vibrator of any one of the above (20) to (30) as electrically connected to the integrated circuit therein.

(32) The electronic device of the invention comprises the piezoelectric vibrator of any one of the above (20) to (30) as electrically connected to the timer part therein.

(33) The radio-controlled watch of the invention comprises the piezoelectric vibrator of any one of the above (20) to (30) as electrically connected to the filter part therein.

The oscillator, the electronic device and the radio-controlled watch of the invention comprise a high-quality piezoelectric vibrator in which the cavity is surely airtightly sealed up and of which the reliability of the operation performance is enhanced, and therefore the reliability of the operation performance thereof can be enhanced and the quality thereof can be thereby increased.

The piezoelectric vibrator of the invention is a high-quality two-layer structure-type, surface-mount piezoelectric vibrator in which the airtightness inside the cavity is secured and the stable electric connection between the piezoelectric vibration member and the external electrode is secured.

According to the piezoelectric vibrator manufacturing method of the invention, the above-mentioned piezoelectric vibrators can be efficiently manufactured all at once, and the cost thereof can be thereby reduced.

Using the fixing jig of the invention, the above-mentioned manufacturing method can be surely carried out.

The oscillator, the electronic device and the radio-controlled watch of the invention comprise the above-mentioned piezoelectric vibrator, and similarly the operation reliability thereof can be enhanced and the quality thereof can be thereby increased.

DETAILED DESCRIPTION OF THE PREFERRED EMBODIMENTS

First Embodiment

The first embodiment of the piezoelectric vibrator manufacturing method and the piezoelectric vibrator manufactured according to the manufacturing method of the invention is described below with reference to FIG. 1 to FIG. 19.

The piezoelectric vibrator 1 of this embodiment is, as shown in FIG. 1 to FIG. 4, a surface-mount piezoelectric vibrator that is formed to have a two-layer laminate boxy shape composed of a base substrate 2 and a lid substrate 3, in which a piezoelectric vibration member 4 is housed in the cavity C inside it.

Figure 4:
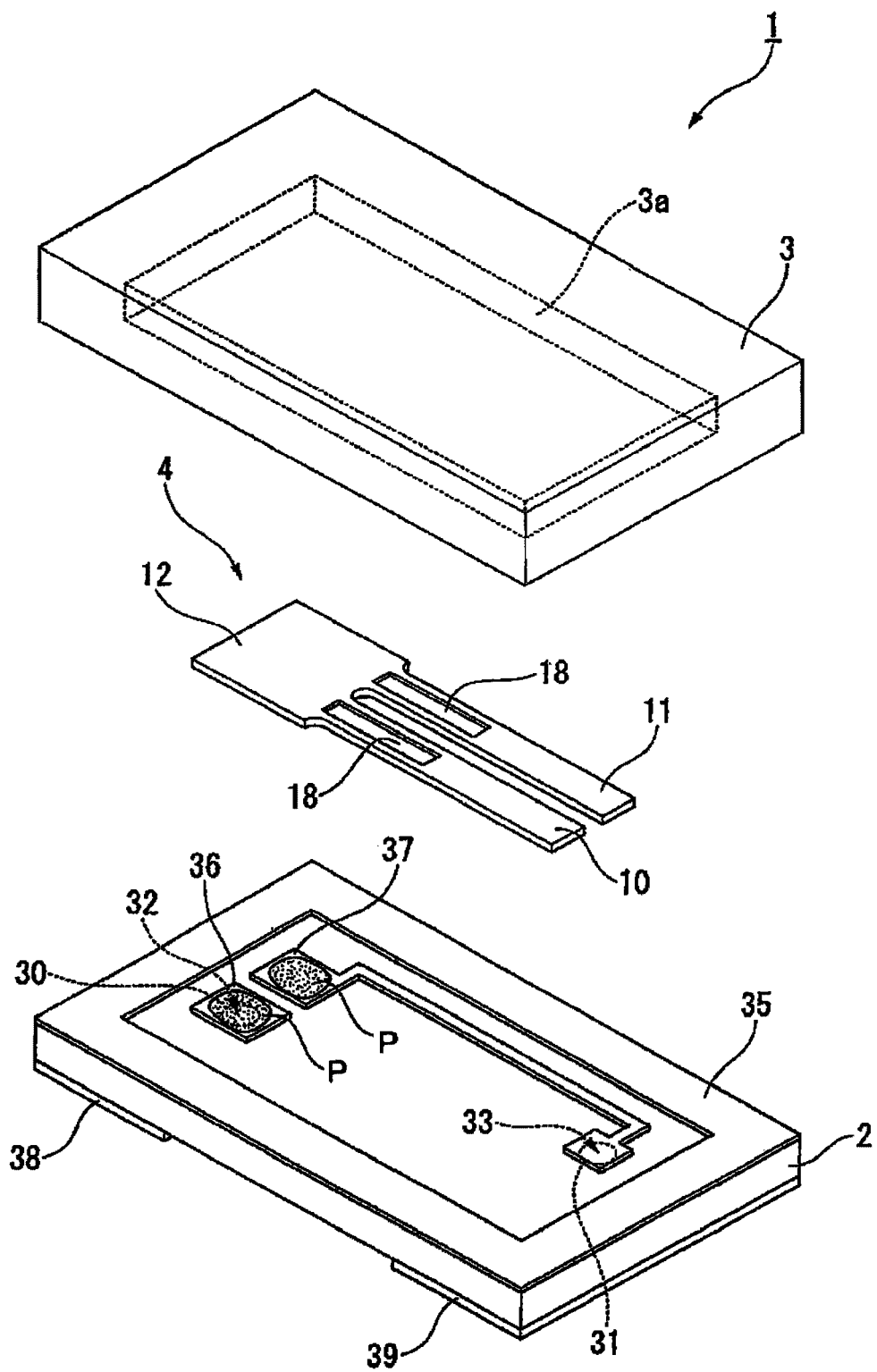
FIG. 4 is a perspective exploded view of the piezoelectric vibrator shown in FIG. 1.

In FIG. 4, an excitation electrode 15, routing electrodes 19 and 20, mount electrodes 16 and 17, and a weight metal film 21 to be mentioned below are omitted for facilitating the understating of the view.

Figure 5:
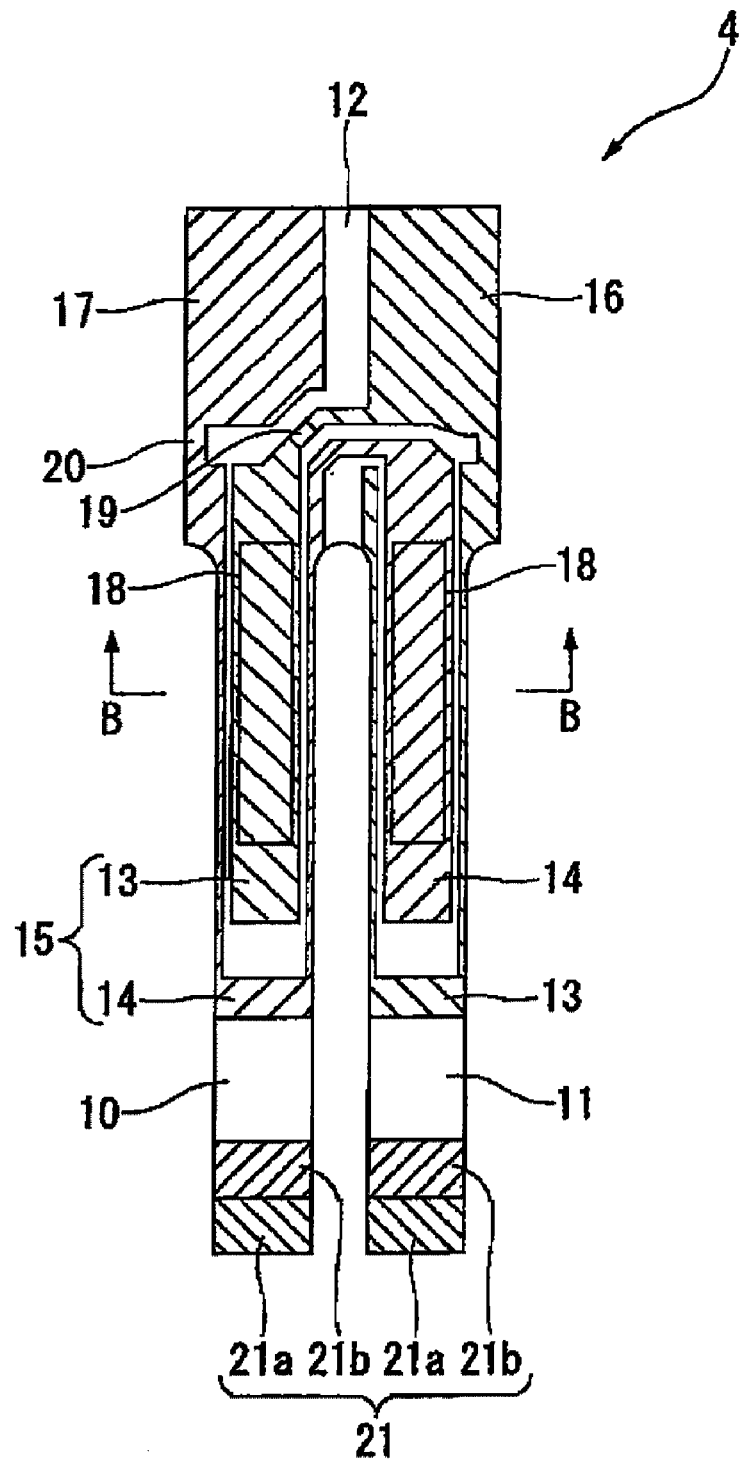
FIG. 5 is a top view of the piezoelectric vibration member constituting the piezoelectric vibrator shown in FIG. 1.
Figure 6:
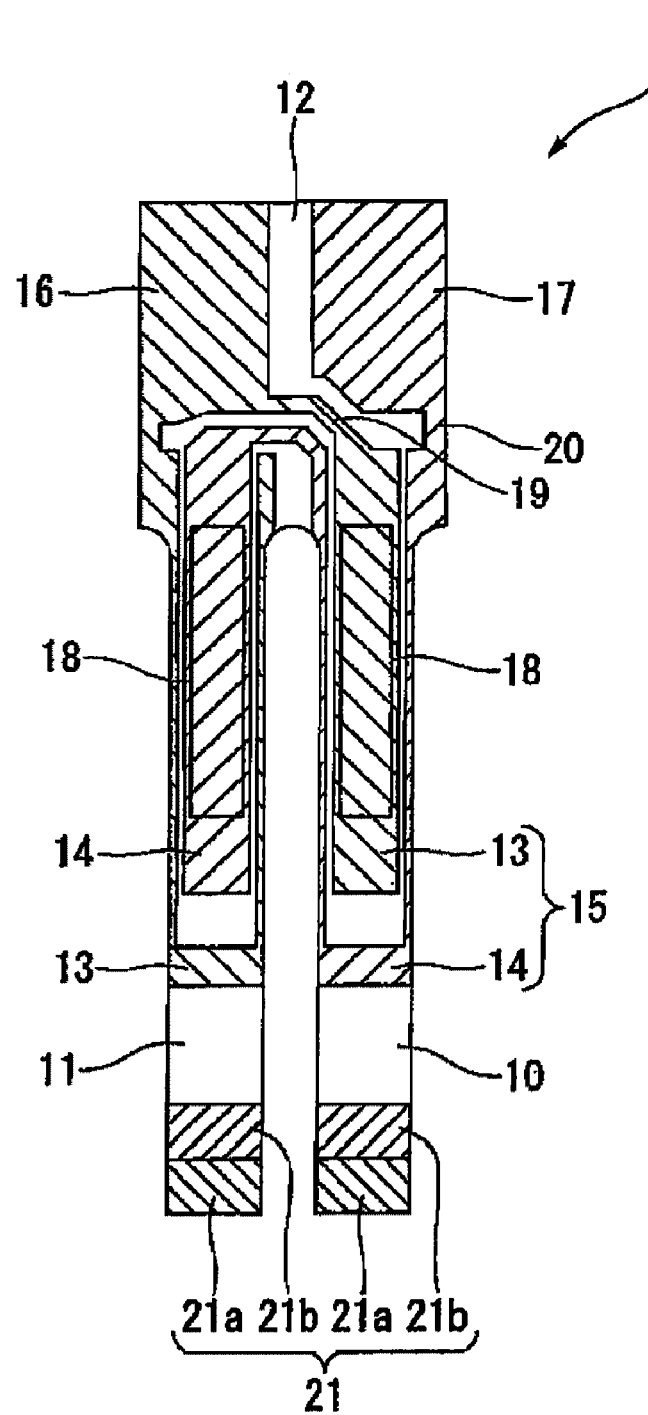
FIG. 6 is a bottom view of the piezoelectric vibration member shown in FIG. 5.
Figure 7:
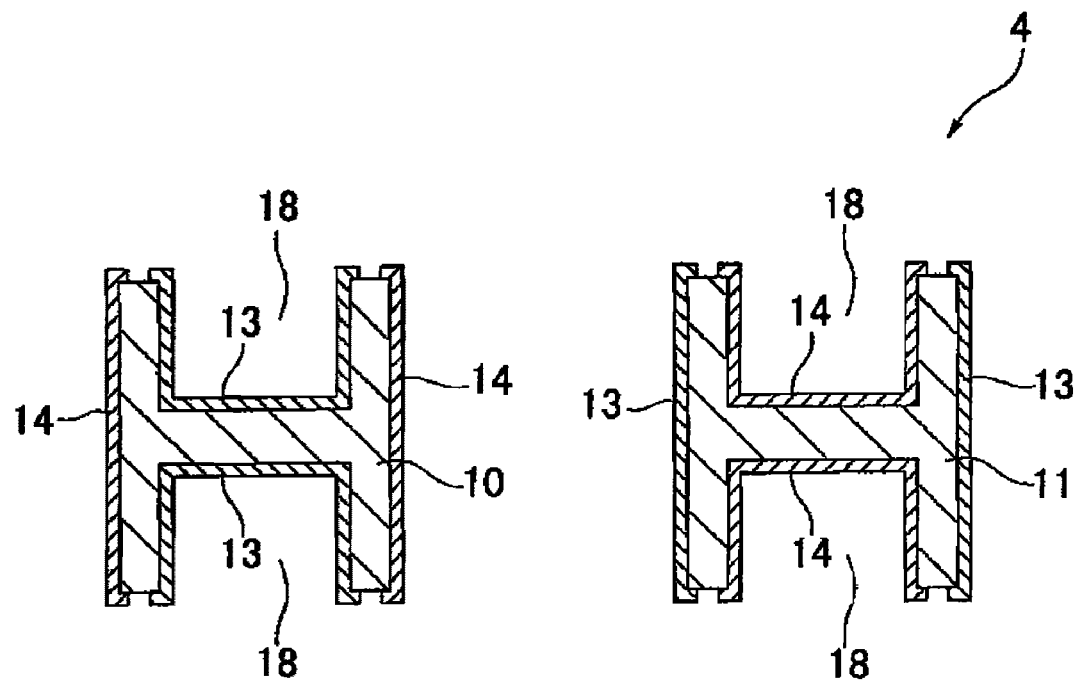
FIG. 7 is a cross-sectional outline view of B-B shown in FIG. 5.

As shown in FIG. 5 to FIG. 7, the piezoelectric vibration member 4 is a tuning fork-like vibration member formed of a piezoelectric material such as crystal, lithium tantalate, lithium niobate or the like, and this vibrates when a predetermined voltage is applied thereto.

The piezoelectric vibration member 4 has a pair of vibration arms 10 and 11 disposed in parallel to each other, a base 12 to integrally fix the base side of the pair of vibration arms 10 and 11, an excitation electrode 15 composed of a first excitation electrode 13 and a second excitation electrode 14 for vibrating the pair of the vibration arms 10 and 11, as formed on the outer surface of the pair of the vibration arms 10 and 11, and mount electrodes 16 and 17 electrically connected with the first excitation electrode 13 and the second excitation electrode 14.

The piezoelectric vibration member 4 in this embodiment comprises, on both the two main faces of the pair of vibration arms 10 and 11, a groove 18 formed along the longitudinal direction of the vibration arms 10 and 11. The groove 18 is formed from the base side to around the intermediate part of the vibration arms 10 and 11.

The excitation electrode 15 composed of the first excitation electrode 13 and the second excitation electrode 14 is an electrode to vibrate the pair of vibration arms 10 and 11 in the direction in which they come near to and get away from each other, at a predetermined resonance frequency, and this is patterned on the outer surface of the pair of vibration arms 10 and 11, as electrically insulated from each other. Concretely, as shown in FIG. 7, the first excitation electrode 13 is formed mainly on the groove 18 of one vibration arm 10 and on the two side faces of the other vibration arm 11; while the second excitation electrode 14 is formed mainly on the two side faces of one vibration arm 10 and on the groove 18 of the other vibration arm 11.

The first excitation electrode 13 and the second excitation electrode 14 are, as shown in FIG. 5 and FIG. 6, electrically connected to the mount electrodes 16 and 17 via the routing electrodes 19 and 20, respectively, on the two main faces of the base 12. The piezoelectric vibration member 4 is given a voltage via the mount electrodes 16 and 17.

The above-mentioned excitation electrode 15, mount electrodes 16 and 17 and routing electrodes 19 and 20 are, for example, formed of a coating film of an electroconductive film of chromium (Cr), nickel (Ni), aluminium (Al), titanium (Ti) or the like.

The top of the pair of vibration arms 10 and 11 is coated with a weight metal film 21 for tuning the vibration condition of the arms themselves within a predetermined frequency range (frequency tuning). The weight metal film 21 is divided into two, a rough-tuning film 21a for use in roughly tuning the frequency and a fine-tuning film 21b for use in finely tuning it. With these rough-tuning film 21a and fine-tuning film 21b, the frequency is tuned, whereby the frequency of the pair of vibration arms 10 and 11 can be controlled to fall within a range of the nominal frequency of the device.

Figure 3:
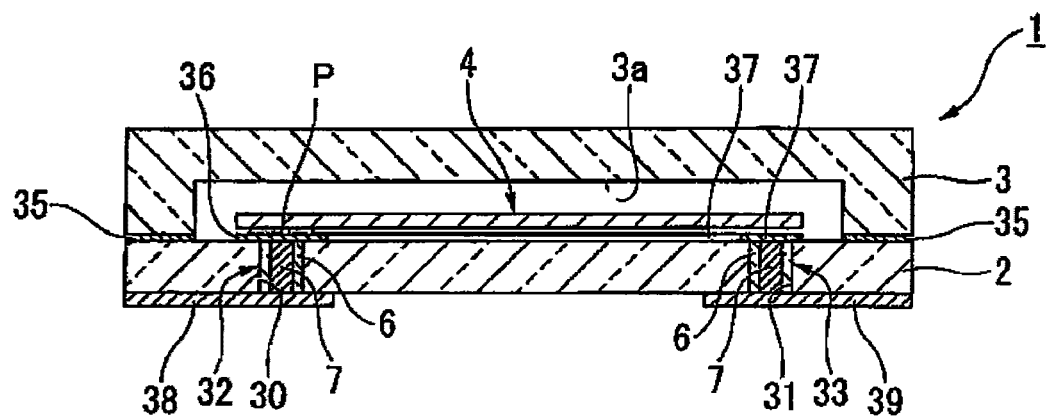
FIG. 3 is a cross-sectional view of the piezoelectric vibrator cut along the line A-A in FIG. 2.

The thus-constituted piezoelectric vibration member 4 is, as shown in FIG. 3 and FIG. 4, bump-bonded to the upper face of the base substrate 2 with a bump P of gold or the like. More concretely, on the two bumps P formed on the routing electrodes 36 and 37 to be mentioned below, as patterned on the upper face of the base substrate 2, a pair of mount electrodes 16 and 17 are bump-bonded as kept in contact with each other. Accordingly, the piezoelectric vibration member 4 is supported as spaced above from the upper face of the base substrate 2, and the mount electrodes 16 and 17 are electrically connected to the routing electrodes 36 and 37, respectively.

Figure 1:
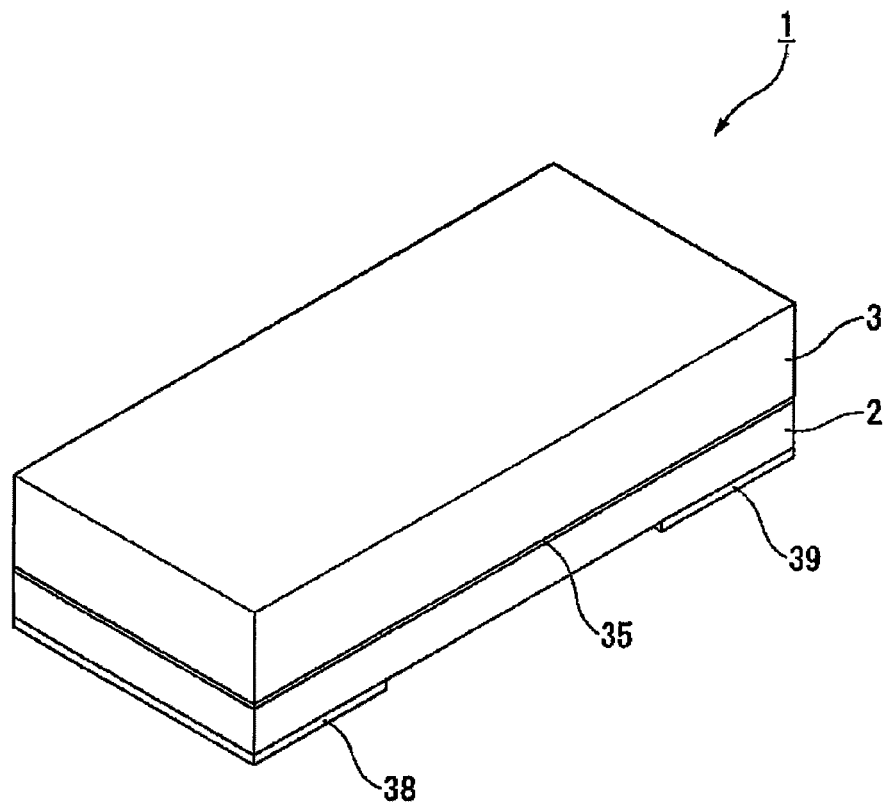
FIG. 1 is a perspective outline view showing the first embodiment of the piezoelectric vibrator of the invention.
Figure 2:
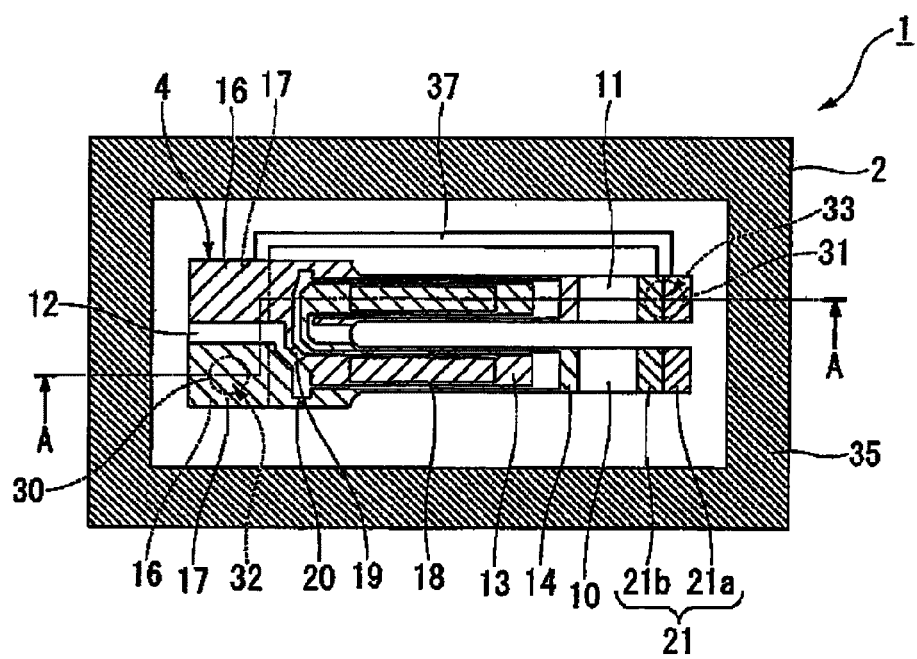
FIG. 2 is an internal configuration view of the piezoelectric vibrator shown in FIG. 1, and is a top view of the piezoelectric vibrator from which the lid substrate was removed.

The lid substrate 3 is a transparent insulating substrate formed of a glass material, for example, soda lime glass; and as shown in FIG. 1, FIG. 3 and FIG. 4, this is shaped to be tabular. On the bonding face side to which the base substrate 2 is bonded, formed is a rectangular recess 3a in which the piezoelectric vibration member 4 is housed. The recess 3a is a cavity recess to be a cavity C to house the piezoelectric vibration member 4 therein when the two substrates 2 and 3 are overlaid. The lid substrate 3 is anodically bonded to the base substrate 2 with the recess 3a kept facing the side of the base substrate 2.

The base substrate 2 is, like the lid substrate 3, a transparent insulating substrate formed of a glass substrate, for example, soda lime glass; and as shown in FIG. 1 to FIG. 4, this is formed to be tabular and have a size capable of being overlaid on the lid substrate 3.

The base substrate 2 is formed to have a pair of through-holes 30 and 31 in and through the base substrate 2. In this case, the pair of through-holes 30 and 31 are so formed as to be housed inside the cavity C. More precisely, the through-holes 30 and 31 in this embodiment are so formed that one through-hole 30 is positioned on the side of the base 12 of the mounted piezoelectric vibration member 4 and the other through-hole 31 is positioned on the top side of the vibration arms 10 and 11. In this embodiment, a straight through-hole that runs straightly through the base substrate 2 is described as one example; but not limited to this case, the through-hole may also be a tapered through-hole of which the diameter of the cross section gradually decreases toward the lower face of the base substrate 2. Anyhow, the through-hole may be any one that runs through the base substrate 2.

In the pair of through-holes 30 and 31, provided are a pair of through-electrodes 32 and 33 that are so formed to fill up the through-holes 30 and 31. These through-electrodes 32 and 33 are, as shown in FIG. 3, formed of a cylindrical body (connection member) 6 and a core part 7 integrally fixed to the through-holes 30 and 31 by firing. These through-electrodes play a role of completely blocking up the through-holes 30 and 31 and keeping the airtightness inside the cavity C, and electrically connecting the external electrodes 38 and 39 with the routing electrodes 36 and 37 as described below.

Figure 8:
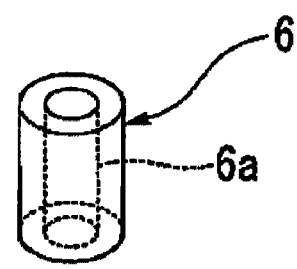
FIG. 8 is a perspective view of the cylindrical body constituting the through-hole shown in FIG. 3.

The cylindrical body 6 is formed of the same glass material as that for the base substrate 2 and is previously temporary-fired; and as shown in FIG. 8, it is formed to be a cylindrical shape having two flat ends and having a thickness substantially equal to the thickness of the base substrate 2. In other words, a center hole 6a is formed in the center of the cylindrical body 6 to run through the cylindrical body 6. Moreover, in this embodiment, in accordance with the shape of the through-holes 30 and 31, the outer shape of the cylindrical body 6 is formed to have a cylindrical shape (straight shape). As shown in FIG. 3, the cylindrical body 6 is fired as kept implanted in the through-holes 30 and 31 and is thereby firmly fixed to the through-holes 30 and 31.

The core part 7 is a columnar electroconductive core member formed of a metal material. Like the cylindrical body 6, the core part 7 is formed to have two flat ends and a thickness substantially equal to the thickness of the base substrate 2. The core part 7 is inserted into the center hole 6a of the cylindrical body 6, and is firmly fixed to the cylindrical body 6 through firing of the cylindrical body 6. The electroconductivity of the through-holes 32 and 33 is secured via the electroconductive core part 7.

On the upper face side of the base substrate 2 (the bonding face side thereof to which the lid substrate 3 is bonded), an anodic-bonding film 35 and a pair of routing electrodes 36 and 37 are patterned with an electroconductive material (for example, aluminium), as shown in FIG. 1 to FIG. 4. Of those, the bonding film 35 is formed along the peripheral edge of the base substrate 2 so as to surround the periphery of the recess 3a formed in the lid substrate 3.

The pair of routing electrodes 36 and 37 are so patterned as to electrically connect one through-electrode 32 of the pair of through-electrodes 32 and 33, with one mount electrode 16 of the piezoelectric vibration member 4, and to electrically connect the other through-electrode 33 with the other mount electrode 17 of the piezoelectric vibration member 4.

More precisely, one routing electrode 36 is formed just above one through-electrode 32 so as to be positioned just below the base 12 of the piezoelectric vibration member 4; and the other routing electrode 37 is so formed as to be positioned just above the other through-electrode 33 after routed from the position adjacent to one routing electrode 36 to the top of the vibration arms 10 and 11 along the vibration arms 10 and 11.

A bump P is formed on the pair of routing electrodes 36 and 37, and via the bump P, the piezoelectric vibration member 4 is mounted. Accordingly, one mount electrode 16 of the piezoelectric vibration member 4 is electrically connected to one through-electrode 32 via one routing electrode 36, and the other mount electrode 17 is electrically connected to the other through-electrode 33 via the other routing electrode 37.

On the lower face of the base substrate 2, formed are external electrodes 38 and 39 to be electrically connected to the pair of through-electrodes 32 and 33, respectively, as shown in FIG. 1, FIG. 3 and FIG. 4. In other words, one external electrode 38 is electrically connected to the first excitation electrode 13 of the piezoelectric vibration member 4 via one through-electrode 32 and one routing electrode 36. The other external electrode 39 is electrically connected to the second excitation electrode 14 of the piezoelectric vibration member 4 via the other through-electrode 33 and the other routing electrode 37.

To operate the thus-constituted piezoelectric vibrator 1, a predetermined driving voltage is applied to the external electrodes 38 and 39 formed on the base substrate 2. Accordingly, a current is applied to the excitation electrode 15 composed of the first excitation electrode 13 and the second excitation electrode 14 of the piezoelectric vibration member 4, whereby the pair of vibration arms 10 and 11 are vibrated at a predetermined frequency in the direction in which they come near to and get away from each other. Based on the vibration of the pair of vibration arms 10 and 11, the vibrator can be used as a time source, a timing source of control signals or the like, a reference signal source, etc.

Figure 9:
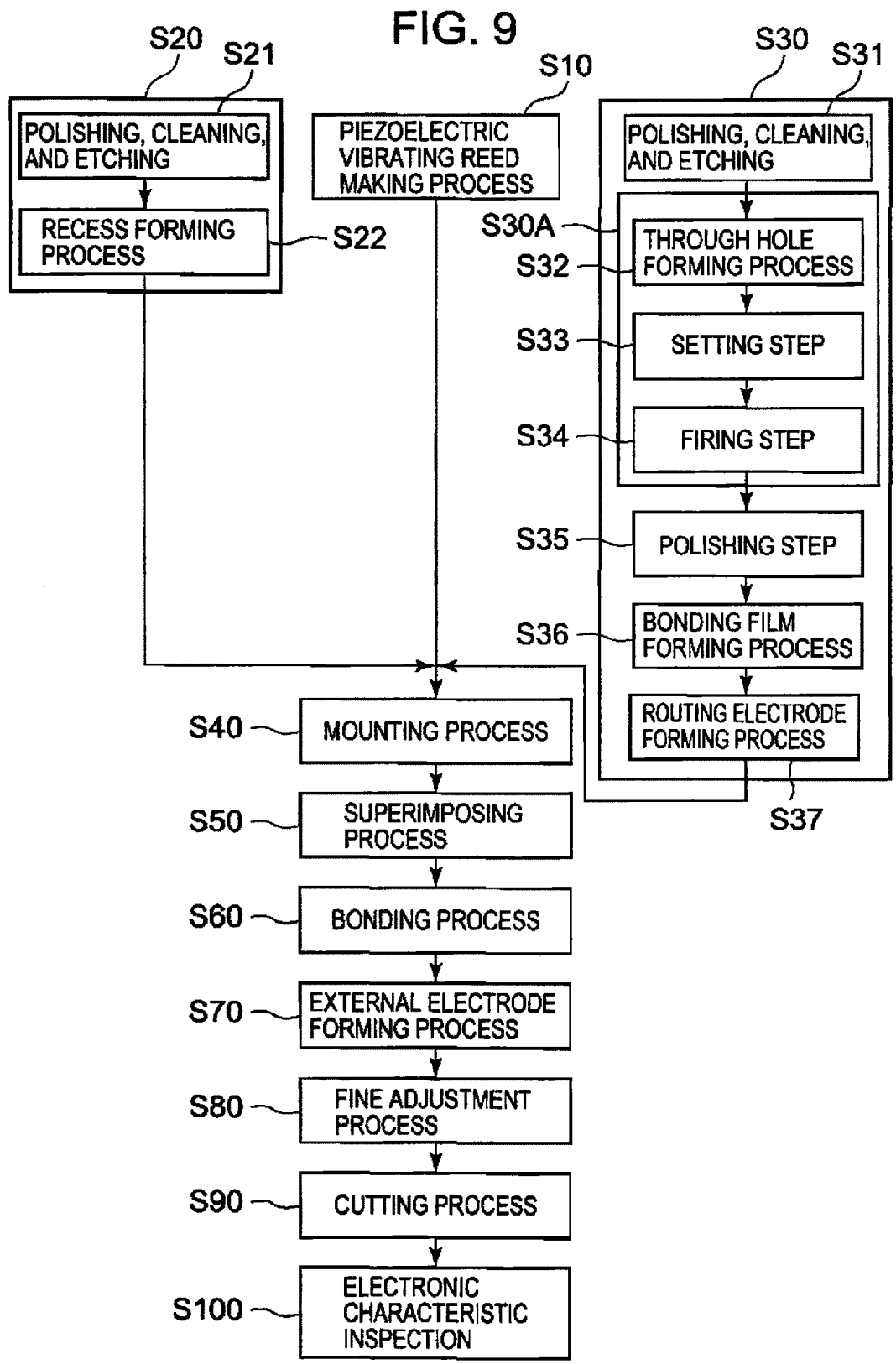
FIG. 9 is a flowchart showing the flow in manufacturing the piezoelectric vibrator shown in FIG. 1.
Figure 10:
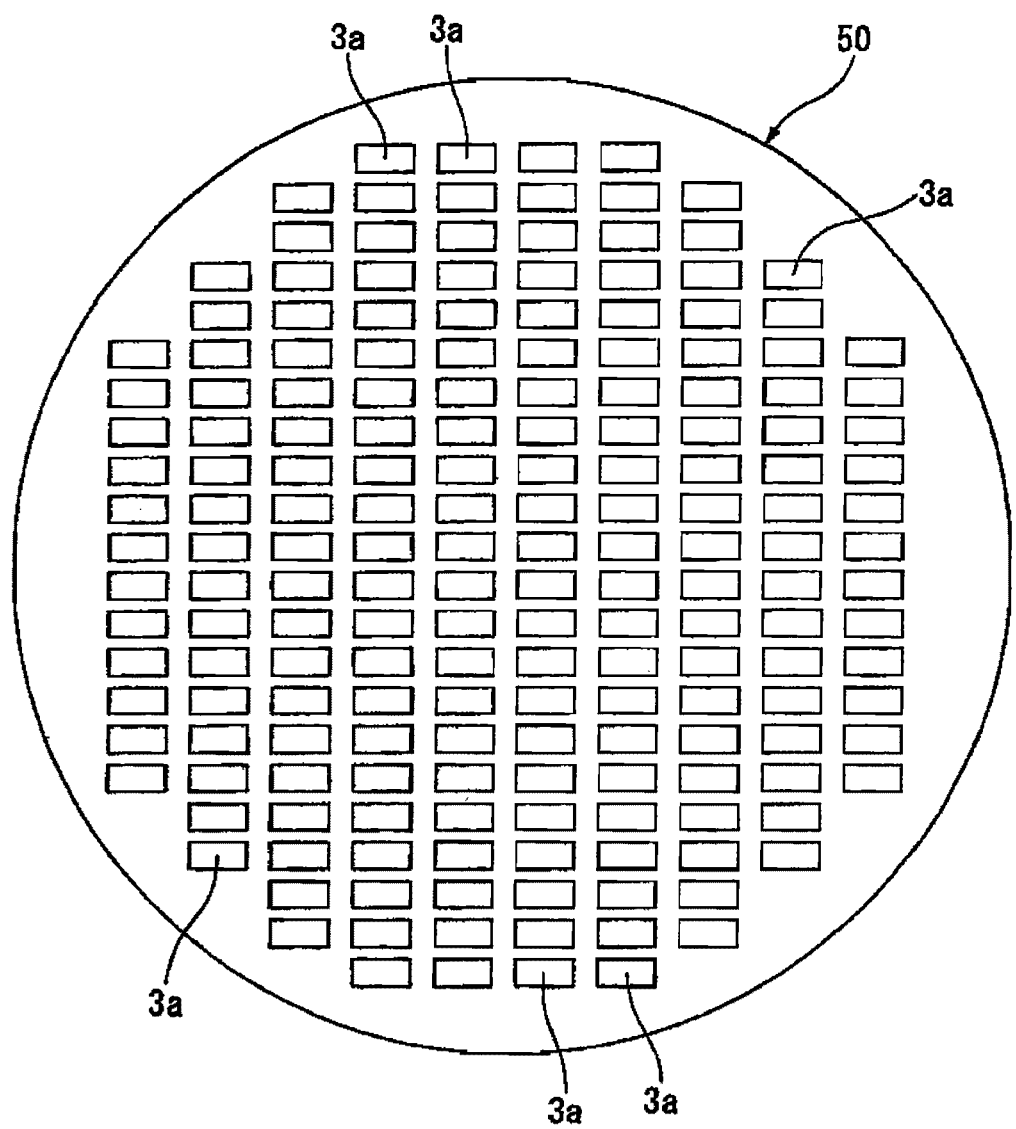
FIG. 10 is a view showing one step in manufacturing piezoelectric vibrators according to the flowchart shown in FIG. 9, and is a view showing the condition where a plurality of recesses are formed in a lid substrate wafer which is an original to be a lid substrate.

Next described is a method for manufacturing a plurality of piezoelectric vibrators 1 mentioned above all at once, by utilizing the base substrate wafer 40 and the lid substrate wafer 50, with reference to the flowchart shown in FIG. 9.

First, a piezoelectric vibration member forming step is attained to form the piezoelectric vibration member 4 shown in FIG. 5 to FIG. 7 (S10). Concretely, first, a rough Lambertian quartz is sliced at a predetermined angle to give a wafer having a predetermined thickness. Subsequently, the wafer is roughly worked by lapping, then the work-affected layer is removed by etching, and thereafter this is mirror-finished by polishing or the like to give a wafer having a predetermined thickness. Subsequently, the wafer is suitably processed by washing or the like, and then the wafer is patterned into an external shape of the piezoelectric vibration member 4 through photolithography, and a metal film is formed and patterned to thereby form the excitation electrode 15, the routing electrodes 19 and 20, the mount electrodes 16 and 17, and the weight metal film 21. Accordingly, a plurality of piezoelectric vibration members 4 are manufactured.

After the piezoelectric vibration members 4 are manufactured, they are processed for rough-tuning of resonance frequency. This is attained by irradiating the rough-tuning film 21a of the weight metal film 21 with a laser light to partly evaporate it, thereby changing the weight thereof. Regarding the fine tuning for resonance frequency, the members are processed after mounting. This is described later.

Next, a first wafer forming step is attained for forming a lid substrate wafer 50 to be the lid substrate 3 later up to the state just before anodic bonding (S20). First, soda lime glass is polished to have a predetermined thickness and washed, and then, the work-affected layer of the outermost surface is removed by etching or the like to give a disc-like lid substrate wafer 50 as in FIG. 10 (S21). Next, a recess forming step is attained for forming a plurality of cavity recesses 3a in the line direction by etching or the like in the bonding face of the lid substrate wafer 50 (S22). At this stage, the first wafer forming step is finished.

Next, at the same time or in a timing of before or after the above step, a second wafer forming step is attained for forming a base substrate wafer 40 to be the base substrate 2 later up to the state just before anodic bonding (S30). First, soda lime glass is polished to have a predetermined thickness and washed, and then, the work-affected layer of the outermost surface is removed by etching or the like to give a disc-like base substrate wafer 40 (S31). Next, a through-electrode forming step is attained for forming a pair of through-electrodes 32 and 33 in the base substrate wafer 40 (S30A). Here, the through-electrode forming step is described in detail.

Figure 11:
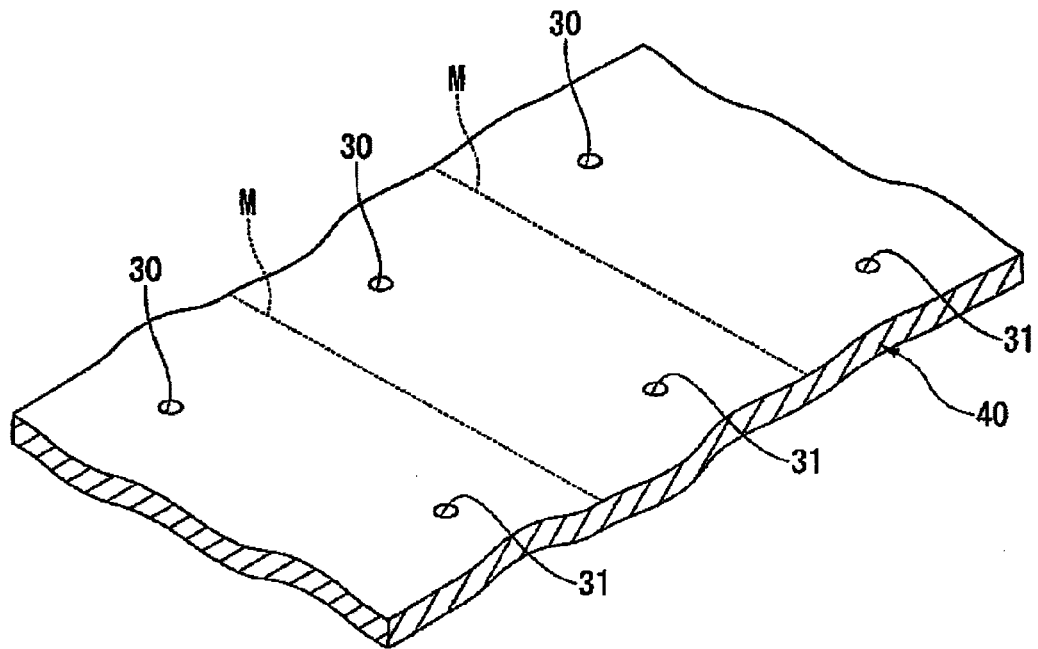
FIG. 11 is a view showing one step in manufacturing piezoelectric vibrators according to the flowchart shown in FIG. 9, and is a view showing the condition where pairs of through-holes are formed in a base substrate wafer which is an original to be a base substrate.
Figure 12:
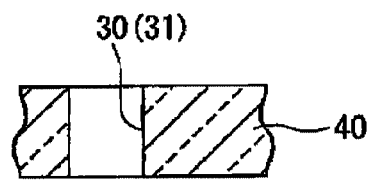
FIG. 12 is a cross-sectional view of the base substrate wafer in the condition shown in FIG. 11.

First, as shown in FIG. 11, a through-hole forming step (S32) is attained for forming a plurality of pairs of through-holes 30 and 31 in and through the base substrate wafer 40. The dotted line M shown in FIG. 11 means a section line for cutting in the subsequent cutting step. In this step, the upper face of the base substrate wafer 40 is processed, for example, according to a sand-blasting method. Accordingly, straight through-holes 30 and 31 are formed, which run straightly through the base substrate wafer 40 as shown in FIG. 12. A plurality of pairs of through-holes 30 and 31 are so formed as to be housed in the recesses 3a formed in the lid substrate wafer 50, when the two wafers 40 and 50 are overlaid later. Further, they are so positioned that one through-hole 30 can be positioned on the side of the base 12 of the piezoelectric vibration member 4 and the other through-hole 31 can be on the top side of the vibration arms 10 and 11.

Figure 13:
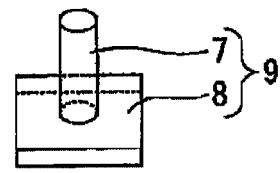
FIG. 13 is a perspective view of the tack member to be used in manufacturing piezoelectric vibrators according to the flowchart shown in FIG. 9.
Figure 14:
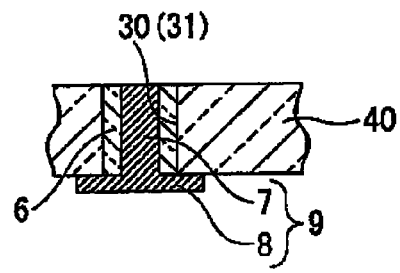
FIG. 14 is a view showing one step in manufacturing piezoelectric vibrators according to the flowchart shown in FIG. 9, and is a view showing the condition where, after the state shown in FIG. 12, a cylindrical body is implanted in a through-hole and a core part of a tack member is inserted into the center hole of the cylindrical body.

Subsequently, a setting step is attained for pushing a cylindrical body 6 formed of a glass material into these plural through-holes 30 and 31 to be implanted therein, and simultaneously for inserting the core part 7 of a tack member 9 into the center hole 6a of the cylindrical body 6 (S33). In this stage, as the tack member 9, used is an electroconductive tack member having a tabular basis part 8 and a core part 7 which extends from the basis part 8 toward the direction substantially perpendicular to the surface of the basis part 8 to a thickness substantially equal to the thickness of the base substrate wafer 40 and which is formed to have a flat end, as shown in FIG. 13. Further, as shown in FIG. 14, the core part 7 is inserted until the basis part 8 of the tack member 9 is kept in contact with the base substrate wafer 40. Accordingly, the two ends of the core part 7 can be substantially in a flat condition relative to the surface of the base substrate wafer 40.

In case where a core part 7 alone not having the basis part 8 is inserted into the center hole 6a, it must be positioned so that the two ends of the core part 7 can be in a flat condition relative to the surface of the base substrate wafer 40. However, since the tack member 9 having the core part 7 formed on the basis part 8 is used, the two ends of the core part 7 can be readily and surely made to be a flat condition relative to the surface of the base substrate wafer 40 in a simple operation of merely pushing the basis part 8 until the it is kept in contact with the base substrate wafer 40. Accordingly, the workability in the setting step can be enhanced.

Moreover, the position of the cylindrical body 6 previously implanted prior to the tack member 9 can be simultaneously adjusted by making the basis part 8 in contact with the surface of the base substrate wafer 40. Accordingly, the two ends of the cylindrical body 6 can be substantially in a flat condition relative to the surface of the base substrate wafer 40.

In that manner, in the setting step, the two ends of the cylindrical body 6 and the core part 7 can be all easily and surely made substantially in a flat condition relative to the surface of the base substrate wafer 40.

Further, since the basis part 8 is formed to be tabular, even when the base substrate wafer 40 is put on a flat face such as a desk or the like after the setting step and before the subsequent firing step, it may be kept stable but is not shaky. In this point, the workability can be enhanced.

Figure 15:
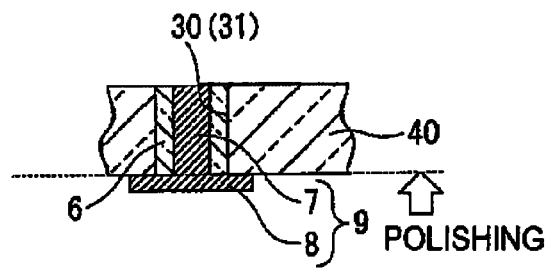
FIG. 15 is a view showing one step in manufacturing piezoelectric vibrators according to the flowchart shown in FIG. 9, and is a view showing the condition where, after the state shown in FIG. 14, the cylindrical body is fired.

Subsequently, a firing step is attained for firing the implanted cylindrical body 6 at a predetermined temperature (S34). Accordingly, the through-holes 30 and 31, the cylindrical body 6 implanted in the through-holes 30 and 31 and the tack member 9 inserted in the cylindrical body 6 firmly stick to each other. In firing, the basis part 8 is also fired together with them, and therefore the two ends of the cylindrical body 6 and the core part 7 can be all integrally fixed to each other while kept substantially in a flat condition relative to the surface of the base substrate wafer 40. Subsequently, as shown in FIG. 15, after the firing, a polishing step is attained for polishing and removing the basis part 8 of the tack member 9 (S37). Accordingly, the basis part 8 that has played a role of positioning the cylindrical body 6 and the core part 7 can be removed, and only the core part 7 can be left inside the cylindrical body 6.

Figure 16:
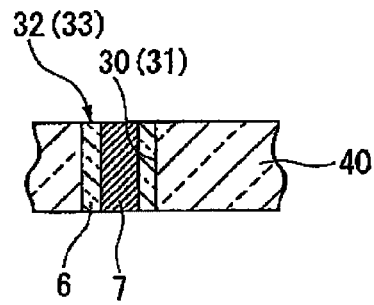
FIG. 16 is a view showing one step in manufacturing piezoelectric vibrators according to the flowchart shown in FIG. 9, and is a view showing the condition where, after the state shown in FIG. 15, the basis part of the tack member is polished.

As a result, as shown in FIG. 16, a plurality of pairs of through-electrodes 32 and 33 can be manufactured, in which the cylindrical body 6 and the core part 7 are integrally fixed to each other.

In particular, in forming the through-electrodes 32 and 33, no paste is used but a cylindrical body 6 of a glass material and an electroconductive core part 7 are used to form the through-electrodes 32 and 33, different from conventional ones. In case where a paste is used, the organic matter in the paste may evaporate in firing with the result that the paste volume may remarkably decrease as compared with that before firing. Accordingly, in case where only a paste is implanted in the through-holes 30 and 31, then the paste surface may have large depressions after firing.

However, since the cylindrical body 6 and the tack member 9 are used but a paste is not used as so mentioned in the above, there is no risk of having any large depressions in the surface after firing. By firing, the volume of the cylindrical body 6 may reduce in some degree; however, differing from the case with a paste, the reduction is not so much remarkable and the resulting depressions can be on an ignorable level.

Accordingly, the surface of the base substrate wafer 40 and the two ends of the cylindrical body 6 and the core part 7 can be all substantially in a flat condition, as so mentioned in the above. In other words, the surface of the base substrate wafer 40 and the surface of the through-electrodes 32 and 33 can be substantially in a flat condition. After the polishing step, the through-hole forming step is finished.

Figure 17:
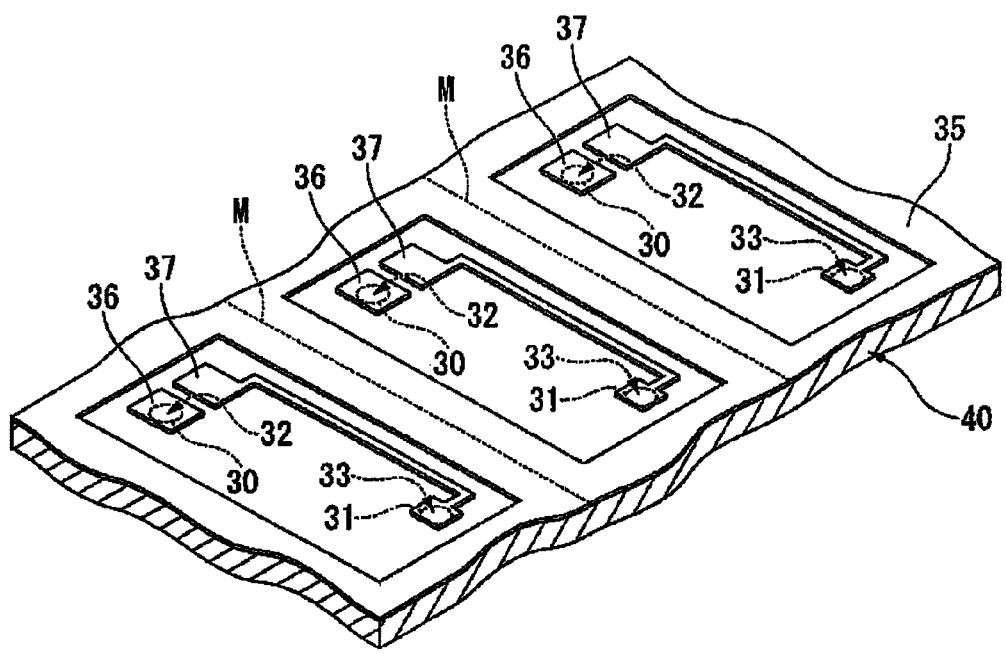
FIG. 17 is a view showing one step in manufacturing piezoelectric vibrators according to the flowchart shown in FIG. 9, and is a view showing the condition where, after the state shown in FIG. 16, bonding films and routing electrodes are patterned on the upper face of the base substrate wafer.
Figure 18:
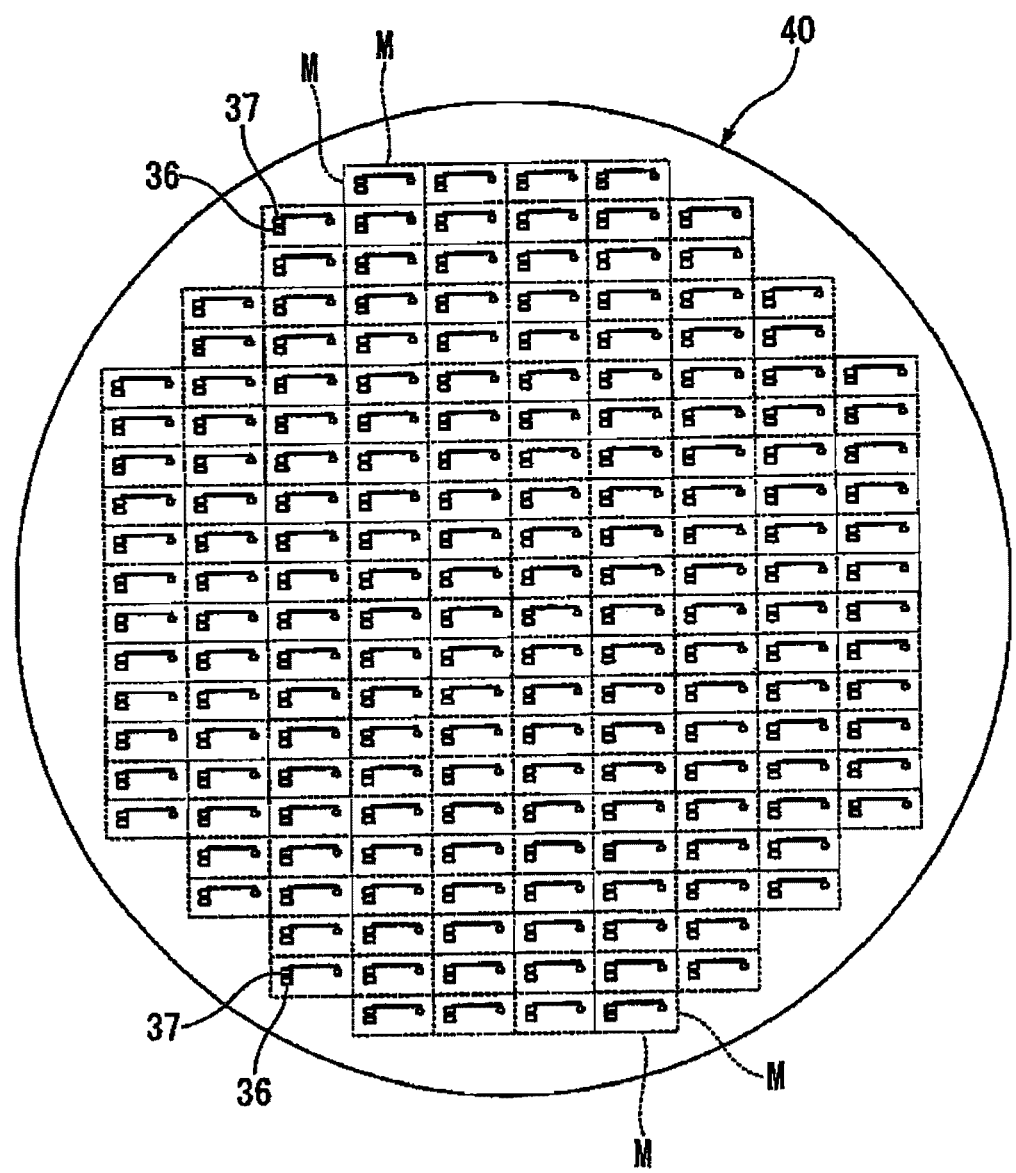
FIG. 18 is an entire view of the base substrate wafer in the state shown in FIG. 17.

Next, a bonding film forming step is attained for forming a bonding film 35 by patterning an electroconductive material on the upper face of the base substrate wafer 40, as shown in FIG. 17 and FIG. 18 (S36), and a routing electrode forming step is attained for forming a plurality of routing electrodes 36 and 37 connected electrically with the pair of through-electrodes 32 and 33, respectively (S37). The dotted line M shown in FIG. 17 and FIG. 18 means a section line for cutting in the subsequent cutting step.

In particular, the through-electrodes 32 and 33 are substantially in a flat condition relative to the upper face of the base substrate wafer 40 as so mentioned in the above. Accordingly, the routing electrodes 36 and 37 as patterned on the upper face of the base substrate wafer 40 are kept in airtight contact with the through-electrodes 32 and 33 with no space therebetween. This secures the electric connection between one routing electrode 36 and one through-electrode 32, and the electric connection between the other routing electrode 37 and the other through-electrode 33. In this stage, the second wafer forming step is finished.

In FIG. 9, the process sequence is the bonding film forming step (S36) followed by the routing electrode forming step (S37); however, contrary to this, the routing electrode forming step (S37) may be followed by the bonding film forming step (S36), or the two steps may be attained at the same time. In any process sequence, the same advantage and effect can be exhibited. Accordingly, the process sequence may be optionally changed or modified in any desired order.

Next, a mounting step is attained for bonding the formed, plural piezoelectric vibration members 4 onto the upper face of the base substrate wafer 40 via the routing electrodes 36 and 37 (S40). First, a bump P of gold or the like is formed on the pair of routing electrodes 36 and 37. After the base 12 of the piezoelectric vibration member 4 is put on the bump P, the piezoelectric vibration member 4 is pressed against the bump P while the bump P is heated at a predetermined temperature. Accordingly, the piezoelectric vibration member 4 is mechanically supported by the bump P, and the mount electrodes 16 and 17 are electrically connected with the routing electrodes 36 and 37. Therefore, at this time, the pair of excitation electrodes 15 of the piezoelectric vibration member 4 are electrically connected to the pair of through-electrodes 32 and 33, respectively.

In particular, the piezoelectric vibration member 4 is bump-bonded, and therefore it is supported as spaced above from the upper face of the base substrate wafer 40.

After the mounting of the piezoelectric vibration member 4 is finished, an overlaying step is attained for overlaying the base substrate wafer 40 and the lid substrate wafer 50 (S50). Concretely, the two wafers 40 and 50 are aligned in a correct position based on a reference mark or the like (not shown) as an index. Accordingly, the mounted piezoelectric vibration member 4 is kept housed in the cavity C surrounded by the recess 3a formed in the base substrate wafer 40 and the wafers 40 and 50.

Figure 19:
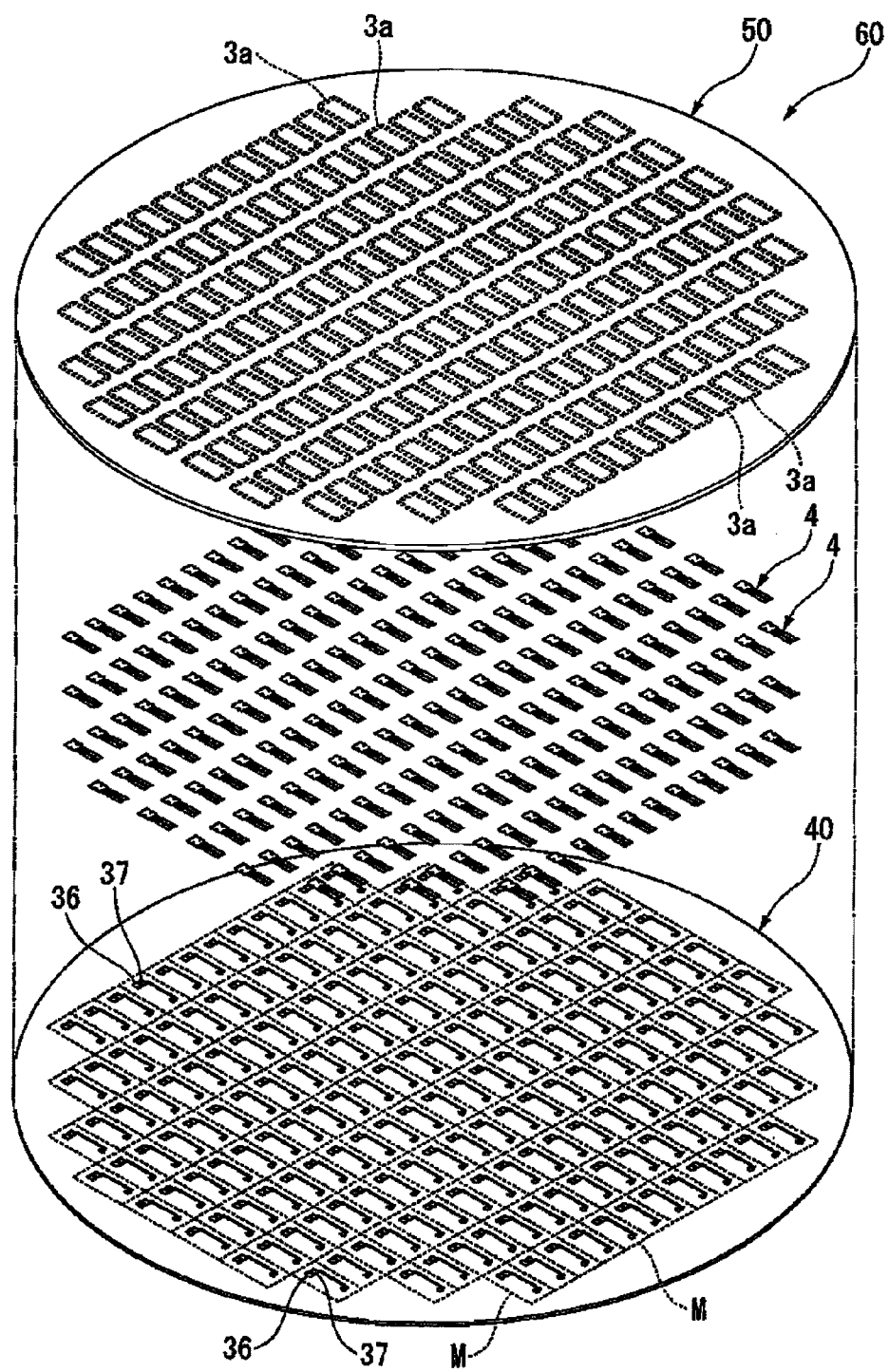
FIG. 19 is a view showing one step in manufacturing piezoelectric vibrators according to the flowchart shown in FIG. 9, and is a perspective exploded view of the wafer body in which the base substrate wafer and the lid substrate wafer are anodically-bonded and the piezoelectric vibration member is housed in the cavity.

After the overlaying step, a bonding step is attained for anodically bonding the overlaid two wafers 40 and 50 by putting them in an anodic bonding apparatus (not shown) and applying a predetermined voltage thereto in a predetermined temperature atmosphere (S60). Concretely, a predetermined voltage is applied between the bonding film 35 and the lid substrate wafer 50. With that, there occurs electrochemical reaction in the interface between the bonding film 35 and the lid substrate wafer 50, whereby the two firmly stick to each other to attain anodic bonding therebetween. Accordingly, the piezoelectric vibration member 4 can be sealed up in the cavity C, and a wafer body 60 as shown in FIG. 19 can be obtained in which the base substrate wafer 40 and the lid substrate wafer 50 are bonded to each other. FIG. 19 illustrates an exploded state of the wafer body 60 for facilitating the understating of the view, in which the illustrative constitution of from the base substrate wafer 40 to the bonding film 35 is omitted. The dotted line M shown in FIG. 19 means a section line for cutting in the subsequent cutting step.

In anodic bonding, the through-holes 30 and 31 formed in the base substrate wafer 40 are completely blocked up by the through-electrodes 32 and 33, and therefore, the airtightness inside the cavity C is not broken by the through-holes 30 and 31. In particular, the cylindrical body 6 and the core part 7 are integrally fixed to each other by firing and these are firmly fixed to the through-holes 30 and 31, and therefore the airtightness inside the cavity C can be surely secured.

After the above-mentioned anodic bonding is finished, an external electrode forming step is attained for forming a plurality of pairs of external electrodes 38 and 39 electrically connected to the pairs of through-electrodes 32 and 33, respectively, by patterning an electroconductive material on the lower face of the base substrate wafer 40 (S70). As a result of this step, the piezoelectric vibration member 4 sealed up in the cavity C can be operated by utilizing the external electrodes 38 and 39.

In particular, also in attaining this step, the through-electrodes 32 and 33 are kept substantially in a flat condition relative to the lower face of the base substrate wafer 40, like in the case of forming the routing electrodes 36 and 37, and therefore the patterned external electrodes 38 and 39 can be kept in airtight contact with the through-electrodes 32 and 33 with no space therebetween. Accordingly, the electric connection between the external electrodes 38 and 39 with the through-electrodes 32 and 33 is secured.

Next, a fine-tuning step is attained for finely tuning the frequency of the individual piezoelectric vibration members 4 sealed up in the cavities C in the state of the wafer body 60 to make it fall within a predetermined range (S80). Concretely, a voltage is applied to the pair of external electrodes 38 and 39 formed on the lower face of the base substrate wafer 40 to thereby vibrate the piezoelectric vibration member 4. Then, with monitoring the frequency, this is irradiated with a laser light from the outside through the lid substrate wafer 50, to thereby evaporate the fine-tuning film 21b of the weight metal film 21. As a result, the weight of the top side of the pair of vibration arms 10 and 11 changes, and therefore the frequency of the piezoelectric vibration member 4 can be finely tuned so as to fall within a predetermined range of a nominal frequency.

After the fine-tuning of frequency is finished, a cutting step is attained for cutting the bonded wafer body 60 to thereby shred it into the individual pieces along the section line M shown in FIG. 19 (S90). As a result, a plurality of two-layer structure-type, surface-mount piezoelectric vibrators 1 as in FIG. 1 can be produced all at once, in which the piezoelectric vibration member 4 is sealed up in the cavity C formed between the base substrate 2 and the lid substrate 3 anodically bonded to each other.

The process sequence may be in an order of the cutting step (S90) of shredding into the individual piezoelectric vibrators 1 followed by the fine-tuning step (S80). However, as so mentioned in the above, in case where the fine-tuning step (S80) is attained previously, then the tuning can be effected in the state of the wafer body 60 and therefore a plurality of piezoelectric vibrators 1 can be finely tuned more efficiently. Accordingly, it is favorable as increasing the throughput.

After this, the internal electric characteristics are inspected (S100). Specifically, the piezoelectric vibration member 4 is checked for the resonance frequency, the resonance resistance, the drive level characteristic (excitation power dependence of the resonance frequency and the resonance resistance), etc. In addition, it is checked also for the insulation resistance characteristic, etc. Finally, the piezoelectric vibrator 1 is checked for the appearance thereof in point of the dimension and the quality, etc. With that, the manufacture of the piezoelectric vibrator 1 is finished.

In particular, in the piezoelectric vibrator 1 of this embodiment, the through-electrodes 32 and 33 can be formed substantially in a flat condition relative to the base substrate 2, and therefore the through-electrodes 32 and 33, the routing electrodes 36 and 37 and the external electrodes 38 and 39 can be surely kept in airtight contact with each other. As a result, stable electric connection between the piezoelectric vibration member 4 with the external electrodes 38 and 39 can be secured, and the operation performance reliability of the piezoelectric vibrator can be enhanced and the quality thereof can be increased. Moreover, since the through-electrodes 32 and 33 are formed with the electroconductive core part 7, they secure extremely stable electric conductivity.

Further, the airtightness inside the cavity C can be secured, and in this point, the quality of the device can be increased. In particular, the cylindrical body 6 in this embodiment is previously temporary-fired before firing, and therefore, it hardly deform or its volume hardly decreases in the later stage of firing. Accordingly, high-quality through-electrodes 32 and 33 can be formed, and the airtightness inside the cavity C can be secured more. Therefore, the quality of the piezoelectric vibrator 1 can be increased with ease.

According to the manufacturing method of this embodiment, a plurality of the above-mentioned piezoelectric vibrators 1 can be manufactured all at once, and therefore the manufacturing cost can be reduced. Further, in the polishing step, the basis part 8 alone may be merely removed, and, as compared with that in a case of polishing the two faces of the base substrate wafer 40, the polishing step can be attained within a short period of time.

In this embodiment, the cylindrical body 6 is formed to have a cylindrical outer shape; however, it is not limited to this shape. For example, it may be formed to have a conical shape in which the outer diameter gradually decreases from one end to the other end. Also in this case, the same advantage and effect can be exhibited. However, in this case, the through-holes 30 and 31 must be so formed that their cross section is tapered but not straight. In other words, the shape of the cylindrical body 6 may be formed to be cylindrical so that the core part 7 can be inserted thereinto, with no limitation; and in accordance with the shape of the through-holes 30 and 31, the outer shape of the cylindrical body can be suitably changed.

The center hole 6a of the cylindrical body 6 may be so formed as to have an angular cross section, not limited to the straight form. In this case, the form of the core part 7 may be formed to be angular, but not columnar as above. Also in this case, the same advantage and effect can be exhibited.

As shown in this embodiment, preferably, as the base substrate 2 (base substrate wafer 40), one having a thermal expansion coefficient nearly equal to that of the cylindrical body 6 is used, or the same glass material as that for the cylindrical body 6 is used. Concretely, preferably, as the base substrate 2 (base substrate wafer 40), soda lime glass is used, and as the cylindrical body 6, glass having a low melting point is used; or as both the two, preferably, soda lime glass is sued. Further in this case, preferably, as the core part 7, one having a thermal expansion coefficient substantially equal to that of the base substrate 2 (base substrate wafer 40) and the cylindrical body 6 is used.

In this case, three of the base substrate wafer 40, the cylindrical body 6 and the core part 7 thermally expand similarly in firing. Accordingly, any excessive pressure is not given to the base substrate wafer 40 and the cylindrical body 6 to crack them, owing to the difference in the thermal expansion coefficient, or there is no risk of forming a space between the cylindrical body 6 and the through-holes 30 and 31, and between the cylindrical body 6 and the core part 7. Therefore, through-electrodes 32 and 33 of higher quality can be formed, and as a result, the quality of the piezoelectric vibrator 1 can be further increased.

In addition, in case where the base substrate 2 (base substrate wafer 40) and the cylindrical body 6 are formed of the same glass material, then Kovar, Fe—Ni, Dumet wire or the like, of which the thermal expansion coefficient is substantially equal to that of the glass material, is preferably used as the material for the core part 7.

Second Embodiment

The second embodiment of the piezoelectric vibrator manufacturing method and the piezoelectric vibrator manufactured according to the manufacturing method of the invention is described below with reference to FIG. 20 to FIG. 40.

Figure 22:
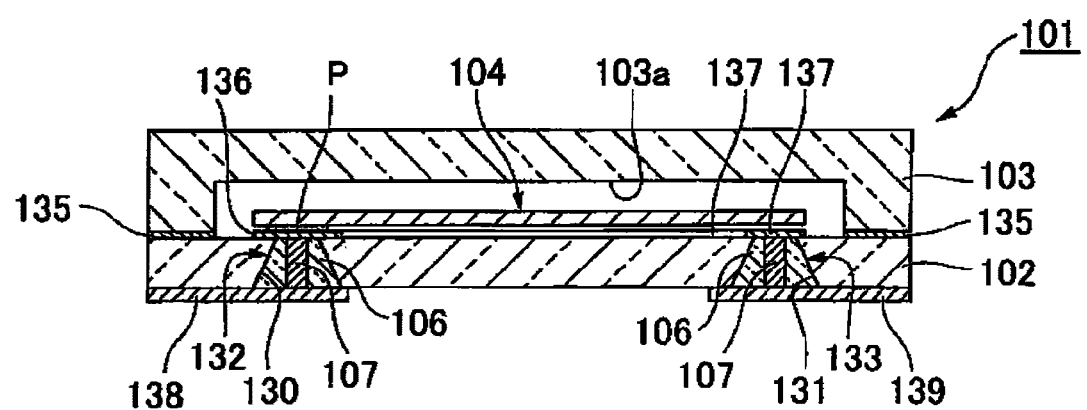
FIG. 22 is a cross-sectional view of the piezoelectric vibrator cut along the line C-C in FIG. 21.
Figure 23:
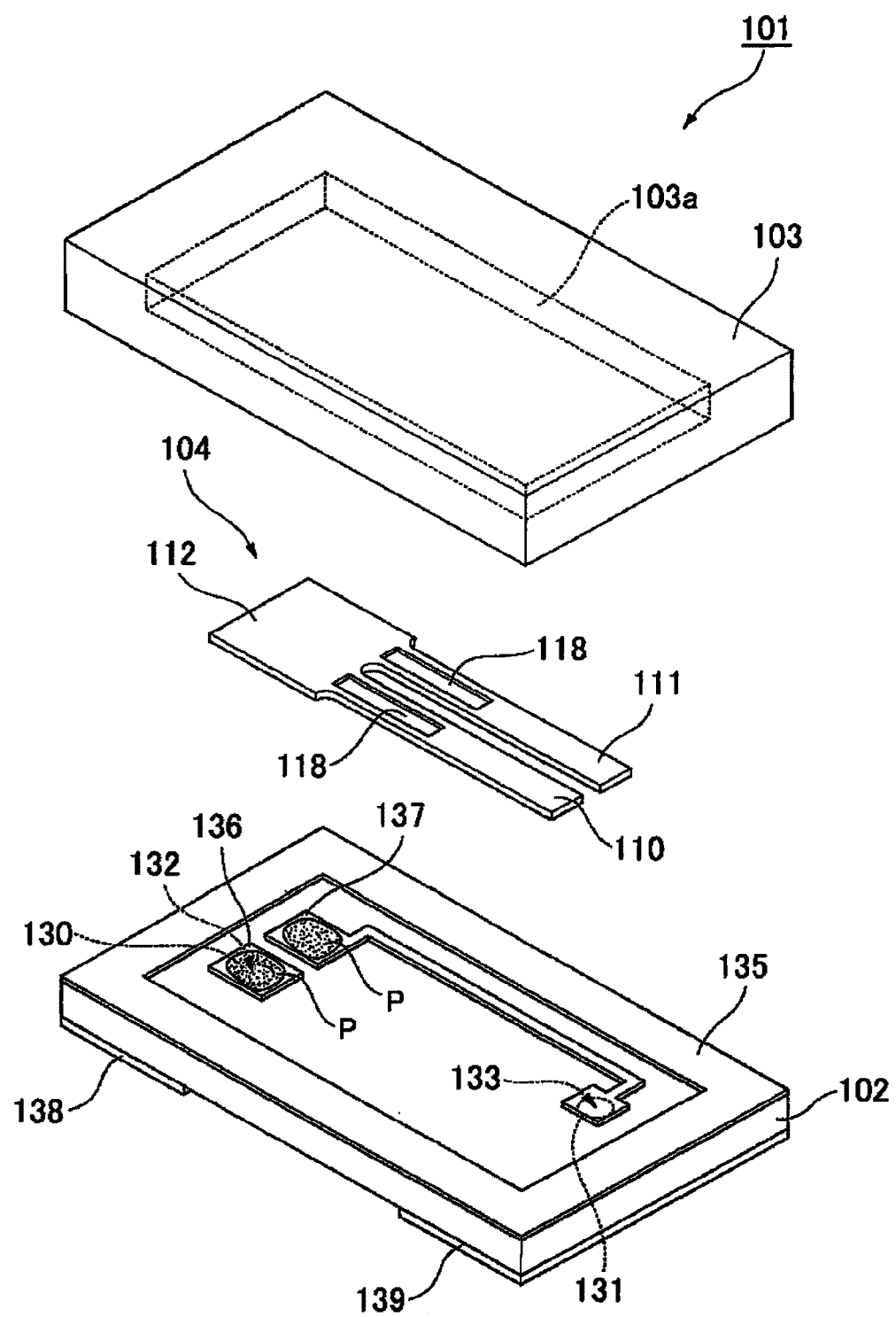
FIG. 23 is a perspective exploded view of the piezoelectric vibrator shown in FIG. 20.

The piezoelectric vibrator 101 of this embodiment is, as shown in FIG. 20 to FIG. 23, a surface-mount piezoelectric vibrator that is formed to have a two-layer laminate boxy shape composed of a base substrate 102 and a lid substrate 103, in which a piezoelectric vibration member 104 is housed in the cavity C inside it. In FIG. 23, an excitation electrode 115, routing electrodes 119 and 120, mount electrodes 116 and 117, and a weight metal film 121 to be mentioned below are omitted for facilitating the understating of the view.

Figure 24:
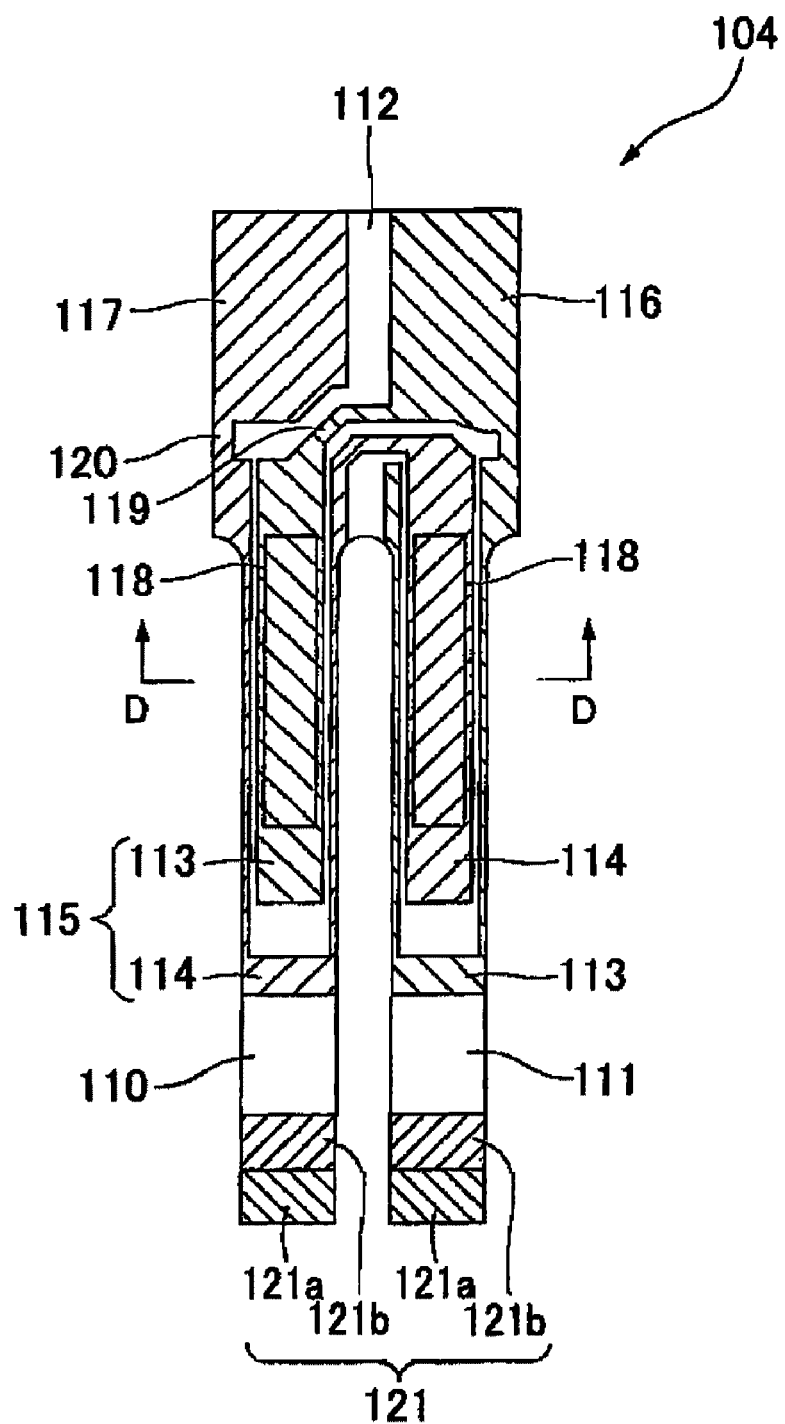
FIG. 24 is a top view of the piezoelectric vibration member constituting the piezoelectric vibrator shown in FIG. 20.
Figure 25:
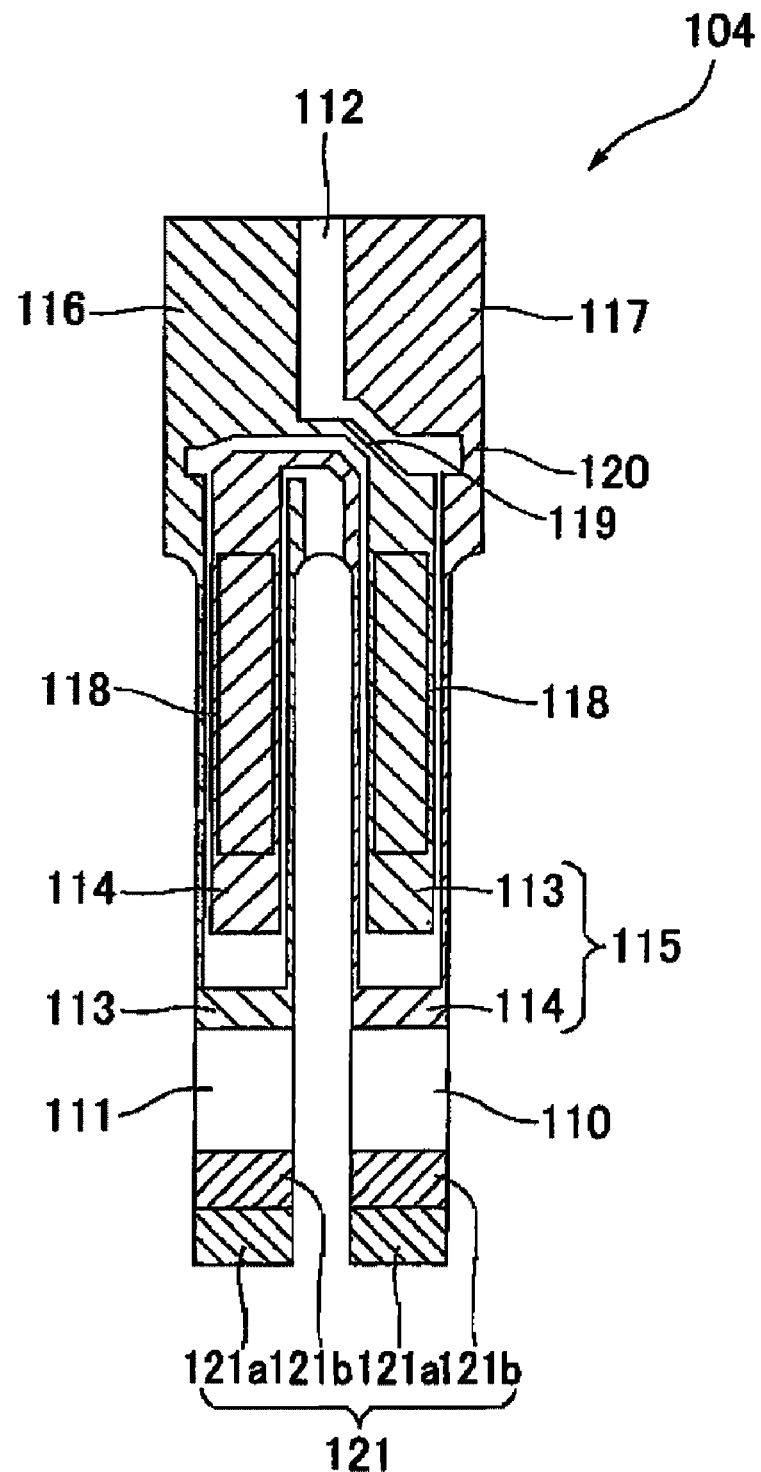
FIG. 25 is a bottom view of the piezoelectric vibration member shown in FIG. 24.
Figure 26:
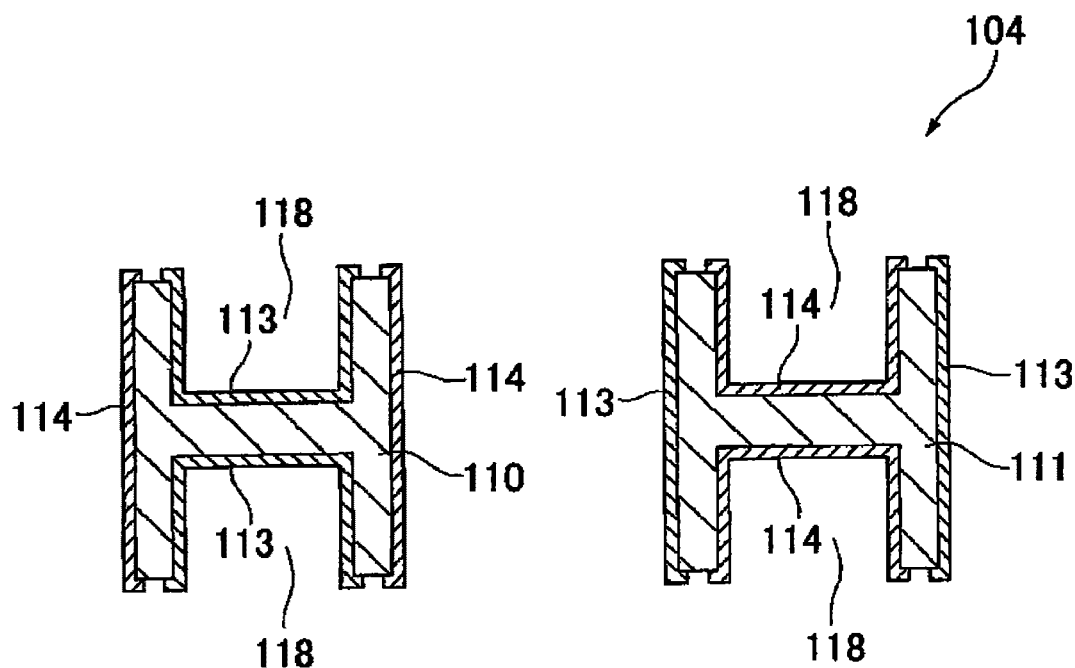
FIG. 26 is a cross-sectional outline view of D-D shown in FIG. 24.

As shown in FIG. 24 to FIG. 26, the piezoelectric vibration member 104 is a tuning fork-like vibration member formed of a piezoelectric material such as crystal, lithium tantalate, lithium niobate or the like, and this vibrates when a predetermined voltage is applied thereto.

The piezoelectric vibration member 104 has a pair of vibration arms 110 and 111 disposed in parallel to each other, a base 112 to integrally fix the base side of the pair of vibration arms 110 and 111, an excitation electrode 115 composed of a first excitation electrode 113 and a second excitation electrode 114 for vibrating the pair of the vibration arms 110 and 111, as formed on the outer surface of the pair of the vibration arms 110 and 111, and mount electrodes 116 and 117 electrically connected with the first excitation electrode 113 and the second excitation electrode 114.

The piezoelectric vibration member 104 in this embodiment comprises, on both the two main faces of the pair of vibration arms 110 and 111, a groove 118 formed along the longitudinal direction of the vibration arms 110 and 111. The groove 118 is formed from the base side to around the intermediate part of the vibration arms 110 and 111.

The excitation electrode 115 composed of the first excitation electrode 113 and the second excitation electrode 114 is an electrode to vibrate the pair of vibration arms 110 and 111 in the direction in which they come near to and get away from each other, at a predetermined resonance frequency, and this is patterned on the outer surface of the pair of vibration arms 110 and 111, as electrically insulated from each other. Concretely, the first excitation electrode 113 is formed mainly on the groove 118 of one vibration arm 110 and on the two side faces of the other vibration arm 111; while the second excitation electrode 114 is formed mainly on the two side faces of one vibration arm 110 and on the groove 118 of the other vibration arm 111.

The first excitation electrode 113 and the second excitation electrode 114 are electrically connected to the mount electrodes 116 and 117 via the routing electrodes 119 and 120, respectively, on the two main faces of the base 112. The piezoelectric vibration member 104 is given a voltage via the mount electrodes 116 and 117.

The above-mentioned excitation electrode 115, mount electrodes 116 and 117 and routing electrodes 119 and 120 are, for example, formed of a coating film of an electroconductive film of chromium (Cr), nickel (Ni), aluminium (Al), titanium (Ti) or the like.

The top of the pair of vibration arms 110 and 111 is coated with a weight metal film 121 for tuning the vibration condition of the arms themselves within a predetermined frequency range (frequency tuning). The weight metal film 121 is divided into two, a rough-tuning film 121a for use in roughly tuning the frequency and a fine-tuning film 121b for use in finely tuning it. With these rough-tuning film 121a and fine-tuning film 121b, the frequency is tuned, whereby the frequency of the pair of vibration arms 110 and 111 can be controlled to fall within a range of the nominal frequency of the device.

The thus-constituted piezoelectric vibration member 104 is, as shown in FIG. 22 and FIG. 23, bump-bonded to the upper face of the base substrate 102 with a bump P of gold or the like. More concretely, on the two bumps P formed on the routing electrodes 136 and 137 to be mentioned below, as patterned on the upper face of the base substrate 102, a pair of mount electrodes 116 and 117 are bump-bonded as kept in contact with each other. Accordingly, the piezoelectric vibration member 104 is supported as spaced above from the upper face of the base substrate 102, and the mount electrodes 116 and 117 are electrically connected to the routing electrodes 136 and 137, respectively.

Figure 20:
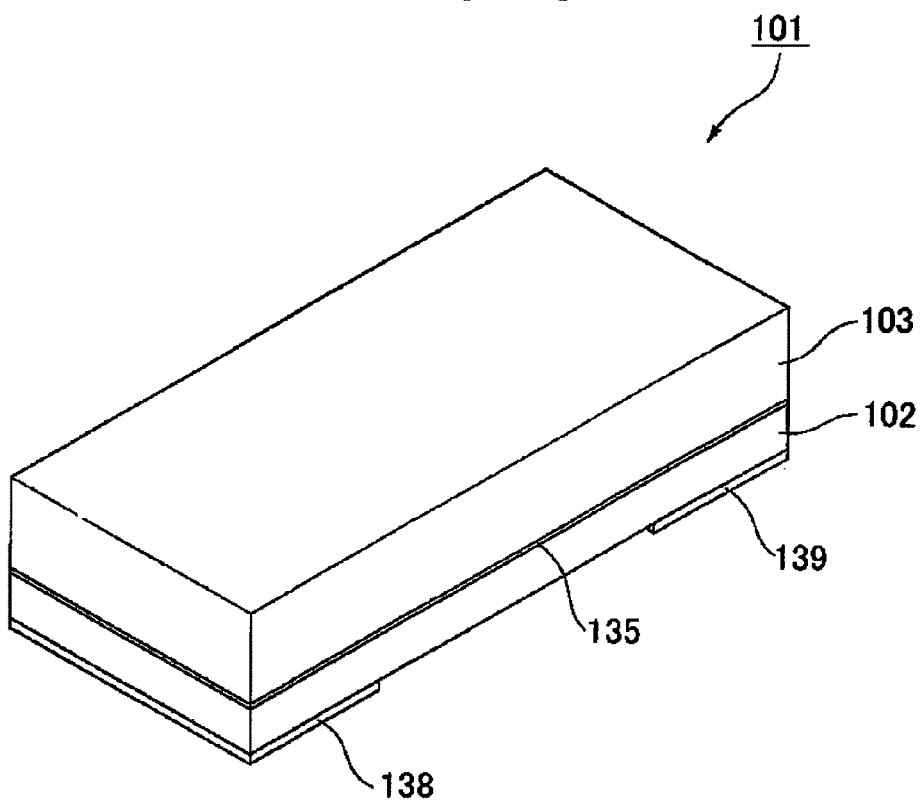
FIG. 20 is a perspective outline view showing the second embodiment of the piezoelectric vibrator of the invention.
Figure 21:
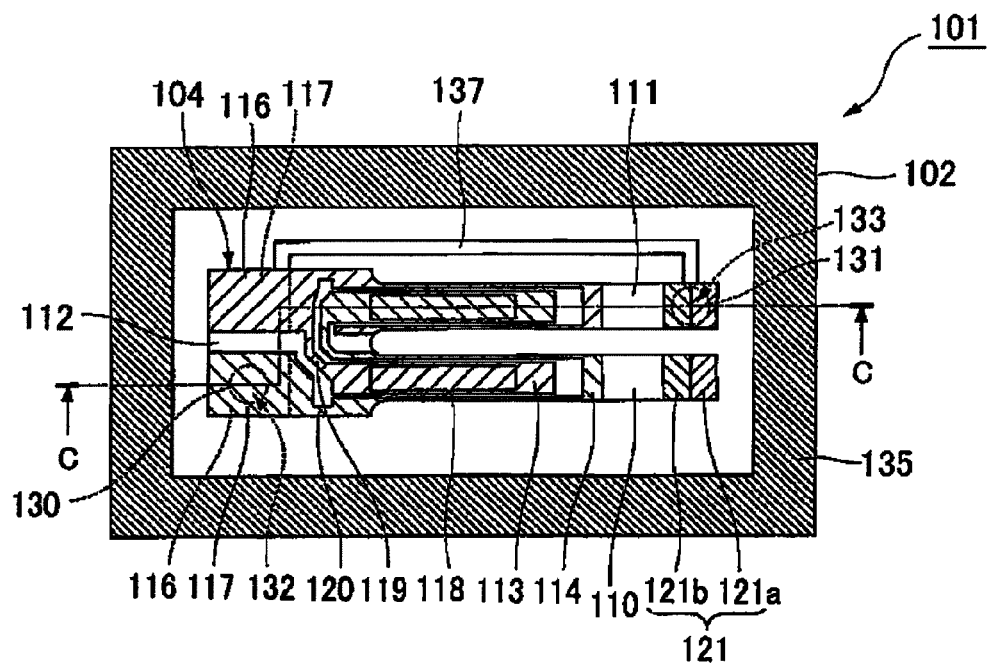
FIG. 21 is an internal configuration view of the piezoelectric vibrator shown in FIG. 20, and is a top view of the piezoelectric vibration member thereof from which the lid substrate was removed.

The lid substrate 103 is a transparent insulating substrate formed of a glass material, for example, soda lime glass; and as shown in FIG. 20, FIG. 22 and FIG. 23, this is shaped to be tabular. On the bonding face side to which the base substrate 102 is bonded, formed is a rectangular recess 103a in which the piezoelectric vibration member 104 is housed.

The recess 103a is a cavity recess to be a cavity C to house the piezoelectric vibration member 104 therein when the two substrates 102 and 103 are overlaid. The lid substrate 103 is anodically bonded to the base substrate 102 with the recess 103a kept facing the side of the base substrate 102.

The base substrate 102 is, like the lid substrate 103, a transparent insulating substrate formed of a glass substrate, for example, soda lime glass; and as shown in FIG. 20 to FIG. 23, this is formed to be tabular and have a size capable of being overlaid on the lid substrate 103.

The base substrate 102 is formed to have a pair of through-holes 130 and 131 in and through the base substrate 102. In this case, the pair of through-holes 130 and 131 are so formed as to be housed inside the cavity C. More precisely, the through-holes 130 and 131 in this embodiment are so formed that one through-hole 130 is positioned on the side of the base 112 of the mounted piezoelectric vibration member 104 and the other through-hole 131 is positioned on the top side of the vibration arms 110 and 111. In this embodiment, a tapered through-hole of which the diameter of the cross section gradually decreases from the lower face to the upper face of the base substrate 102 is described as one example; but not limited to this case, the through-hole may also be a straight through-hole that runs straightly through the base substrate 102. Anyhow, the through-hole may be any one that runs through the base substrate 102.

In the pair of through-holes 130 and 131, formed are a pair of through-electrodes 132 and 133 that fill up the through-holes 130 and 131. These through-electrodes 132 and 133 are, as shown in FIG. 22, formed of a cylindrical body 106 and a core part 107 integrally fixed to the through-holes 130 and 131 by firing. These through-electrodes play a role of completely blocking up the through-holes 130 and 131 and keeping the airtightness inside the cavity C, and electrically connecting the external electrodes 138 and 139 with the routing electrodes 136 and 137 as described below.

Figure 27:
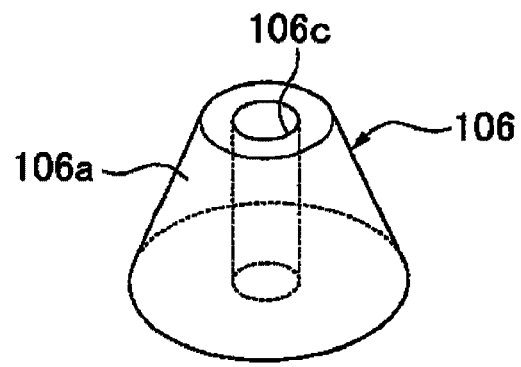
FIG. 27 is a perspective view of the cylindrical body constituting the through-electrode shown in FIG. 22.

The cylindrical body 106 is formed of a pasty glass frit (connection member) 106a by firing, as shown in FIG. 27. The cylindrical body 106 is formed to be a cylindrical shape having two flat ends and having a thickness substantially equal to the thickness of the base substrate 102. In the center of the cylindrical body 106, disposed is a core part 107 to run through the cylindrical body 106. In this embodiment, in accordance with the shape of the through-holes 130 and 131, the outer shape of the cylindrical body 106 is formed to have a conical shape (having a tapered cross section). As shown in FIG. 22, the cylindrical body 106 is fired as kept implanted in the through-holes 130 and 131 and is thereby firmly fixed to the through-holes 130 and 131.

The core part 107 is a columnar electroconductive core member formed of a metal material. Like the cylindrical body 106, the core part 107 is formed to have two flat ends and a thickness substantially equal to the thickness of the base substrate 102. As shown in FIG. 22, in case where the through-electrodes 132 and 133 are formed as finished ones, the core part 107 is formed to have a thickness substantially equal to the thickness of the base substrate 102, as so mentioned in the above; however, in the manufacturing process, the length of the core part 107 is shorter by 0.02 mm than the thickness of the original base substrate 102 in the manufacturing process (this is described in detail hereinunder in the section of the manufacturing method). The core part 107 is positioned in the center hole 106c of the cylindrical body 106, and is firmly fixed to the cylindrical body 106 through firing of the cylindrical body 106.

The electroconductivity of the through-holes 132 and 133 is secured via the electroconductive core part 107.

On the upper face side of the base substrate 102 (the bonding face side thereof to which the lid substrate 103 is bonded), an anodic-bonding film 135 and a pair of routing electrodes 136 and 137 are patterned with an electroconductive material (for example, aluminium), as shown in FIG. 20 to FIG. 23. Of those, the bonding film 135 is formed along the peripheral edge of the base substrate 102 so as to surround the periphery of the recess 103a formed in the lid substrate 103.

The pair of routing electrodes 136 and 137 are so patterned as to electrically connect one through-electrode 132 of the pair of through-electrodes 132 and 133, with one mount electrode 116 of the piezoelectric vibration member 104, and to electrically connect the other through-electrode 133 with the other mount electrode 117 of the piezoelectric vibration member 104.

More precisely, one routing electrode 136 is formed just above one through-electrode 132 so as to be positioned just below the base 112 of the piezoelectric vibration member 104; and the other routing electrode 137 is so formed as to be positioned just above the other through-electrode 133 after routed from the position adjacent to one routing electrode 136 to the top of the vibration arms 110 and 111 along the vibration arms 110 and 111.

A bump P is formed on the pair of routing electrodes 136 and 137, and via the bump P, the piezoelectric vibration member 104 is mounted. Accordingly, one mount electrode 116 of the piezoelectric vibration member 104 is electrically connected to one through-electrode 132 via one routing electrode 136, and the other mount electrode 117 is electrically connected to the other through-electrode 133 via the other routing electrode 137.

On the lower face of the base substrate 102, formed are external electrodes 138 and 139 to be electrically connected to the pair of through-electrodes 132 and 133, respectively, as shown in FIG. 20, FIG. 22 and FIG. 23. In other words, one external electrode 138 is electrically connected to the first excitation electrode 113 of the piezoelectric vibration member 104 via one through-electrode 132 and one routing electrode 136. The other external electrode 139 is electrically connected to the second excitation electrode 114 of the piezoelectric vibration member 104 via the other through-electrode 133 and the other routing electrode 137.

To operate the thus-constituted piezoelectric vibrator 101, a predetermined driving voltage is applied to the external electrodes 138 and 139 formed on the base substrate 102. Accordingly, a current is applied to the excitation electrode 115 composed of the first excitation electrode 113 and the second excitation electrode 114 of the piezoelectric vibration member 104, whereby the pair of vibration arms 110 and 111 are vibrated at a predetermined frequency in the direction in which they come near to and get away from each other. Based on the vibration of the pair of vibration arms 110 and 111, the vibrator can be used as a time source, a timing source of control signals or the like, a reference signal source, etc.

Figure 28:
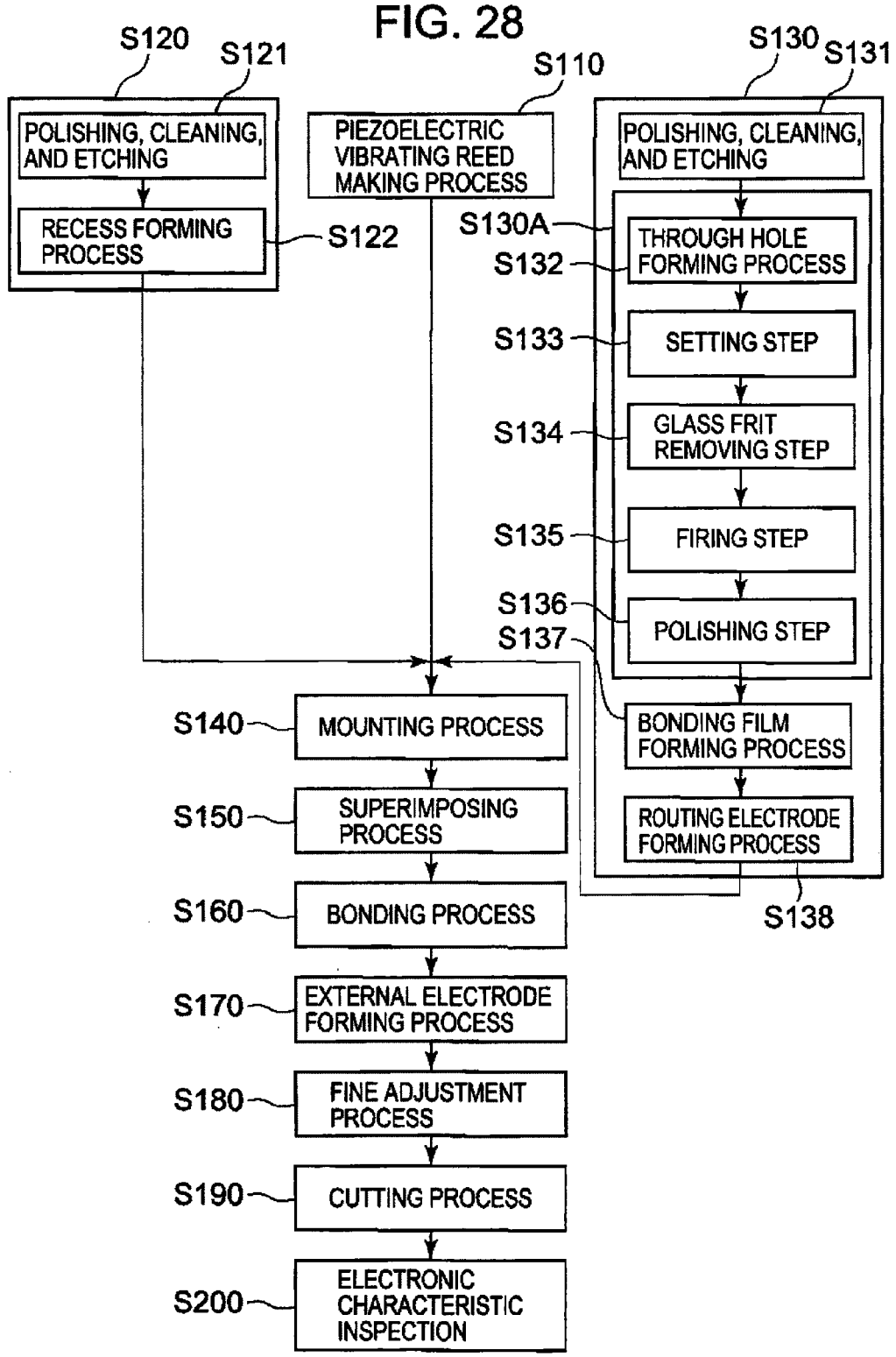
FIG. 28 is a flowchart showing the flow in manufacturing the piezoelectric vibrator shown in FIG. 20.
Figure 29:
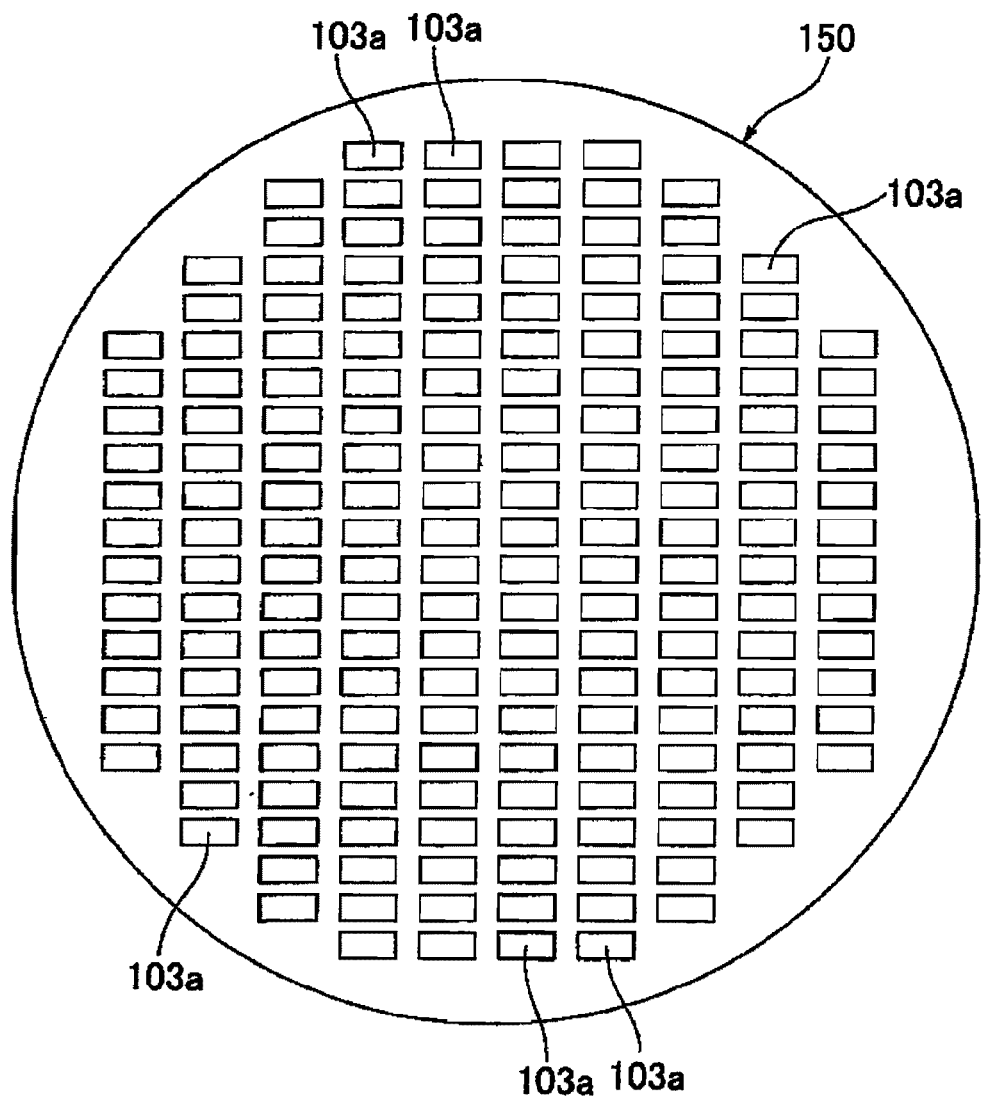
FIG. 29 is a view showing one step in manufacturing piezoelectric vibrators according to the flowchart shown in FIG. 28, and is a view showing the condition where a plurality of recesses are formed in a lid substrate wafer which is an original to be a lid substrate.

Next described is a method for manufacturing a plurality of piezoelectric vibrators 101 mentioned above all at once, by utilizing the base substrate wafer 140 and the lid substrate wafer 150, with reference to the flowchart shown in FIG. 28.

First, a piezoelectric vibration member forming step is attained to form the piezoelectric vibration member 104 shown in FIG. 24 to FIG. 26 (S110). Concretely, first, a rough Lambertian quartz is sliced at a predetermined angle to give a wafer having a predetermined thickness. Subsequently, the wafer is roughly worked by lapping, then the work-affected layer is removed by etching, and thereafter this is mirror-finished by polishing or the like to give a wafer having a predetermined thickness. Subsequently, the wafer is suitably processed by washing or the like, and then the wafer is patterned into an external shape of the piezoelectric vibration member 104 through photolithography, and a metal film is formed and patterned to thereby form the excitation electrode 115, the routing electrodes 119 and 120, the mount electrodes 116 and 117, and the weight metal film 121. Accordingly, a plurality of piezoelectric vibration members 104 are manufactured.

After the piezoelectric vibration members 104 are manufactured, they are processed for rough-tuning of resonance frequency. This is attained by irradiating the rough-tuning film 121*a* of the weight metal film 121 with a laser light to partly evaporate it, thereby changing the weight thereof. Regarding the fine tuning for resonance frequency, the members are processed after mounting. This is described later.

Next, a first wafer forming step is attained for forming a lid substrate wafer 150 to be the lid substrate 103 later up to the state just before anodic bonding (S120). First, soda lime glass is polished to have a predetermined thickness and washed, and then the work-affected layer of the outermost surface is removed by etching or the like to give a disc-like lid substrate wafer 150 as in FIG. 29 (S121). Next, a recess forming step is attained for forming a plurality of cavity recesses 103*a* in the line direction by etching or the like in the bonding face of the lid substrate wafer 150 (S122). At this stage, the first wafer forming step is finished.

Next, at the same time or in a timing of before or after the above step, a second wafer forming step is attained for forming a base substrate wafer 140 to be the base substrate 102 later up to the state just before anodic bonding (S130). First, soda lime glass is polished to have a predetermined thickness and washed, and then, the work-affected layer of the outermost surface is removed by etching or the like to give a disc-like base substrate wafer 140 (S131). Next, a through-electrode forming step is attained for forming a pair of through-electrodes 132 and 133 in the base substrate wafer 140 (S130A). Here, the through-electrode forming step is described in detail.

Figure 30:
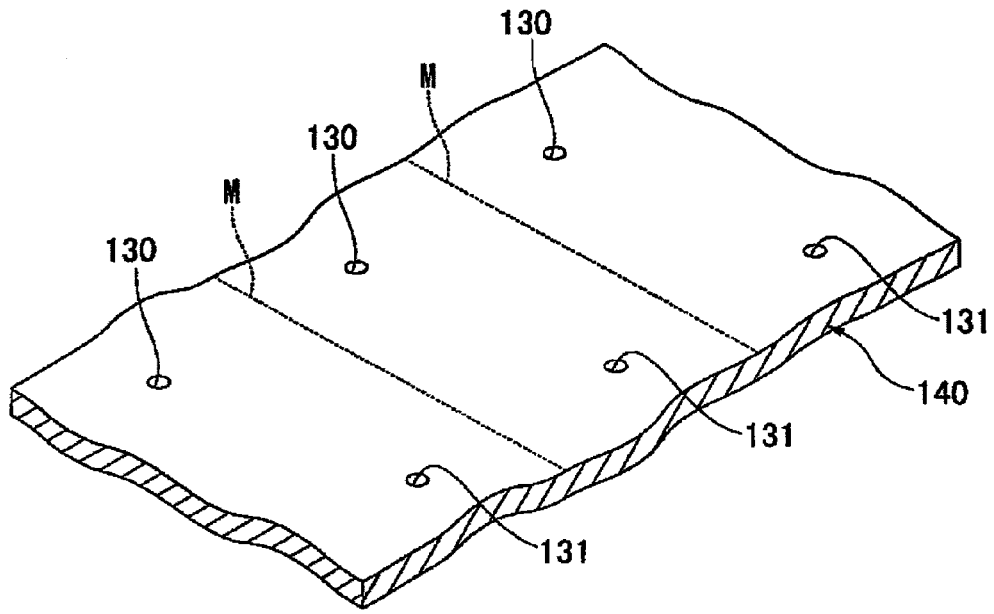
FIG. 30 is a view showing one step in manufacturing piezoelectric vibrators according to the flowchart shown in FIG. 28, and is a view showing the condition where pairs of through-holes are formed in a base substrate wafer which is an original to be a base substrate.
Figure 31:
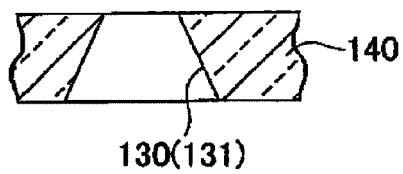
FIG. 31 is a cross-sectional view of the base substrate wafer in the condition shown in FIG. 30.

First, as shown in FIG. 30, a through-hole forming step (S132) is attained for forming a plurality of pairs of through-holes 130 and 131 in and through the base substrate wafer 140. The dotted line M shown in FIG. 30 means a section line for cutting in the subsequent cutting step. In this step, the lower face of the base substrate wafer 140 is processed, for example, according to a sand-blasting method. Accordingly, tapered through-holes 130 and 131 are formed, which run through the base substrate wafer 140 with its diameter gradually decreasing from the lower face to the upper face thereof, as shown in FIG. 31. A plurality of pairs of through-holes 130 and 131 are so formed as to be housed in the recesses 103*a* formed in the lid substrate wafer 150, when the two wafers 140 and 150 are overlaid later. Further, they are so positioned that one through-hole 130 can be positioned on the side of the base 112 of the piezoelectric vibration member 104 and the other through-hole 131 can be on the top side of the vibration arms 110 and 111.

Figure 32:
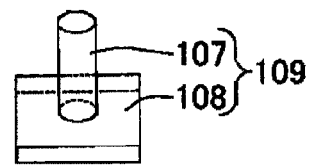
FIG. 32 is a perspective view of a tack member to be used in manufacturing piezoelectric vibrators according to the flowchart shown in FIG. 28.
Figure 33:
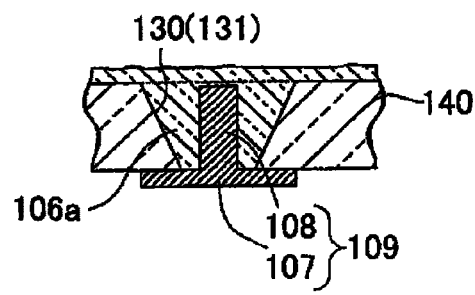
FIG. 33 is a view showing one step in manufacturing piezoelectric vibrators according to the flowchart shown in FIG. 28, and is a view showing the condition where a tack member is disposed in a through-hole and a glass frit is filled therein.

Subsequently, a setting step is attained for disposing the core part 107 of a tack member 109 in these plural through-holes 130 and 131 and filling a pasty glass fit 106*a* formed of a glass material in the through-holes 130 and 131 (S133). In this stage, as the tack member 109, used is an electroconductive tack member 109 that comprises a tabular basis part 108 and a core part 107 formed on the basis part 108 in the direction substantially perpendicular to the surface of the basis part 108 to have a length shorter by 0.02 mm than the thickness of the base substrate wafer 140 and to have a flat end, as shown in FIG. 32. Further, as shown in FIG. 33, the core part 107 is inserted until the basis part 108 of the tack member 109 is kept in contact with the base substrate wafer 140.

In this, the tack member 109 must be so positioned that the axial direction of the core part 107 can substantially correspond to the axial direction of the through-holes 130 and 131. However, the tack member 109 having the core part 107 formed on the basis part 108 is used, the axial direction of the core part 107 can be made to substantially correspond to the axial direction of the through-holes 130 and 131 in a simple operation of merely pushing the basis part 108 until it is kept in contact with the base substrate wafer 140. Accordingly, the workability in the setting step can be enhanced.

Moreover, the pasty glass frit can be surely filled in the through-holes 130 and 131 by making the basis part 108 in contact with the surface of the base substrate wafer 140.

Further, since the basis part 108 is formed to be tabular, even when the base substrate wafer 140 is put on a flat face such as a desk or the like after the setting step and before the subsequent firing step, it may be kept stable but is not shaky. In this point, the workability can be enhanced.

Figure 34:
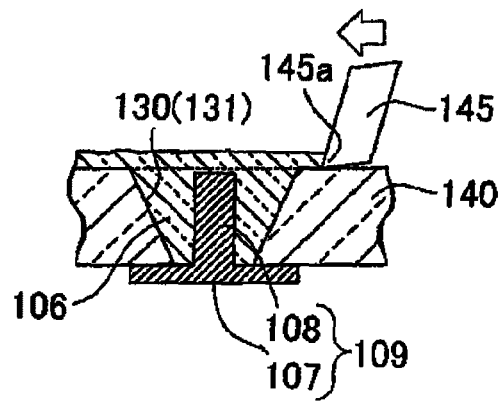
FIG. 34 is a view showing one step in manufacturing piezoelectric vibrators according to the flowchart shown in FIG. 28, and is a view showing the condition where the excessive glass frit is removed.
Figure 35:
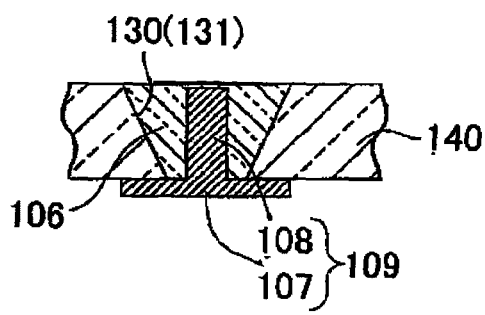
FIG. 35 is a view showing one step in manufacturing piezoelectric vibrators according to the flowchart shown in FIG. 28, and is a view showing the condition where the excessive glass frit was removed.

When the glass frit 106*a* is filled in the through-holes 130 and 131, it is excessively applied so that the glass frit 106*a* can be surely filled in the through-holes 130 and 131. Accordingly, the surface of the base substrate wafer 140 may also be coated with the glass frit 106*a*. When the glass frit 106*a* is fired in this condition, then the time necessary for the subsequent polishing step may increase; and therefore, a glass frit removing step is attained for removing the excessive glass frit 106*a* before firing (S134). As shown in FIG. 34, in the glass frit removing step, for example, using a resin-made squeegee 145, the top end 145a of the squeegee 145 is kept in contact with the surface of the base substrate wafer 140 and the squeegee is moved along the surface to thereby remove the glass frit 106a. In that manner, as shown in FIG. 35, the excessive glass frit 106a can be removed surely in a simple operation. In this embodiment, since the length of the core part 107 of the tack member 109 is made shorter by 0.02 mm than the thickness of the base substrate wafer 140, the top end 145a of the squeegee 145 is not brought into contact with the top end of the core part 107 when the squeegee 145 runs on the through-holes 130 and 131, and therefore, the core part 107 is prevented from being inclined.

Figure 36:
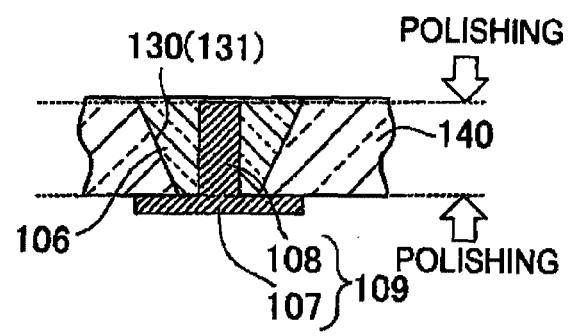
FIG. 36 is a view showing one step in manufacturing piezoelectric vibrators according to the flowchart shown in FIG. 28, and is a view showing the condition where, after the state shown in FIG. 35, the glass frit is fired.

Subsequently, a firing step is attained for firing the implanted implant member at a predetermined temperature (S135). Accordingly, the through-holes 130 and 131, the glass frit 106a implanted in the through-holes 130 and 131 and the tack member 109 disposed in the glass frit 106a firmly stick to each other. In firing, the basis part 108 is also fired together with them, and therefore the two can be integrally fixed to each other with the axial direction of the core part 107 kept substantially corresponding to the axial direction of the through-holes 130 and 131. When the glass frit 106a is fired, then it is solidified to be the cylindrical body 106. Subsequently, as shown in FIG. 36, after the firing, a polishing step is attained for polishing and removing the basis part 108 of the tack member 109 (S136). Accordingly, the basis part 108 that has played a role of positioning the cylindrical body 106 and the core part 107 can be removed, and only the core part 107 can be left inside the cylindrical body 106.

Figure 37:
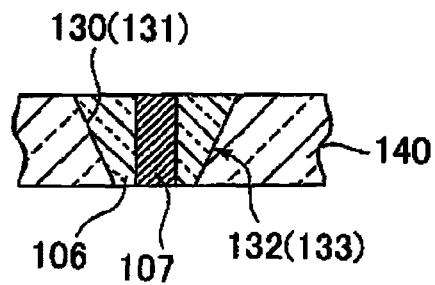
FIG. 37 is a view showing one step in manufacturing piezoelectric vibrators according to the flowchart shown in FIG. 28, and is a view showing the condition where, after the state shown in FIG. 36, the basis part of the tack member is polished.

At the same time, the back of the base substrate wafer 140 (the side opposite to the side on which the basis part 108 of the tack member 109 is disposed) is polished to be a flat face. Then, this is polished until the top end of the core part 107 is exposed out. As a result, as shown in FIG. 37, a plurality of pairs of through-electrodes 132 and 133 can be manufactured, in which the cylindrical body 106 and the core part 107 are integrally fixed to each other.

In forming the through-electrodes 132 and 133, no paste is used but a cylindrical body 106 of a glass material and an electroconductive core part 107 are used to form the through-electrodes 132 and 133, different from conventional ones. In case where a paste is used, the organic matter in the paste may evaporate in firing with the result that the paste volume may remarkably decrease as compared with that before firing. Accordingly, in case where only a paste is implanted in the through-holes 130 and 131, then the paste surface may have large depressions after firing. However, in this embodiment, since the metallic core part 107 is used in the electroconductive part, the volume reduction in the electroconductive part may be evaded.

As described in the above, the surface of the base substrate wafer 140 and the two ends of the cylindrical body 106 and the core part 107 can be all substantially in a flat condition. In other words, the surface of the base substrate wafer 140 and the surface of the through-electrodes 132 and 133 can be substantially in a flat condition. After the polishing step, the through-hole forming step is finished.

Figure 38:
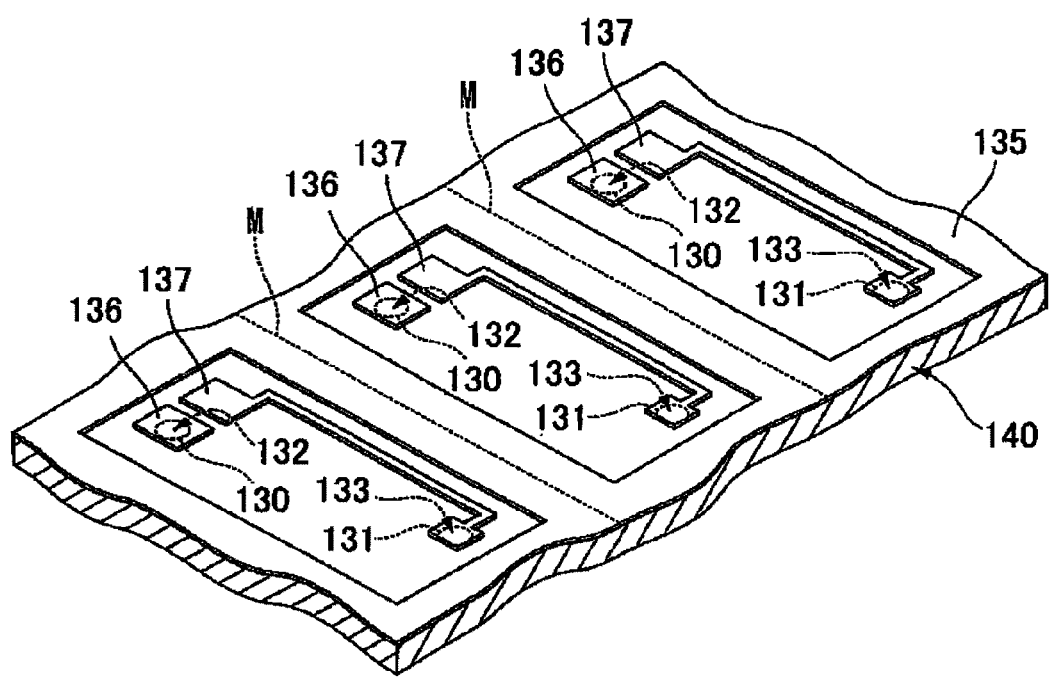
FIG. 38 is a view showing one step in manufacturing piezoelectric vibrators according to the flowchart shown in FIG. 28, and is a view showing the condition where, after the state shown in FIG. 37, bonding films and routing electrodes are patterned on the upper face of the base substrate wafer.
Figure 39:
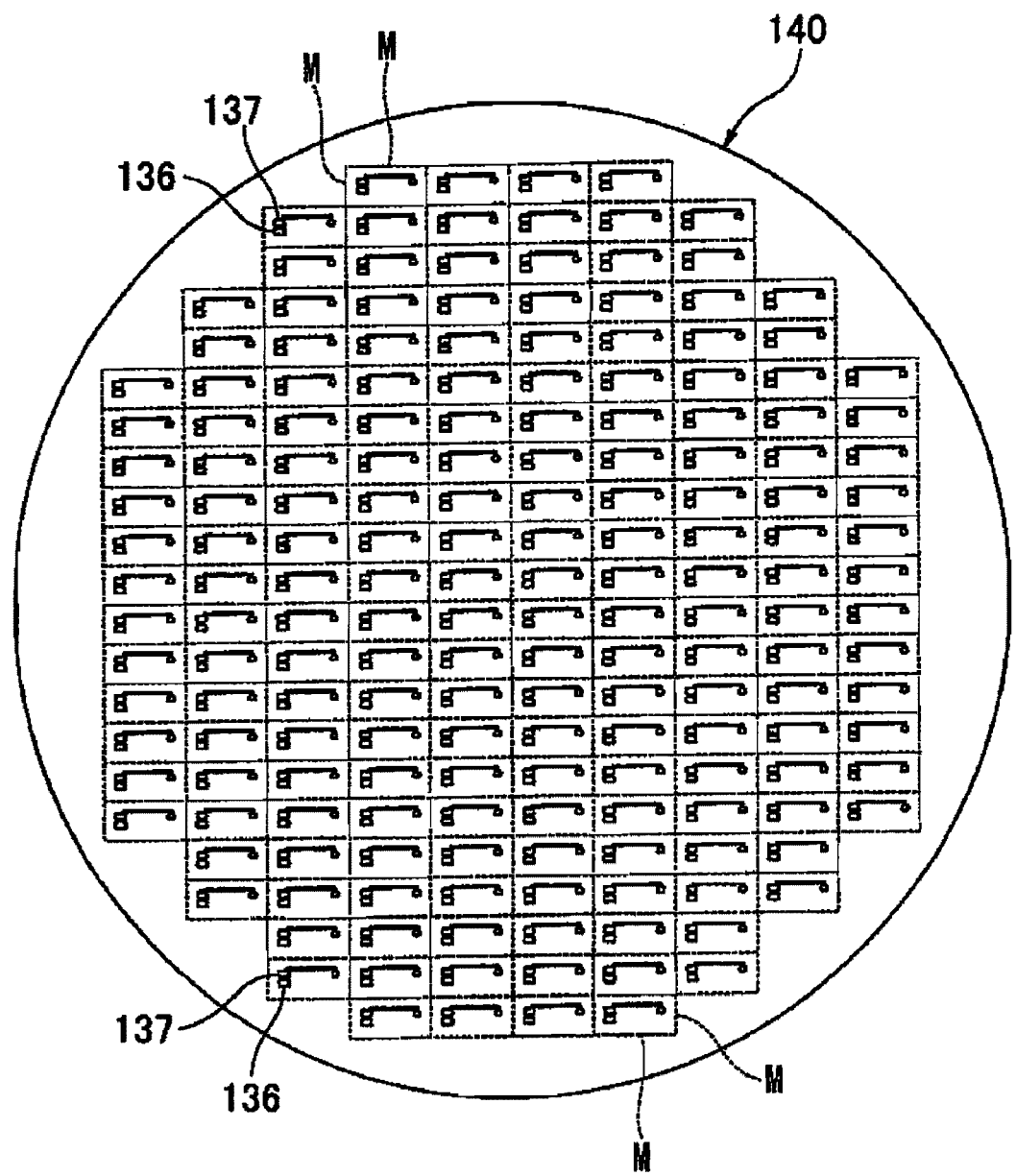
FIG. 39 is an entire view of the base substrate wafer in the state shown in FIG. 38.

Next, a bonding film forming step is attained for forming a bonding film 135 by patterning an electroconductive material on the upper face of the base substrate wafer 140, as shown in FIG. 38 and FIG. 39 (S137), and a routing electrode forming step is attained for forming a plurality of routing electrodes 136 and 137 connected electrically with the pair of through-electrodes 132 and 133, respectively (S138). The dotted line M shown in FIG. 38 and FIG. 39 means a section line for cutting in the subsequent cutting step.

In particular, the through-electrodes 132 and 133 are substantially in a flat condition relative to the upper face of the base substrate wafer 140 as so mentioned in the above. Accordingly, the routing electrodes 136 and 137 as patterned on the upper face of the base substrate wafer 140 are kept in airtight contact with the through-electrodes 132 and 133 with no space therebetween. This secures the electric connection between one routing electrode 136 and one through-electrode 132, and the electric connection between the other routing electrode 137 and the other through-electrode 133. In this stage, the second wafer forming step is finished.

In FIG. 28, the process sequence is the bonding film forming step (S137) followed by the routing electrode forming step (S138); however, contrary to this, the routing electrode forming step (S138) may be followed by the bonding film forming step (S137), or the two steps may be attained at the same time. In any process sequence, the same advantage and effect can be exhibited. Accordingly, the process sequence may be optionally changed or modified in any desired order.

Next, a mounting step is attained for bonding the formed, plural piezoelectric vibration members 104 onto the upper face of the base substrate wafer 140 via the routing electrodes 136 and 137 (S140). First, a bump P of gold or the like is formed on the pair of routing electrodes 136 and 137. After the base 112 of the piezoelectric vibration member 104 is put on the bump P, the piezoelectric vibration member 104 is pressed against the bump P while the bump P is heated at a predetermined temperature. Accordingly, the piezoelectric vibration member 104 is mechanically supported by the bump P, and the mount electrodes 116 and 117 are electrically connected with the routing electrodes 136 and 137. Therefore, at this time, the pair of excitation electrodes 115 of the piezoelectric vibration member 104 are electrically connected to the pair of through-electrodes 132 and 133, respectively.

In particular, the piezoelectric vibration member 104 is bump-bonded, and therefore it is supported as spaced above from the upper face of the base substrate wafer 140.

After the mounting of the piezoelectric vibration member 104 is finished, an overlaying step is attained for overlaying the base substrate wafer 140 and the lid substrate wafer 150 (S150). Concretely, the two wafers 140 and 150 are aligned in a correct position based on a reference mark or the like (not shown) as an index. Accordingly, the mounted piezoelectric vibration member 104 is kept housed in the cavity C surrounded by the recess 103a formed in the base substrate wafer 140 and the wafers 140 and 150.

Figure 40:
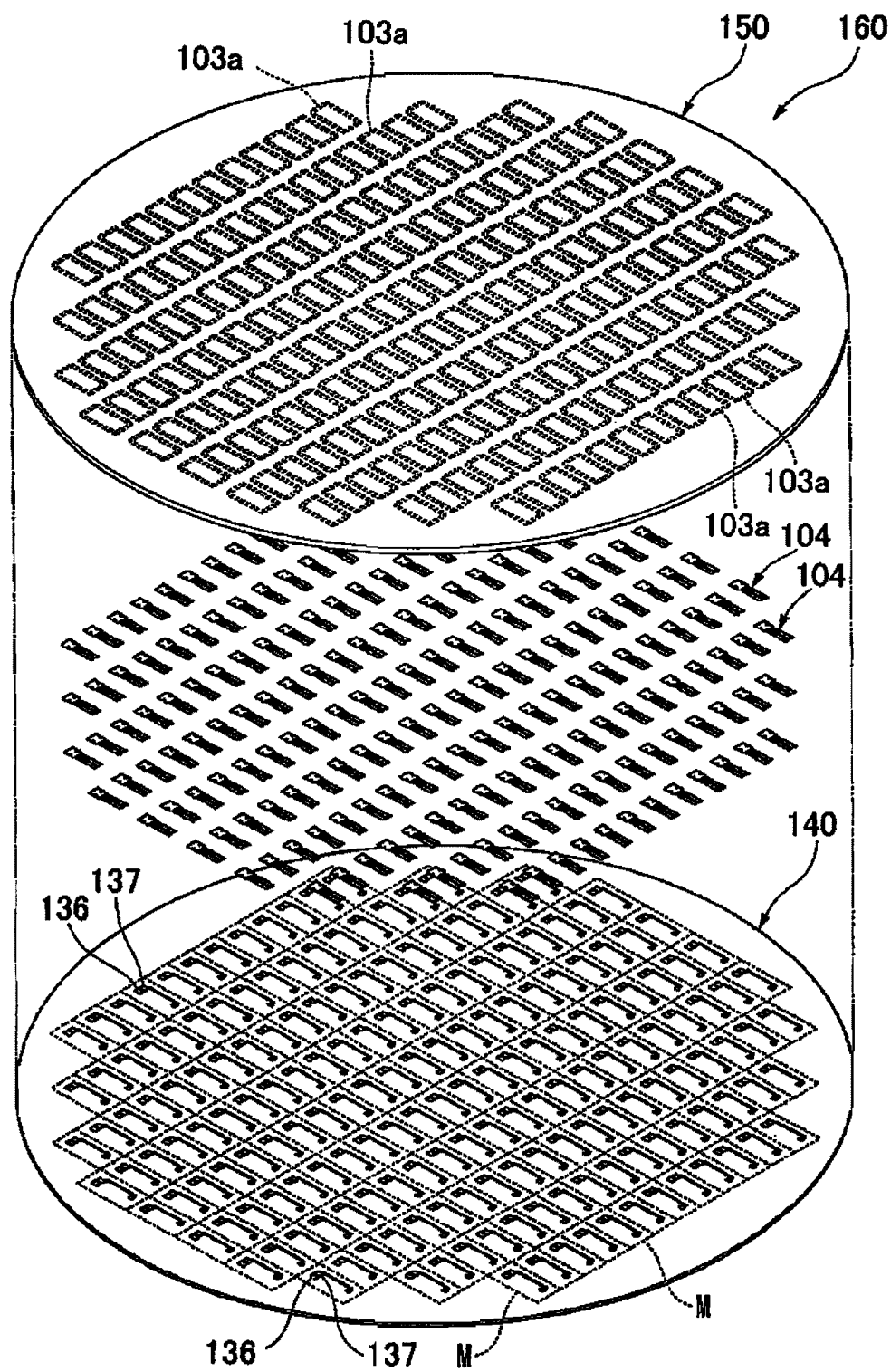
FIG. 40 is a view showing one step in manufacturing piezoelectric vibrators according to the flowchart shown in FIG. 28, and is a perspective exploded view of the wafer body in which the base substrate wafer and the lid substrate wafer are anodically-bonded and the piezoelectric vibration member is housed in the cavity.

After the overlaying step, a bonding step is attained for anodically bonding the overlaid two wafers 140 and 150 by putting them in an anodic bonding apparatus (not shown) and applying a predetermined voltage thereto in a predetermined temperature atmosphere (S160). Concretely, a predetermined voltage is applied between the bonding film 135 and the lid substrate wafer 150. With that, there occurs electrochemical reaction in the interface between the bonding film 135 and the lid substrate wafer 150, whereby the two firmly stick to each other to attain anodic bonding therebetween. Accordingly, the piezoelectric vibration member 104 can be sealed up in the cavity C, and a wafer body 160 as shown in FIG. 40 can be obtained in which the base substrate wafer 140 and the lid substrate wafer 150 are bonded to each other. FIG. 40 illustrates an exploded state of the wafer body 160 for facilitating the understating of the view, in which the illustrative constitution of from the base substrate wafer 140 to the bonding film 135 is omitted. The dotted line M shown in FIG. 40 means a section line for cutting in the subsequent cutting step.

In anodic bonding, the through-holes 130 and 131 formed in the base substrate wafer 140 are completely blocked up by the through-electrodes 132 and 133, and therefore, the airtightness inside the cavity C is not broken by the through-holes 130 and 131. In particular, the cylindrical body 106 and the core part 107 are integrally fixed to each other by firing and these are firmly fixed to the through-holes 130 and 131, and therefore the airtightness inside the cavity C can be surely secured.

After the above-mentioned anodic bonding is finished, an external electrode forming step is attained for forming a plurality of pairs of external electrodes 138 and 139 electrically connected to the pairs of through-electrodes 132 and 133, respectively, by patterning an electroconductive material on the lower face of the base substrate wafer 140 (S170). As a result of this step, the piezoelectric vibration member 104 sealed up in the cavity C can be operated by utilizing the external electrodes 138 and 139.

In particular, also in attaining this step, the through-electrodes 132 and 133 are kept substantially in a flat condition relative to the lower face of the base substrate wafer 140, like in the case of forming the routing electrodes 136 and 137, and therefore the patterned external electrodes 138 and 139 can be kept in airtight contact with the through-electrodes 132 and 133 with no space therebetween. Accordingly, the electric connection between the external electrodes 138 and 139 with the through-electrodes 132 and 133 is secured.

Next, a fine-tuning step is attained for finely tuning the frequency of the individual piezoelectric vibrators 101 sealed up in the cavities C in the state of the wafer body 160 to make it fall within a predetermined range (S180). Concretely, a voltage is applied to the pair of external electrodes 138 and 139 formed on the lower face of the base substrate wafer 140 to thereby vibrate the piezoelectric vibration member 104. Then, with monitoring the frequency, this is irradiated with a laser light from the outside through the lid substrate wafer 150, to thereby evaporate the fine-tuning film 121b of the weight metal film 121. As a result, the weight of the top side of the pair of vibration arms 110 and 111 changes, and therefore the frequency of the piezoelectric vibration member 104 can be finely tuned so as to fall within a predetermined range of a nominal frequency.

After the fine-tuning of frequency is finished, a cutting step is attained for cutting the bonded wafer body 160 to thereby shred it into the individual pieces along the section line M shown in FIG. 40 (S190). As a result, a plurality of two-layer structure-type, surface-mount piezoelectric vibrators 101 as in FIG. 20 can be manufactured all at once, in which the piezoelectric vibration member 104 is sealed up in the cavity C formed between the base substrate 102 and the lid substrate 103 anodically bonded to each other.

The process sequence may be in an order of the cutting step (S190) of shredding into the individual piezoelectric vibrators 101 followed by the fine-tuning step (S180). However, as so mentioned in the above, in case where the fine-tuning step (S180) is attained previously, then the tuning can be effected in the state of the wafer body 160 and therefore a plurality of piezoelectric vibrators 101 can be finely tuned more efficiently. Accordingly, it is favorable as increasing the throughput.

After this, the internal electric characteristics are inspected (S200). Specifically, the piezoelectric vibration member 104 is checked for the resonance frequency, the resonance resistance, the drive level characteristic (excitation power dependence of the resonance frequency and the resonance resistance), etc. In addition, it is checked also for the insulation resistance characteristic, etc. Finally, the piezoelectric vibrator 101 is checked for the appearance thereof in point of the dimension and the quality, etc. With that, the manufacture of the piezoelectric vibrator 101 is finished.

In particular, in the piezoelectric vibrator 101 of this embodiment, the through-electrodes 132 and 133 can be formed substantially in a flat condition relative to the base substrate 102, and therefore the through-electrodes 132 and 133, the routing electrodes 136 and 137 and the external electrodes 138 and 139 can be surely kept in airtight contact with each other. As a result, stable electric connection between the piezoelectric vibration member 104 with the external electrodes 138 and 139 can be secured, and the operation performance reliability of the piezoelectric vibrator can be enhanced and the quality thereof can be increased. Moreover, since the through-electrodes 132 and 133 are formed with the electroconductive core part 107, they secure extremely stable electric conductivity.

Further, the airtightness inside the cavity C can be secured, and in this point, the quality of the device can be increased.

According to the manufacturing method of this embodiment, a plurality of the above-mentioned piezoelectric vibrators 101 can be manufactured all at once, and therefore the manufacturing cost can be reduced.

Further, in this embodiment, the tack member 109 having the core part 107 shorter by 0.02 mm than the thickness of the base substrate wafer 140 is used in forming the through-electrodes 132 and 133 in the base substrate wafer 140, and therefore, during the process of firing the glass frit 106a to integrally fix the through-holes 130 and 131, the glass frit 106a and the core part 107 of the tack member 109 to each other, the core part 107 may be prevented from being inclined through contact thereof with anything.

Concretely, in this embodiment, in the glass fit filling step, when the pasty glass frit 106a is filled in the through-holes 130 and 131, the excessive glass frit 106a that could not be introduced into the through-holes 130 and 131 may spread over the surface of the base substrate wafer 140, and therefore, before firing, the excessive glass frit 106a is removed by the use of the squeegee 145. In this, since the length of the core part 107 is favorably defined as in the above, the contact between the top end 145a of the squeegee 145 and the top end of the core part 107 can be evaded during removing the excessive glass frit 106a, and the glass frit 106a can be surely removed. Accordingly, in the glass frit removing step, the core part 107 is surely prevented from being inclined.

In that manner, since the core part 107 is prevented from being inclined, the base substrate wafer 140 may be prevented from cracking in the polishing step after firing. Accordingly, stable electric connection between the piezoelectric vibration member 104 and the external electrodes 138 and 139 is secured, and the yield ratio can be thereby increased.

In this embodiment, the shape of the core part 107 is columnar as one illustrative example; however, it may be prismatic. Also in this case, the same advantage and effect can be exhibited.

In this embodiment, as the core part 107, preferably used is one having a thermal expansion coefficient substantially equal to that of the base substrate 102 (base substrate wafer 140) and the cylindrical body 106 (glass frit 106a).

In this case, three of the base substrate wafer 140, the cylindrical body 106 and the core part 107 thermally expand similarly in firing. Accordingly, any excessive pressure is not given to the base substrate wafer 140 and the cylindrical body 106 to crack them, owing to the difference in the thermal expansion coefficient, or there is no risk of forming a space between the cylindrical body 106 and the through-holes 130 and 131, and between the cylindrical body 106 and the core part 107. Therefore, through-electrodes of higher quality can be formed, and as a result, the quality of the piezoelectric vibrator 101 can be further increased.

In this embodiment, the length of the core part 107 is shorter by 0.02 mm than the thickness of the base substrate wafer 140 as one illustrative example; however, the length can be defined freely in a configuration where, when the excessive glass frit 106*a* is removed with the squeegee 145, the squeegee 145 is not brought into contact with the core part 107.

In this embodiment, the top end of the core part 107 of the tack member 109 used has a flat face before the polishing step as one illustrative example; however, the top end may not be a flat face so far as the length of the core part 107 is shorter than the thickness of the base substrate wafer 140 when the tack member 109 is disposed in the through-holes 130 and 131.

Third Embodiment

The third embodiment of the piezoelectric vibrator manufacturing method and the piezoelectric vibrator manufactured according to the manufacturing method of the invention is described below with reference to FIG. 41 to FIG. 66.

The piezoelectric vibrator 201 of this embodiment is, as shown in FIG. 41 to FIG. 44, a surface-mount piezoelectric vibrator that is formed to have a two-layer laminate boxy shape composed of a base substrate 202 and a lid substrate 203, in which a piezoelectric vibration member 204 is housed in the cavity C inside it.

Figure 44:
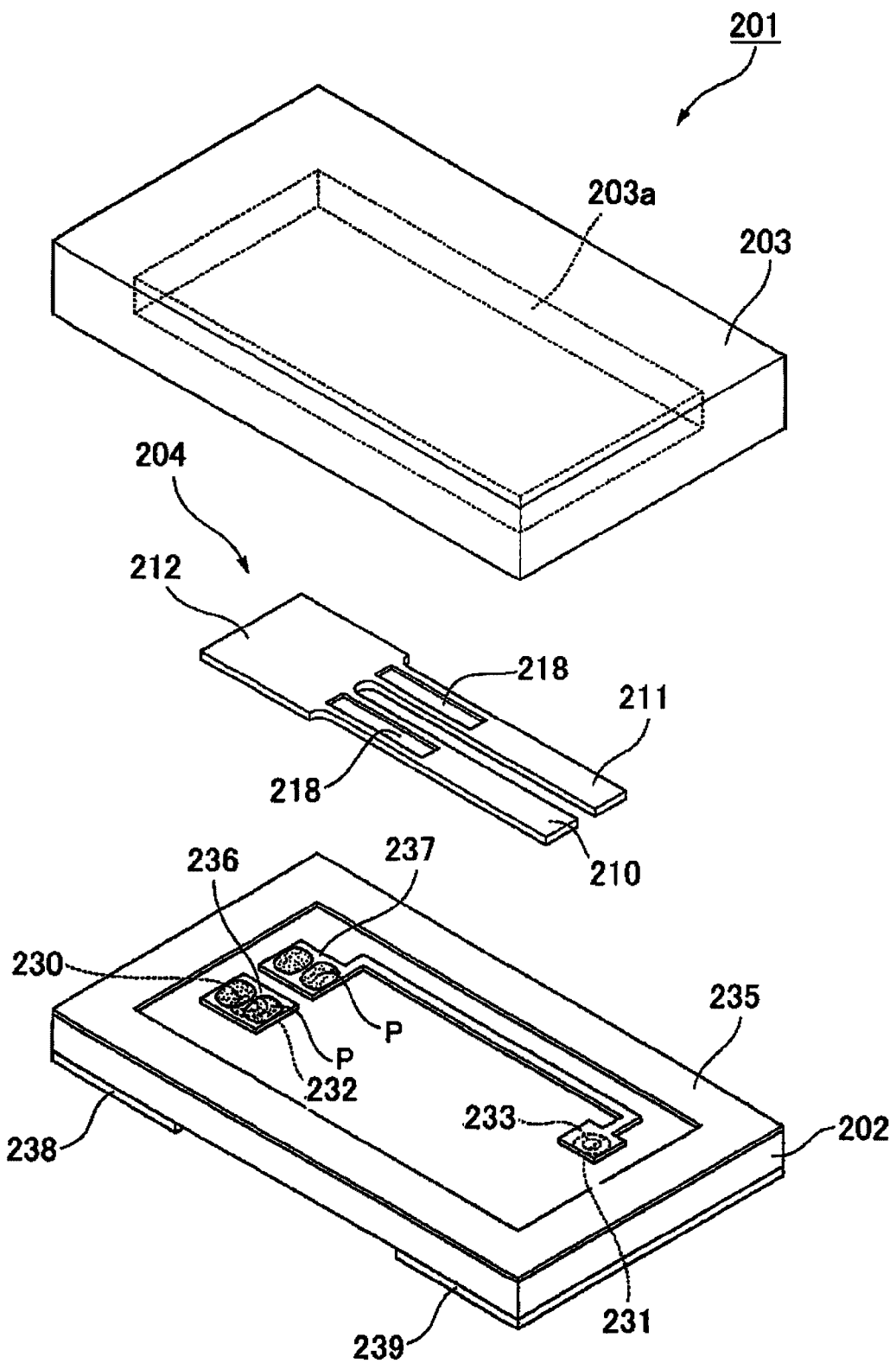
FIG. 44 is a perspective exploded view of the piezoelectric vibrator shown in FIG. 41.

The thickness of the base substrate 202 and the lid substrate 203 is, for example, from 150 μm to 200 μm each. In FIG. 44, an excitation electrode 215, routing electrodes 219 and 220, mount electrodes 216 and 217, and a weight metal film 221 to be mentioned below are omitted for facilitating the understating of the view.

Figure 45:
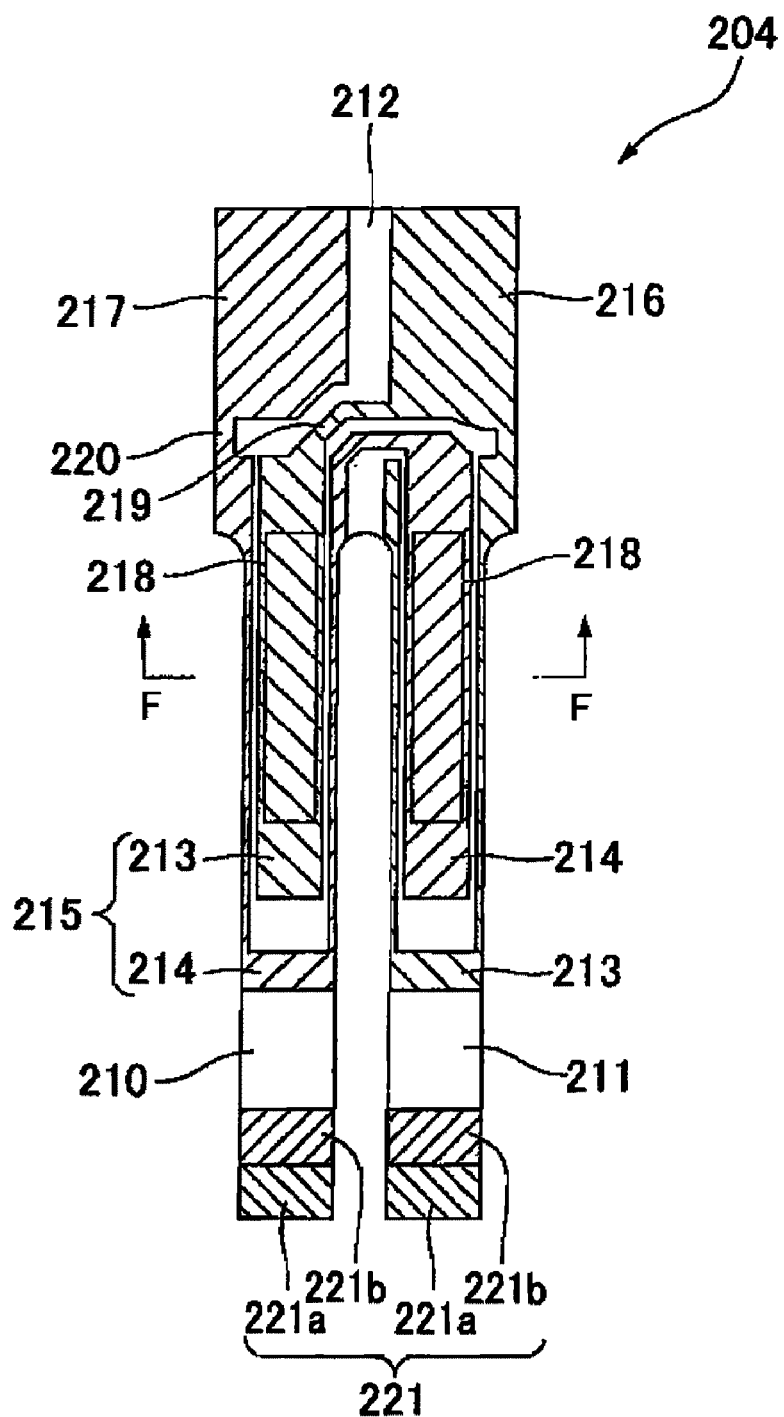
FIG. 45 is a top view of the piezoelectric vibration member constituting the piezoelectric vibrator shown in FIG. 41.
Figure 46:
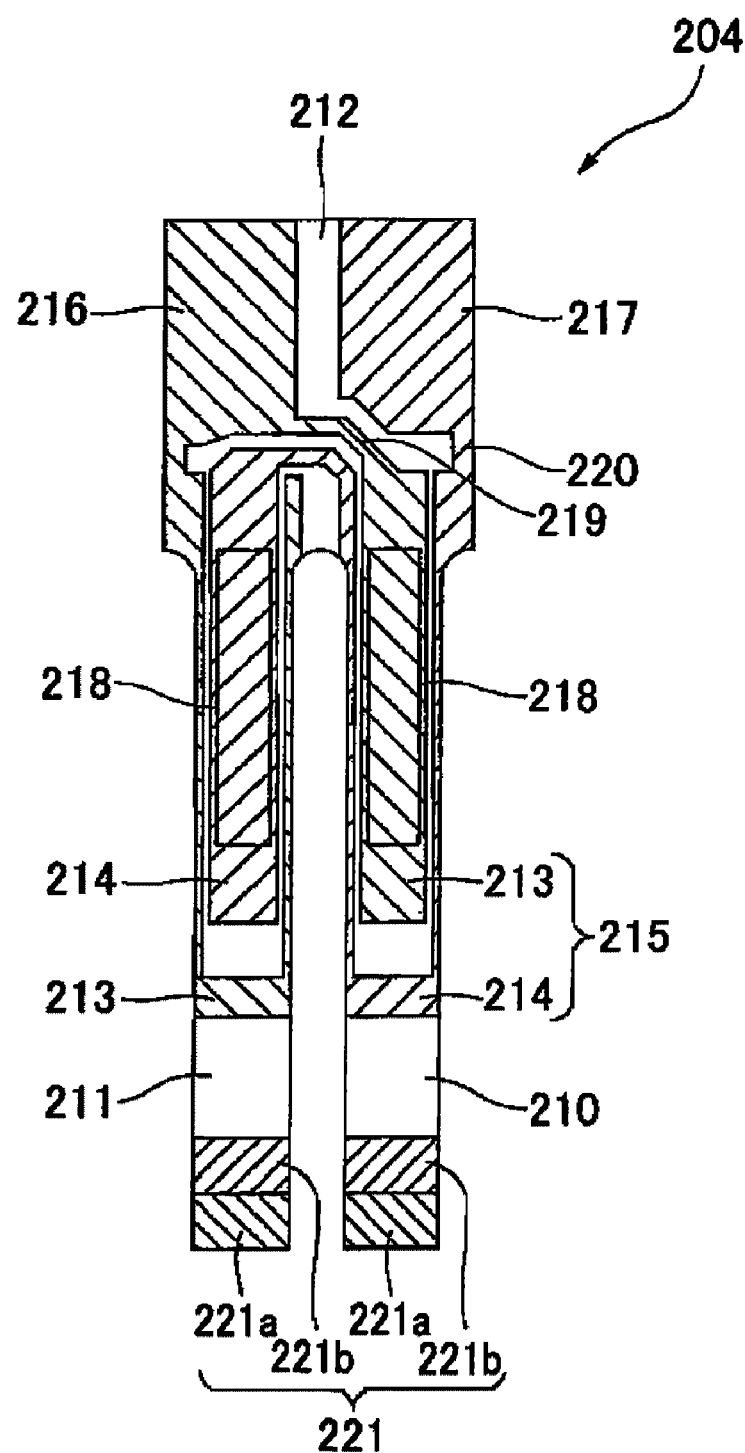
FIG. 46 is a bottom view of the piezoelectric vibration member shown in FIG. 45.
Figure 47:
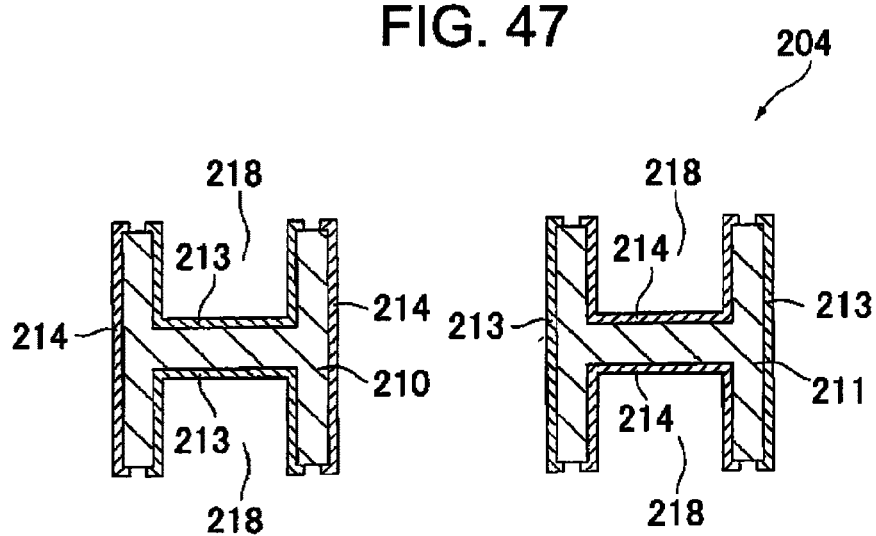
FIG. 47 is a cross-sectional outline view of F-F shown in FIG. 45.

As shown in FIG. 45 to FIG. 47, the piezoelectric vibration member 204 is a tuning fork-like vibration member formed of a piezoelectric material such as crystal, lithium tantalate, lithium niobate or the like, and this vibrates when a predetermined voltage is applied thereto.

The piezoelectric vibration member 204 has a pair of vibration arms 210 and 211 disposed in parallel to each other, a base 212 to integrally fix the base side of the pair of vibration arms 210 and 211, an excitation electrode 215 composed of a first excitation electrode 213 and a second excitation electrode 214 for vibrating the pair of the vibration arms 210 and 211, as formed on the outer surface of the pair of the vibration arms 210 and 211, and mount electrodes 216 and 217 electrically connected with the first excitation electrode 213 and the second excitation electrode 214.

The piezoelectric vibration member 204 in this embodiment comprises, on both the two main faces of the pair of vibration arms 210 and 211, a groove 218 formed along the longitudinal direction of the vibration arms 210 and 211. The groove 218 is formed from the base side to around the intermediate part of the vibration arms 210 and 211.

The excitation electrode 215 composed of the first excitation electrode 213 and the second excitation electrode 214 is an electrode to vibrate the pair of vibration arms 210 and 211 in the direction in which they come near to and get away from each other, at a predetermined resonance frequency, and this is patterned on the outer surface of the pair of vibration arms 210 and 211, as electrically insulated from each other. Concretely, as shown in FIG. 47, the first excitation electrode 213 is formed mainly on the groove 218 of one vibration arm 210 and on the two side faces of the other vibration arm 211, while the second excitation electrode 214 is formed mainly on the two side faces of one vibration arm 210 and on the groove 218 of the other vibration arm 211.

The first excitation electrode 213 and the second excitation electrode 214 are electrically connected to the mount electrodes 216 and 217 via the routing electrodes 219 and 220, respectively, on the two main faces of the base 212, as shown in FIG. 45 and FIG. 46. The piezoelectric vibration member 204 is given a voltage via the mount electrodes 216 and 217.

The above-mentioned excitation electrode 215, mount electrodes 216 and 217 and routing electrodes 219 and 220 are, for example, formed of a coating film of an electroconductive film of chromium (Cr), nickel (Ni), aluminium (Al), titanium (Ti) or the like.

The top of the pair of vibration arms 210 and 211 is coated with a weight metal film 221 for tuning the vibration condition of the arms themselves within a predetermined frequency range (frequency tuning). The weight metal film 221 is divided into two, a rough-tuning film 221*a* for use in roughly tuning the frequency and a fine-tuning film 221*b* for use in finely tuning it. With these rough-tuning film 221*a* and fine-tuning film 221*b*, the frequency is tuned, whereby the frequency of the pair of vibration arms 210 and 211 can be controlled to fall within a range of the nominal frequency of the device.

Figure 43:
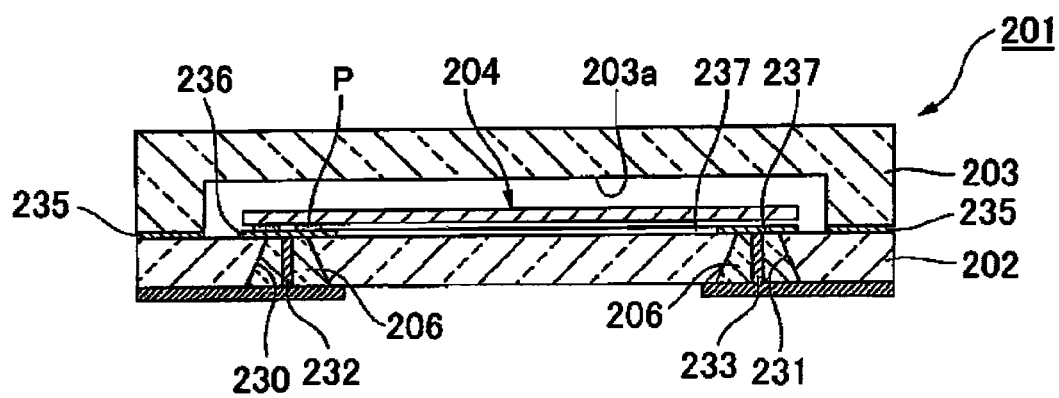
FIG. 43 is a cross-sectional view of the piezoelectric vibrator cut along the line E-E in FIG. 22.

The thus-constituted piezoelectric vibration member 204 is, as shown in FIG. 43 and FIG. 44, bump-bonded to the upper face of the base substrate 202 with a bump P of gold or the like. More concretely, on the two bumps P formed on the routing electrodes 236 and 237 to be mentioned below, as patterned on the upper face of the base substrate 202, a pair of mount electrodes 216 and 217 are bump-bonded as kept in contact with each other. Accordingly, the piezoelectric vibration member 204 is supported as spaced above from the upper face of the base substrate 202, and the mount electrodes 216 and 217 are electrically connected to the routing electrodes 236 and 237, respectively.

Figure 41:
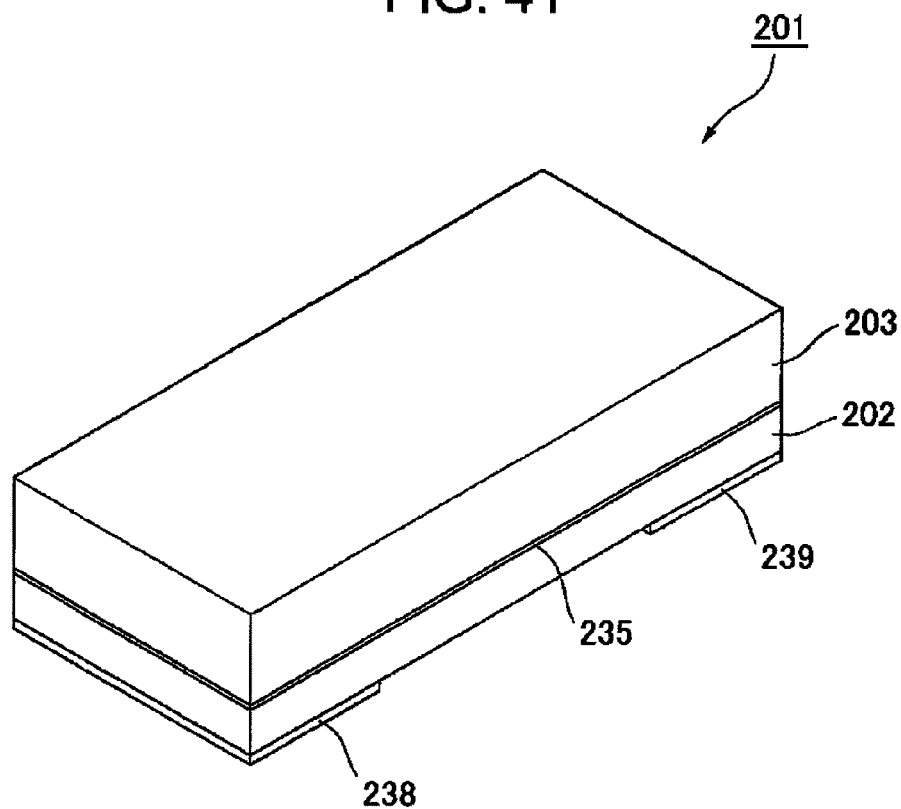
FIG. 41 is a perspective outline view showing the third embodiment of the piezoelectric vibrator of the invention.
Figure 42:
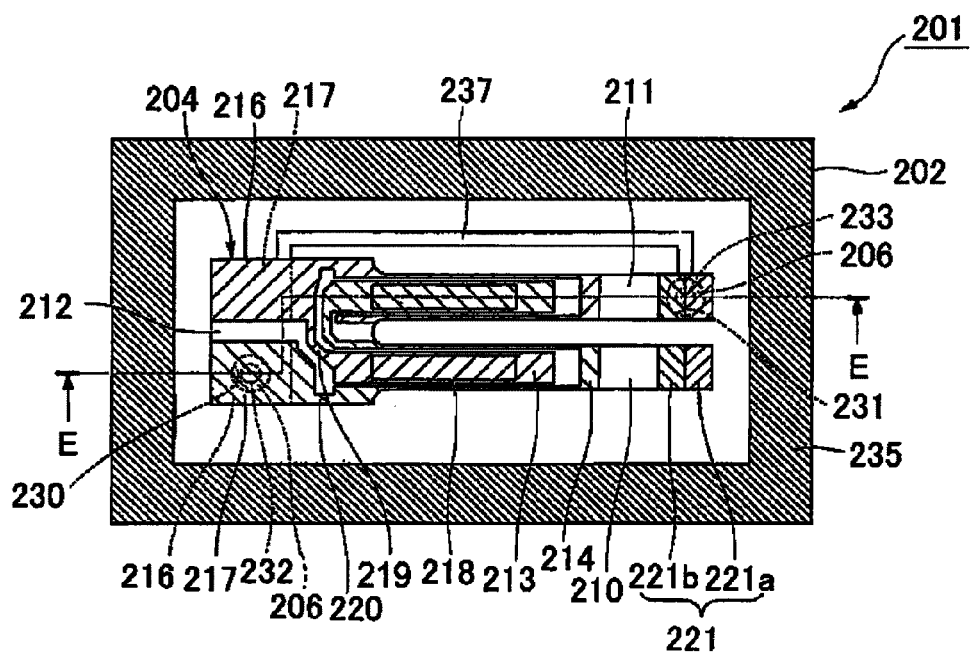
FIG. 42 is an internal configuration view of the piezoelectric vibrator shown in FIG. 41, and is a top view of the piezoelectric vibrator from which the lid substrate was removed.

The lid substrate 203 is a transparent insulating substrate formed of a glass material, for example, soda lime glass; and as shown in FIG. 41, FIG. 43 and FIG. 44, this is shaped to be tabular. On the bonding face side to which the base substrate 202 is bonded, formed is a rectangular recess 203*a* in which the piezoelectric vibration member 204 is housed. The recess 203*a* is a cavity recess to be a cavity C to house the piezoelectric vibration member 204 therein when the two substrates 202 and 303 are overlaid. The lid substrate 203 is anodically bonded to the base substrate 202 with the recess 203*a* kept facing the side of the base substrate 202.

The base substrate 202 is, like the lid substrate 203, a transparent insulating substrate formed of a glass substrate, for example, soda lime glass; and as shown in FIG. 41 to FIG. 44, this is formed to be tabular and have a size capable of being overlaid on the lid substrate 203.

The base substrate 202 is formed to have a pair of through-holes 230 and 231 running through the base substrate 202 in the vertical direction. The pair of through-holes 230 and 231 are so formed as to be housed inside the cavity C. More precisely, the through-holes 230 and 231 in this embodiment are so formed that one through-hole 230 is positioned on the side of the base 212 of the mounted piezoelectric vibration member 204 and the other through-hole 231 is positioned on the top side of the vibration arms 210 and 211. In this embodiment, a tapered through-hole of which the diameter of the cross section gradually increases to the lower face of the base substrate 202 is described as one example; but not limited to this case, the through-hole may also be a straight through-hole that runs straightly through the base substrate 202. Anyhow, the through-hole may be any one that runs through the base substrate 202.

In the pair of through-holes 230 and 231, disposed are a pair of through-electrodes 232 and 233 that are formed to run through the base substrate 202, and a glass frit 206 that fills up the space between the inner peripheral wall of the through-holes 230 and 231 and the through-electrodes 232 and 233.

These through-electrodes 232 and 233 and the glass frit 206 play a role of completely blocking up the through-holes 230 and 231 and keeping the airtightness inside the cavity C, and electrically connecting the external electrodes 238 and 239 with the routing electrodes 236 and 237 as described below.

The through-electrodes 232 and 233 in this embodiment differ from the through-electrodes 32, 33, 132 and 133 in the above-mentioned first embodiment and second embodiment, and mean the core parts 7 and 107 in the first embodiment and the second embodiment. Further, the through-electrodes 32, 33, 132 and 133 in the first embodiment and the second embodiment, or that is, the through-electrodes that are formed to run through the base substrate 202 and to keep the airtightness inside the cavity C, and are electrically connected to the external electrodes 238 and 239 are composed of the through-electrodes 232 and 233 and the glass frit (cylindrical body) 206 in this embodiment.

The through-electrodes 232 and 233 are electroconductive core members formed of a metal material to be columnar, as shown in FIG. 43, and these are formed to have two flat ends and a thickness substantially equal to the thickness of the base substrate 202. The through-electrodes 232 and 233 are firmly fixed to the glass frit 206 through firing of the glass frit 206. The through-electrodes 232 and 233 are formed of, for example, Kovar, Dumet wire, Fe—Ni or the like, of which the thermal expansion coefficient is substantially equal to that of the glass frit 206.

The glass frit 206 is fired as implanted in the through-holes 230 and 231, and it firmly sticks to the inner peripheral wall of the through-holes 230 and 231. The melting point of the glass frit 206 is, for example, around 430° C. The hardness of the glass frit 206 is lower than the hardness of the glass material to form the base substrate 202 and the lid substrate 203. Further, the thermal expansion coefficient of the glass frit 206 is substantially equal to the thermal expansion coefficient of the base substrate 202 and the lid substrate 203. The glass frit 206 is formed to be tabular, and the through-electrodes 232 and 233 are inserted into the center hole thereof.

On the upper face side of the base substrate 202 (the bonding face side thereof to which the lid substrate 203 is bonded), an anodic-bonding film 235 and a pair of routing electrodes 236 and 237 are patterned with an electroconductive material (for example, aluminium), as shown in FIG. 41 to FIG. 44. Of those, the bonding film 235 is formed along the peripheral edge of the base substrate 202 so as to surround the periphery of the recess 203a formed in the lid substrate 203.

The routing electrodes 236 and 237 are two-layer electrode films composed of, for example, a lower layer of chromium and an upper layer of gold; and their thickness is, for example, 2000 angstroms. The pair of routing electrodes 236 and 237 are so patterned as to electrically connect one through-electrode 232 of the pair of through-electrodes 232 and 233, with one mount electrode 216 of the piezoelectric vibration member 204, and to electrically connect the other through-electrode 233 with the other mount electrode 217 of the piezoelectric vibration member 204. More precisely, one routing electrode 236 is formed just above one through-electrode 232 so as to be positioned just below the base 212 of the piezoelectric vibration member 204; and the other routing electrode 237 is so formed as to be positioned just above the other through-electrode 233 after routed from the position adjacent to one routing electrode 236 to the top of the vibration arms 210 and 211 along the vibration arms 210 and 211.

A bump P is formed on the pair of routing electrodes 236 and 237, and via the bump P, the piezoelectric vibration member 204 is mounted. Accordingly, one mount electrode 216 of the piezoelectric vibration member 204 is electrically connected to one through-electrode 232 via one routing electrode 236, and the other mount electrode 217 is electrically connected to the other through-electrode 233 via the other routing electrode 237.

On the lower face of the base substrate 202, formed are external electrodes 238 and 239 to be electrically connected to the pair of through-electrodes 232 and 233, respectively, as shown in FIG. 41, FIG. 43 and FIG. 44. In other words, one external electrode 238 is electrically connected to the first excitation electrode 213 of the piezoelectric vibration member 204 via one through-electrode 232 and one routing electrode 236. The other external electrode 239 is electrically connected to the second excitation electrode 214 of the piezoelectric vibration member 204 via the other through-electrode 233 and the other routing electrode 237.

To operate the thus-constituted piezoelectric vibrator 201, a predetermined driving voltage is applied to the external electrodes 238 and 239 formed on the base substrate 202. Accordingly, a current is applied to the excitation electrode 215 composed of the first excitation electrode 213 and the second excitation electrode 214 of the piezoelectric vibration member 204, whereby the pair of vibration arms 210 and 211 are vibrated at a predetermined frequency in the direction in which they come near to and get away from each other. Based on the vibration of the pair of vibration arms 210 and 211, the vibrator can be used as a time source, a timing source of control signals or the like, a reference signal source, etc.

Next, before describing the manufacturing method for the above-mentioned piezoelectric vibrator 201, the base substrate wafer 240, the lid substrate wafer 250, the tack member 209, the fixing jig A and the holding jig B for use in the manufacturing method are described.

Figure 48:
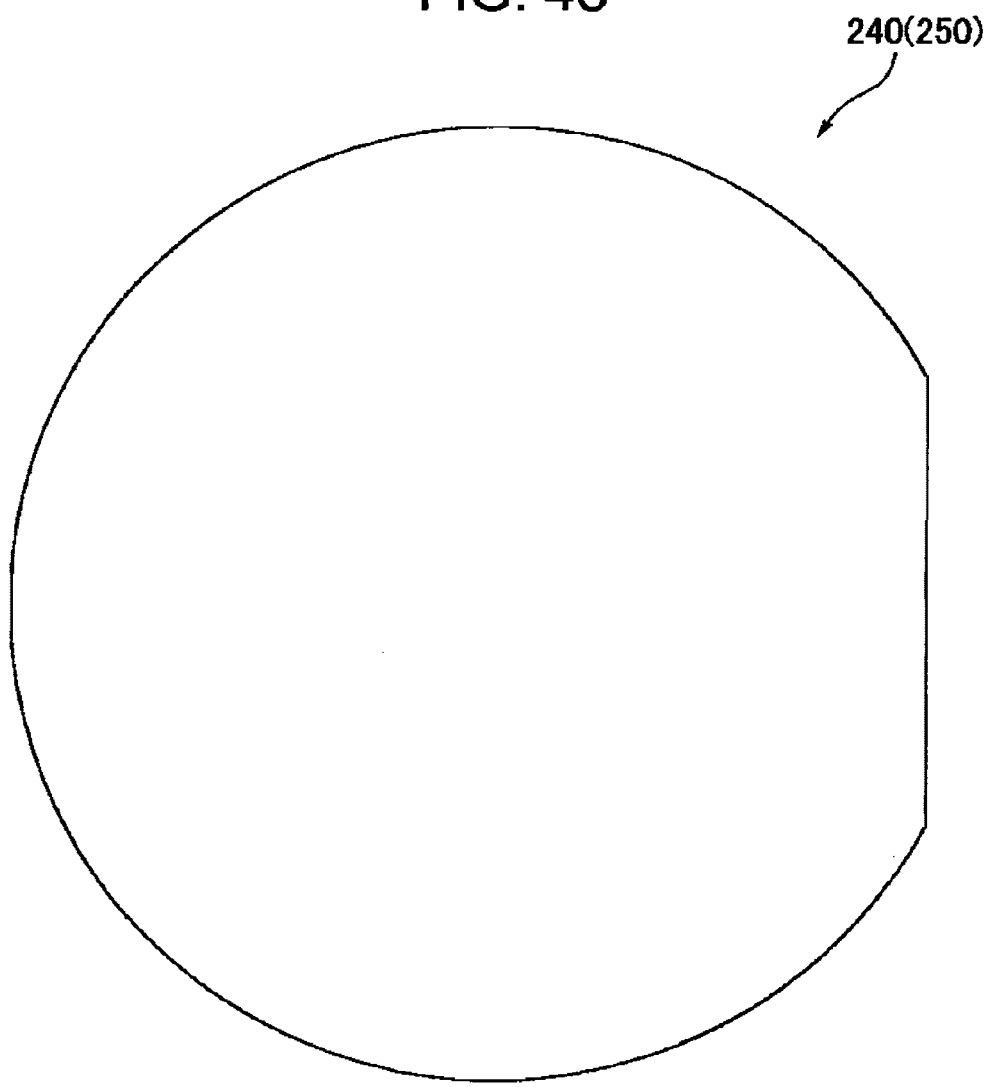
FIG. 48 is a plan view of a base substrate wafer for use in the manufacturing method for the piezoelectric vibrator of this embodiment.

The base substrate wafer 240 and the lid substrate wafer 250 each are a tabular wafer of a disc partly cut off at the peripheral edge thereof as a planar view, as shown in FIG. 48. Both the two wafers 240 and 250 may be formed, for example, by polishing soda lime glass to a predetermined thickness, then washing it and removing the work-affected layer of the outermost surface by etching or the like.

Figure 49:
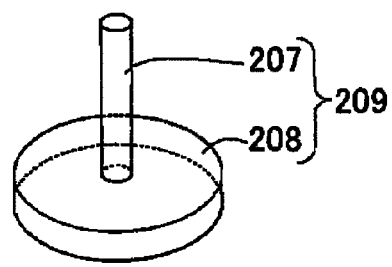
FIG. 49 is a perspective view of a tack member for use in the manufacturing method for the piezoelectric vibrator of this embodiment.

The tack member 209 is an electroconductive one having a tabular basis part 208 and a core part 207 extending from the surface of the basis part 208, as shown in FIG. 49. In this embodiment, the core part 207 extends from above the basis part 208 toward the direction substantially perpendicular to the surface of the basis part 208 to the length substantially equal to the thickness of the base substrate wafer 240, and its top end is formed to be flat. The basis part 208 of the tack member 209 is formed larger, on the planar view thereof, than the open end on the upper face side of the through-holes 230 and 231. The tack member 209 is formed of, for example, Kovar, Dumet wire, Fe—Ni or the like, and its thermal expansion coefficient is substantially equal to that of the glass frit 206. In the illustrated case, the core part 207 is formed columnar, and the basis part 208 is formed disc-like.

Figure 50:
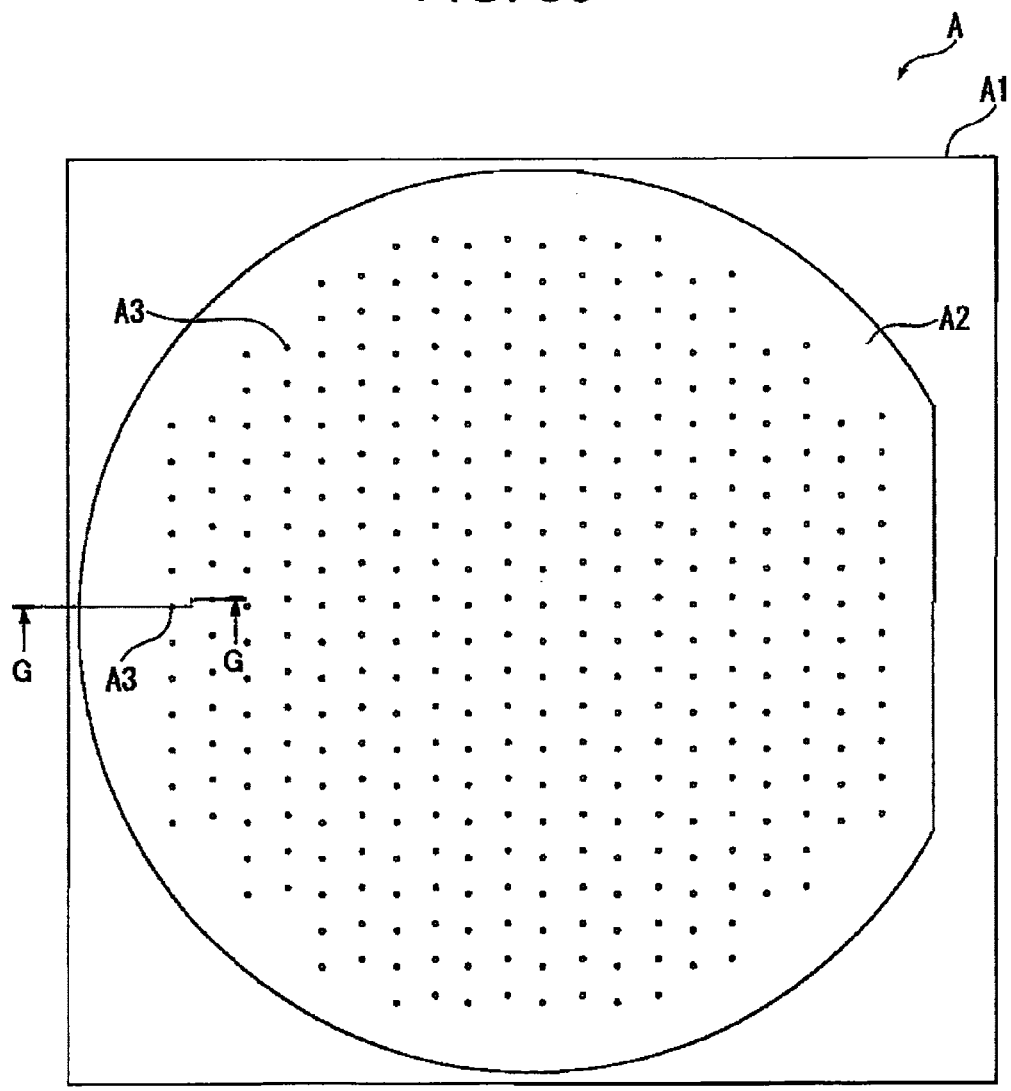
FIG. 50 is a plan view of a fixing jig for use in the piezoelectric vibrator manufacturing method of the invention.
Figure 51:
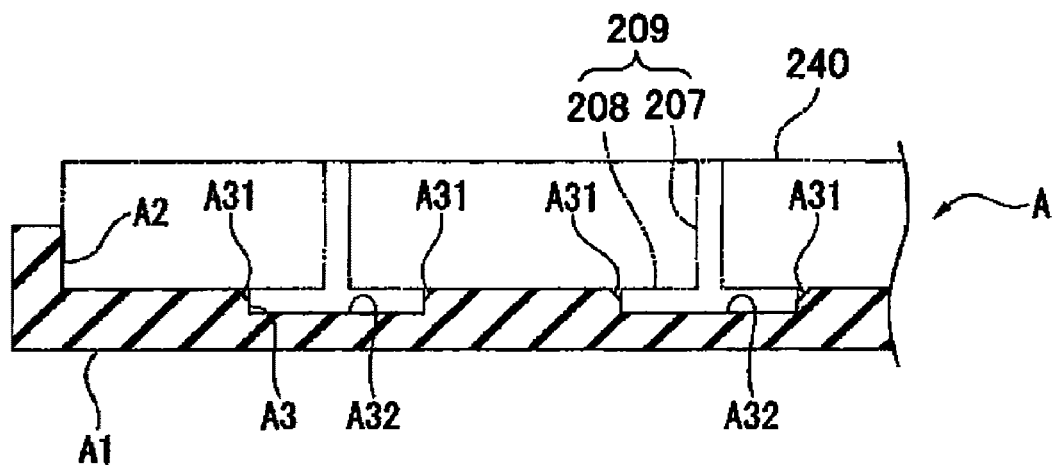
FIG. 51 is a cross-sectional outline view of G-G shown in FIG. 50.

The fixing jig A is for regulating the posture of the tack member 209 by fitting the basis part 208 of the tack member 209, of which the core part 207 has been inserted into a base substrate wafer 240, to the base substrate wafer 240, as shown in FIG. 50 and FIG. 51. In this embodiment, the fixing jig A comprises a tabular fixing jig body A1, a positioning recess (positioning part) A2 for positioning a base substrate wafer 240 relative to the surface of the fixing jig body A1, and a plurality of tack recesses A3 which are formed in the position that faces the through-holes 230 and 231 of the base substrate wafer 240 as positioned by the positioning recess A2, in the surface of the fixing jig body A1, and of which the bottom face A32 is flat, the depth is substantially equal to the thickness of the basis part 208 of the tack member 209, and the inner diameter of the inner wall surface on the side of the bottom face A32 is substantially equal to the outer diameter of the basis part 208.

The fixing jig body A1 is, as the planar view thereof, formed to be larger than the base substrate wafer 240. For the fixing jig body A1, for example, carbon may be used. In this case, a glass material does not adhere to the fixing jig A and, after fired, the base substrate wafer 240 can be surely peeled away from the fixing jig A.

The positioning recess A2 is a recess which is formed to have the same size as that of the base substrate wafer 240 in the surface of the fixing jig body A1 and which runs straightly in the thickness direction of the fixing jig body A1; and its depth is substantially a half of the thickness of the base substrate wafer 240. In the bottom of the positioning recess A2, the tack recesses A3 are formed.

The tack recess A3 is formed to have a tapered shape of such that the diameter of its open end part A31 gradually decreases toward the side of the bottom face A32 of the tack recess A3. In the illustrated case, the inner diameter of the open end of the tack recess A3 is larger than the outer diameter of the basis part 208 of the tack member 209, and in the thickness direction of the fixing jig body A1, the inner diameter of the intermediate part that is a position in the intermediate between the open end and the bottom face A32 is equal to the outer diameter of the basis part 208, and the open end part A31 from the open end to the intermediate part is formed as tapered. The section from the intermediate part to the bottom face A32 is formed to have a straight shape having the same diameter.

Figure 52:
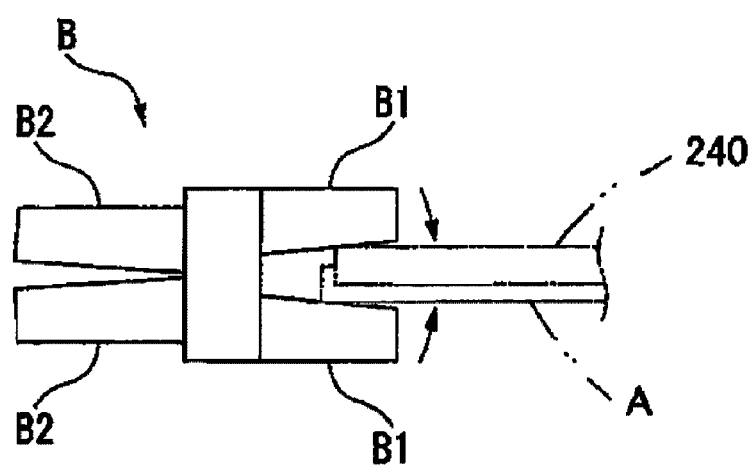
FIG. 52 is a side view of a holding jig for use in the piezoelectric vibrator manufacturing method of the invention.

The holding jig B is for mutually tightly contacting the fixing jig A and a base substrate wafer 240, as shown in FIG. 52. In this embodiment, the holding jig B comprises a pair of nipping parts B1 that nip the fixing jig A and the base substrate wafer 240 overlaid with each other, on their outer surfaces. In the illustrated case, further, the holding jig B comprises a pair of nip-release parts B2 for releasing the fixing jig A and the base substrate wafer 240 nipped by the pair of nipping parts B1.

The pair of nipping parts B1 are biased by a twisted coil spring or the like (not shown) in the direction in which they come close to each other. The pair of nipping parts B1 are combined with the pair of nip-release parts B2; and by moving the pair of nip-release parts B2 closer to each other, the pair of nipping parts B1 can get away from each other. The pair of nipping parts B1 and the pair of nip-release parts B2 are formed of, for example, stainless; and in this case, the parts are prevented from oxidizing and can be used for a long period of time.

Figure 53:
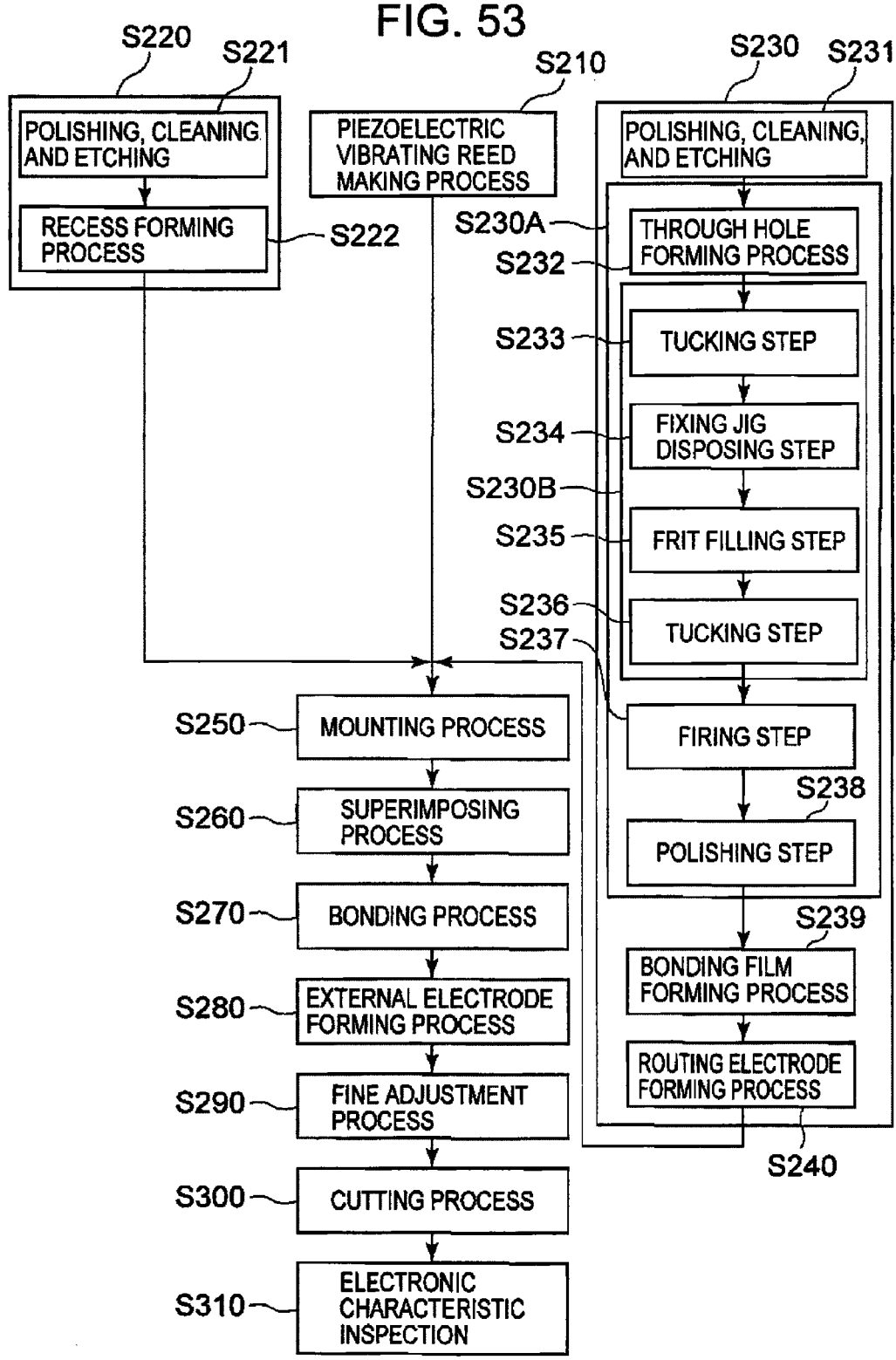
FIG. 53 is a flowchart showing the flow in manufacturing the piezoelectric vibrator shown in FIG. 41.

Next, described is a method for manufacturing a plurality of piezoelectric vibrators 201 mentioned above all at once, by utilizing the base substrate wafer 240, the lid substrate wafer 250, the tack member 209, the fixing jig A and the holding jig B, with reference to the flowchart shown in FIG. 53.

First, a piezoelectric vibration member forming step is attained to form the piezoelectric vibration member 204 shown in FIG. 45 to FIG. 47 (S210). Concretely, first, a rough Lambertian quartz is sliced at a predetermined angle to give a wafer having a predetermined thickness. Next, the wafer is roughly worked by lapping, then the work-affected layer is removed by etching, and thereafter this is mirror-finished by polishing or the like to give a wafer having a predetermined thickness. Next, the wafer is suitably processed by washing or the like, and then the wafer is patterned into an external shape of the piezoelectric vibration member 204 through photolithography, and a metal film is formed and patterned to thereby form the excitation electrode 215, the routing electrodes 219 and 220, the mount electrodes 216 and 217, and the weight metal film 221. Accordingly, a plurality of piezoelectric vibration members 204 are manufactured.

After the piezoelectric vibration members 204 are manufactured, they are processed for rough-tuning of resonance frequency. This is attained by irradiating the rough-tuning film 221a of the weight metal film 221 with a laser light to partly evaporate it, thereby changing the weight thereof. Regarding the fine tuning for resonance frequency to a higher degree of resolution, the members are processed after mounting. This is described later.

Figure 54:
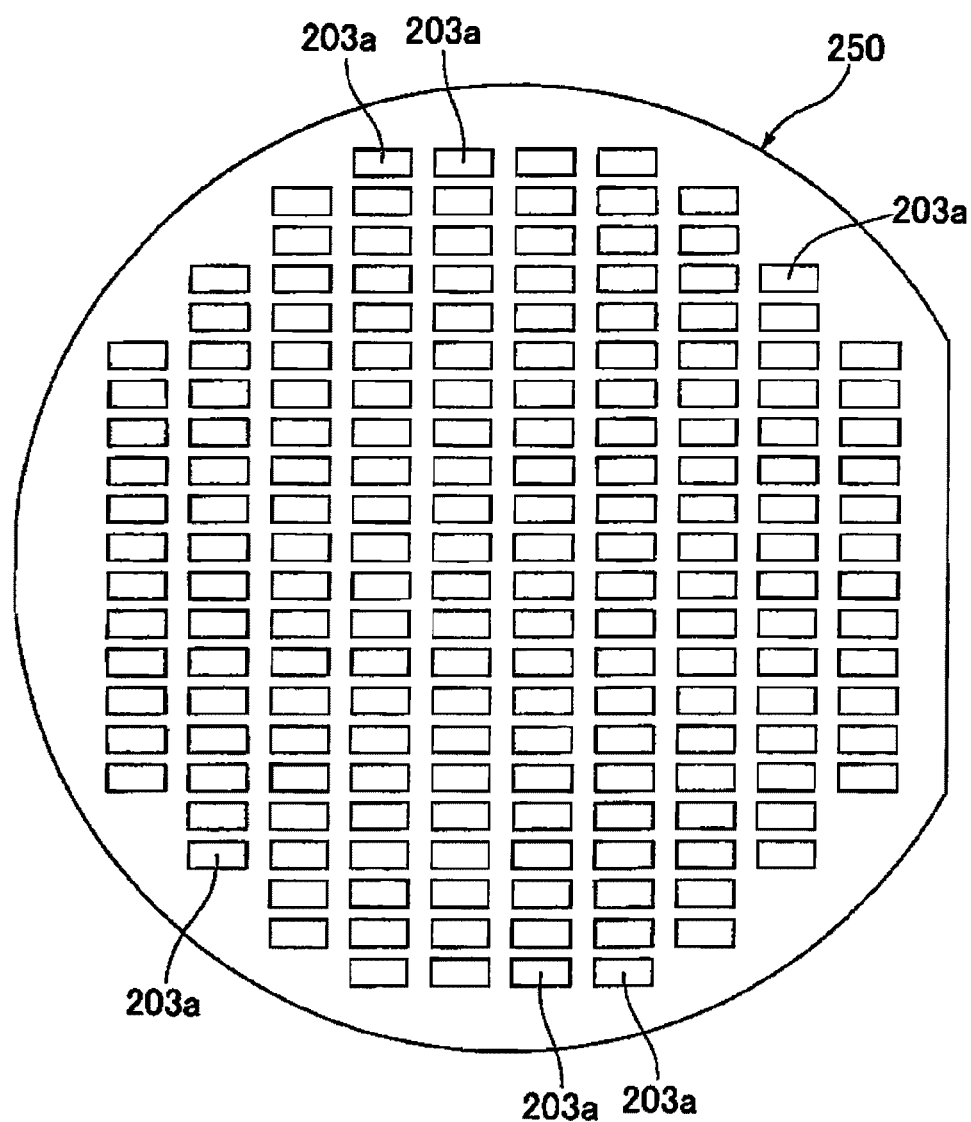
FIG. 54 is a view showing one step in manufacturing piezoelectric vibrators according to the flowchart shown in FIG. 53, and is a view showing the condition where a plurality of recesses are formed in a lid substrate wafer which is an original to be a lid substrate.

Next, a first wafer forming step is attained for forming a lid substrate wafer 250 to be the lid substrate 203 later up to the state just before anodic bonding (S220). First, as mentioned above, a lid substrate wafer 250 is formed of soda lime glass (S221). Next, as shown in FIG. 54, a recess forming step is attained for forming a plurality of cavity recesses 203a in the line direction by etching or the like in the bonding face of the lid substrate wafer 250 (S222). At this stage, the first wafer forming step is finished.

Next, at the same time or in a timing of before or after the above step, a second wafer forming step is attained for forming a base substrate wafer 240 to be the base substrate 202 later up to the state just before anodic bonding (S230). First, as mentioned above, a base substrate wafer 240 is formed of soda lime glass (S231). Next, a through-electrode forming step is attained for forming a pair of through-electrodes 232 and 233 in the base substrate wafer 240 (S230A). Here, the through-electrode forming step is described in detail.

Figure 55:
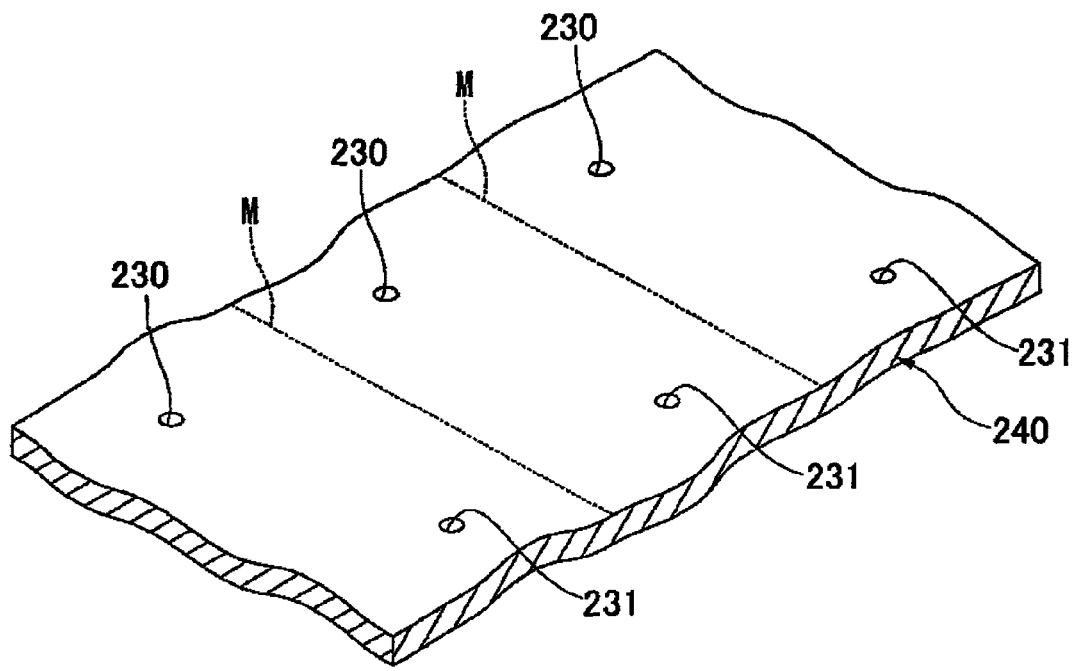
FIG. 55 is a view showing one step in manufacturing piezoelectric vibrators according to the flowchart shown in FIG. 53, and is a view showing the condition where pairs of through-holes are formed in a base substrate wafer which is an original to be a base substrate.
Figure 56:
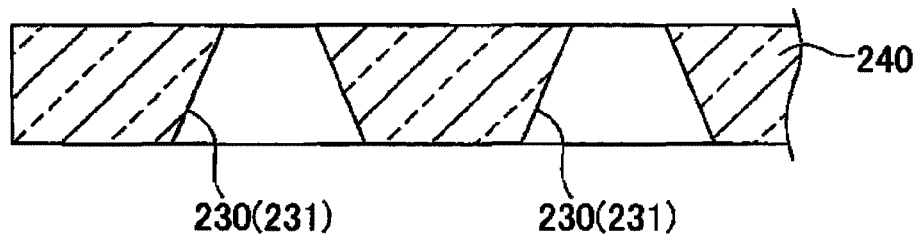
FIG. 56 is a cross-sectional view of the base substrate wafer in the condition shown in FIG. 55.

First, as shown in FIG. 55, a through-hole forming step (S232) is attained for forming a plurality of pairs of through-holes 230 and 231 in and through the base substrate wafer 240. The dotted line M shown in FIG. 55 means a section line for cutting in the subsequent cutting step. In this step, the wafer is processed, for example, according to a sand-blasting method or a pressing method. Accordingly, tapered through-holes 230 and 231 are formed, which run through the base substrate wafer 240 with its diameter gradually increasing from the upper face to the lower face thereof, as shown in FIG. 56. A plurality of pairs of through-holes 230 and 231 are so formed as to be housed in the recesses 203a formed in the lid substrate wafer 250, when the two wafers 240 and 250 are overlaid later. Further, they are so positioned that one through-hole 230 can be positioned on the side of the base 212 of the piezoelectric vibration member 204 and the other through-hole 231 can be on the top side of the vibration arms 210 and 211. FIG. 56 and the cross-sectional views of the base substrate wafer 240 mentioned below are schematically illustrated ones for facilitating the understanding of the drawings; and the distance between the through-hole 230 and the peripheral face of the base substrate wafer 240, and the distance between the adjacent through-holes 230 are not limited to the illustrated cases.

Figure 57:
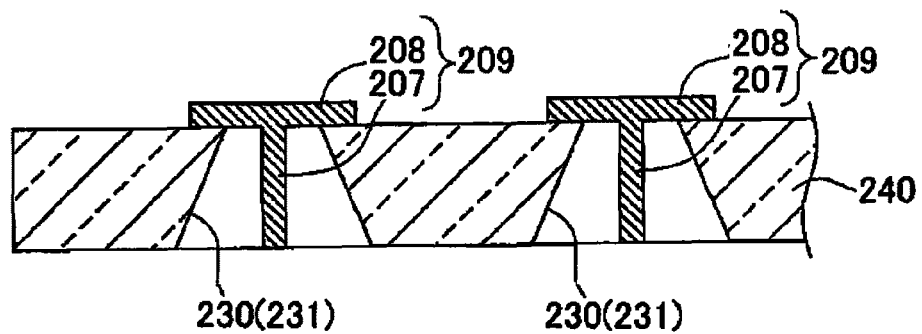
FIG. 57 is a view showing one step in manufacturing piezoelectric vibrators according to the flowchart shown in FIG. 53, and is a view showing the condition where, after the state shown in FIG. 56, the core part of a tack member is inserted into the through-hole.

Next, a setting step is attained for inserting the core part 207 of a tack member 209 until the basis part 208 is kept in contact with the base substrate wafer 240 and disposing a connection member, glass frit 206 between the core part 207 and the through-holes 230 and 231 (S230B). The setting step is described in detail. First, as shown in FIG. 57, a core part inserting step is attained for inserting the core part 207 of a tack member 209 from one side of the base substrate wafer 240 into these through-holes 230 and 231 (S233). In this embodiment, the core part 207 of a tack member 209 is inserted from the upper face side of the base substrate wafer 240. This step is attained, for example, by putting at random a larger number than the required number of tack members 209 on the upper face of a base substrate wafer 240 and disposing a magnet sheet on the lower face of the base substrate wafer 240, followed by vibrating the base substrate wafer 240 (insertion by vibration).

In this stage, the core part 207 extends from the surface of the basis part 208 and the basis part 208 is formed larger than the open end on the upper face side of the through-holes 230 and 231; and therefore, according to the above-mentioned operation of insertion by vibration, the surface of the basis part 208 is kept in contact with the upper face of the base substrate wafer 240 when the core part 207 is inserted into the through-holes 230 and 231, and the tack member 209 is thereby gotten hung up in the through-holes 230 and 231. Using the tack member 209 makes it possible to dispose the core part 207 in the through-holes 230 and 231 in such a simple operation, and the workability is thereby enhanced.

Figure 58:
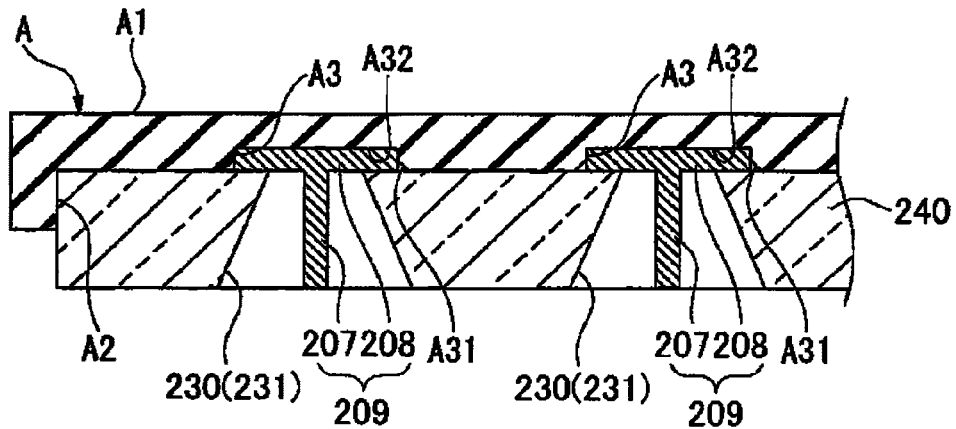
FIG. 58 is a view showing one step in manufacturing piezoelectric vibrators according to the flowchart shown in FIG. 53, and is a view showing the condition where, after the state shown in FIG. 57, a fixing jig is disposed on the upper face side of the base substrate wafer.

Next, as shown in FIG. 58, a fixing jig disposing step is attained for disposing a fixing jig A on the upper face side of the base substrate wafer 240 (S234). In this stage, the base substrate wafer 240 is disposed in the positioning recess A2, and the fixing jig A is so disposed that the base substrate wafer 240 can be positioned relative to the fixing jig A.

In particular, since the positioning recess A2 is formed in the fixing jig A, it is easy to position the base substrate wafer 240 relative to the fixing jig A by merely disposing the base substrate wafer 240 in the positioning recess A2.

Moreover, since the tack recesses A3 are formed in the position facing the through-holes 230 and 231 of the base substrate wafer 240 positioned by the positioning recess A2, the core part 207 of the tack member 209 can be readily positioned in the through-holes 230 and 231 by positioning the base substrate wafer 240 relative to the fixing jig A in the condition where the basis part 208 of the tack member 209 is disposed in the tack recess A3.

As the fixing jig A, one of which the open end A31 of the tack recess A3 is formed to have a tapered shape whose diameter gradually decreases toward the side of the bottom face A32 of the tack recess A3 is used, and therefore, the basis part 208 of the tack member 209 can be smoothly inserted into the tack recess A3. Accordingly, in inserting the basis part 208 into the tack recess A3, the basis part 208 is not inclined, and the posture of the tack member 209 can be more stably regulated.

Further, the tack recess A3 is so formed that the inner diameter of the inner peripheral wall on the side of the bottom face A32 is substantially equal to the outer diameter of the basis part 208, and therefore, by disposing the basis part 208 of the tack member 209 in the tack recess A3, the peripheral face of the basis part 208 of the tack member 209 can be supported by the inner peripheral wall on the side of the bottom face A32 of the tack recess A3. Accordingly, even when any external force is applied to the tack member 209, the posture of the tack member 209 can be prevented from changing.

Figure 59:
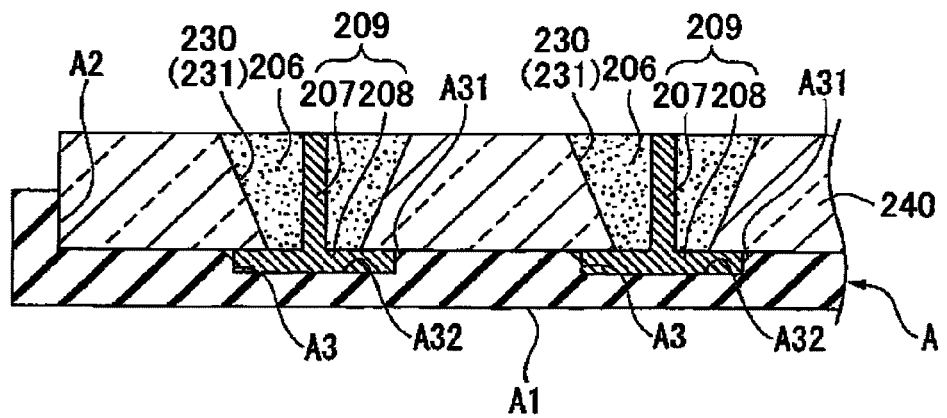
FIG. 59 is a view showing one step in manufacturing piezoelectric vibrators according to the flowchart shown in FIG. 53, and is a view showing the condition where, after the state shown in FIG. 58, a glass frit is filled in the through-hole.

Next, the base substrate wafer 240 is turned upside down with the fixing jig A being kept disposed on the upper face side of the base substrate wafer 240; and thereafter, as shown in FIG. 59, a frit filing step is attained for filling a glass frit 206 into the through-holes 230 and 231 so as to block up the space between the inner peripheral wall of the through-holes and the tack member 209 (S235). This step is attained, for example, by using a pasty glass frit 206 as the glass frit 206, and implanting the glass frit 206 into the through-holes 230 and 231 with a squeegee (not shown). The glass frit 206 may not be pasty, and may be, for example, powdery.

Figure 60:
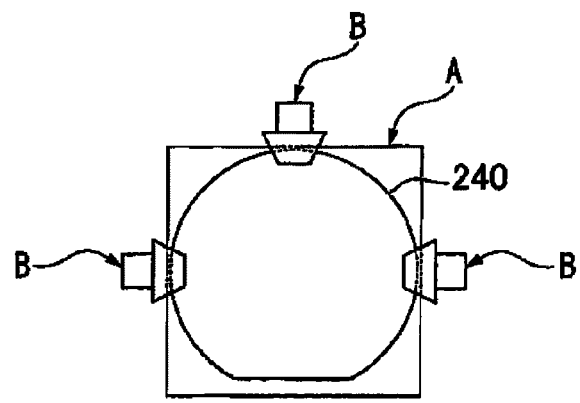
FIG. 60 is a view showing one step in manufacturing piezoelectric vibrators according to the flowchart shown in FIG. 53, and is a plan view showing the condition where, after the state shown in FIG. 59, holding jigs are disposed at the peripheral part of the base substrate wafer.
Figure 61:
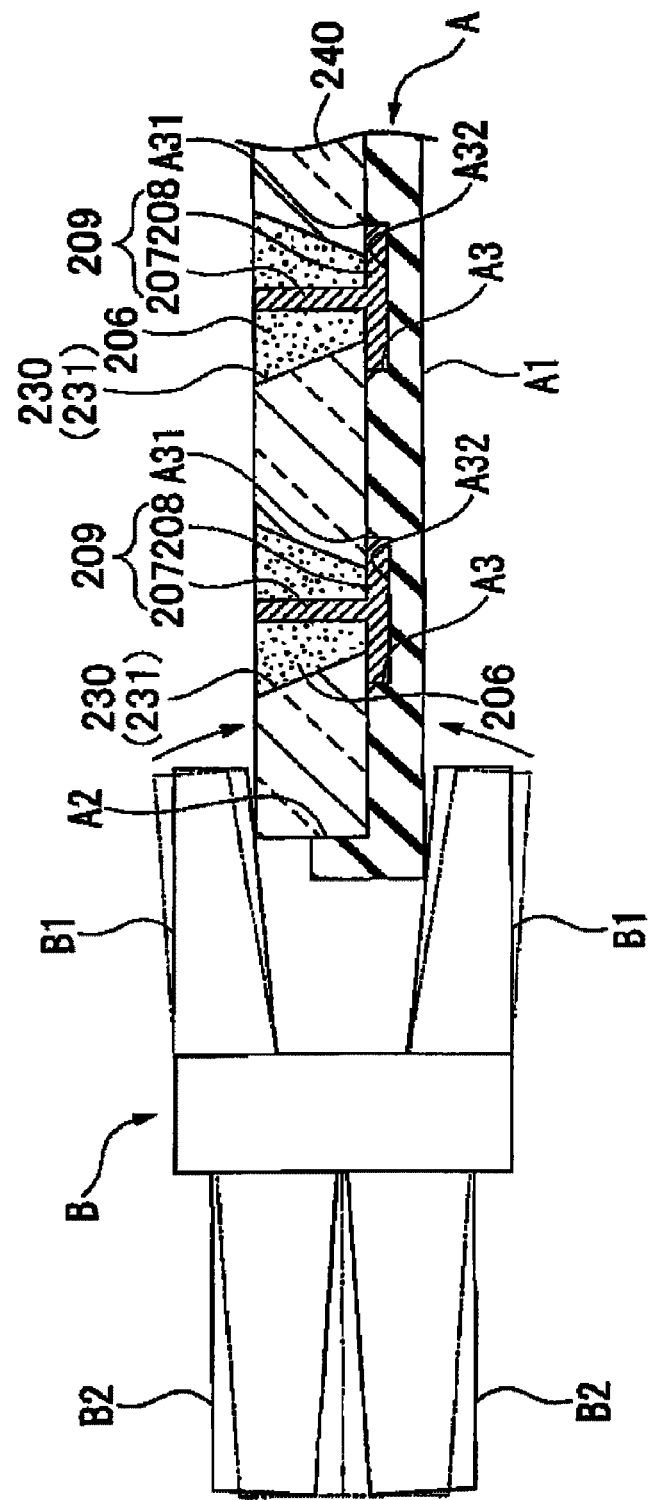
FIG. 61 is a view showing one step in manufacturing piezoelectric vibrators according to the flowchart shown in FIG. 53, and is a view showing the condition where, after the state shown in FIG. 59, a holding jig is disposed at the peripheral part of the base substrate wafer.

Next, as shown in FIG. 60 and FIG. 61, a nipping step is attained for nipping the basis part 208 of a tack member 209 between the base substrate wafer 240 and a fixing jig A by a holding jig B (S236). In this stage, the holding jig B is disposed in the peripheral part of the base substrate wafer 240. In the illustrated case, three holding jigs B as a whole are disposed in such a manner that each one is at the center of the base substrate wafer 240 and at the two sides spaced from the center by 90 degrees, except the part where the peripheral edge of the base substrate wafer 240 is cut off. In FIG. 60, the through-holes 230 and 231 formed in the base substrate wafer 240 are omitted for facilitating the understanding of the drawing. FIG. 61 is schematically drawn for facilitating the understanding thereof, in which the relationship between the base substrate wafer 240, the fixing jig A and the holding jig B is not limited to the illustrated case.

In disposing the holding jig B, first, the pair of the nip-release parts B2 are made to come close to each other, and the pair of the nipping parts B1 are set apart broader than the thickness of the overlaid base substrate wafer 240 and fixing jig A. Next, the base substrate wafer 240 and the fixing jig A are disposed between the pair of nipping parts B1, and the pair of nip-release parts B2 are set apart to thereby closely nip the fixing jig A and the base substrate wafer 240 with the pair of nipping parts B1.

Accordingly, the fixing jig A and the base substrate wafer 240 can be mutually kept in close contact with each other with the basis part 208 of the tack member 209 kept disposed in the tack recess A3.

In particular, the tack recess A3 is so formed that its bottom face A32 is flat and its depth is substantially equal to the thickness of the basis part 208 of the tack member 209, and therefore, by mutually keeping the fixing jig A and the base substrate wafer 240 in close contact with each other in the condition that the basis part 208 of the tack member 209 is disposed in the tack recess A3, the surface of the basis part 208 of the tack member 209 can be readily kept in contact with the base substrate wafer 240.

Further, the core part 207 of the tack member 209 extends from the surface of the basis part 208 of the tack member 209 in the direction substantially perpendicular to the surface thereof, and therefore, by keeping the surface of the basis part 208 of the tack member 209 in contact with the base substrate wafer 240, the posture of the tack member 209 can be so regulated that the axial line of the core part 207 of the tack member 209 can be parallel to the axial line of the through-holes 230 and 231.

In FIG. 53, the process sequence is the frit filling step (S235) followed by the nipping step (S236); however, contrary to this, the nipping step (S236) may be followed by the frit filling step (S235). In any process sequence, the same advantage and effect can be exhibited. Accordingly, the process sequence may be optionally changed or modified in any desired order.

The above completes the setting step.

Figure 62:
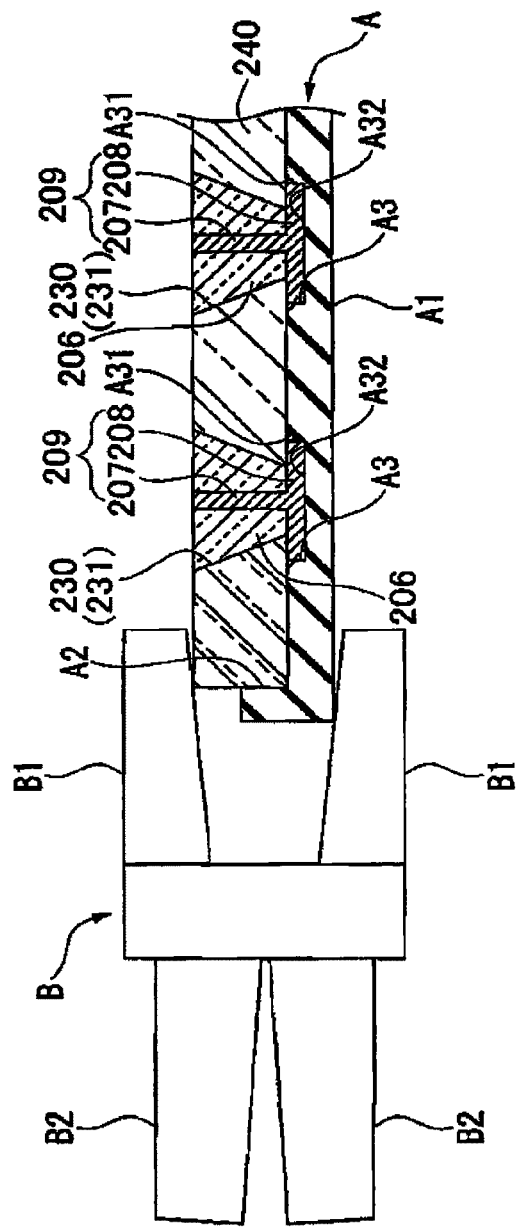
FIG. 62 is a view showing one step in manufacturing piezoelectric vibrators according to the flowchart shown in FIG. 53, and is a view showing the condition where, after the state shown in FIG. 61, the glass frit is fired.

Next, as shown in FIG. 62, a firing step is attained for heating and firing the glass frit 206 (S237). Accordingly, the through-holes 230 and 231, the tack member 209 and the glass frit 206 can be integrally fixed to each other.

In particular, since the firing is attained under the condition that the basis part 208 of the tack member 209 is sandwiched between the base substrate wafer 240 and the fixing jig A by the holding jig B that acts to mutually keep the fixing jig A and the base substrate wafer 240 in close contact with each other, the condition that the basis part 208 of the tack member 209 is surely sandwiched between the base substrate wafer 240 and the fixing jig A can be secured irrespective of the deformation of the base substrate wafer 240. In addition, since the holding jig B is disposed at the peripheral part of the base substrate wafer 240, the sandwiched condition is still kept even when the peripheral part of the base substrate wafer 240 is warped.

Accordingly, the firing is attained in the condition that the surface of the basis part 208 of the tack member 209 is kept in contact with the base substrate wafer 240, and the basis part 208 is fixed to the base substrate wafer 240 with no inclination.

In addition, the firing is attained in the condition that the axial line of the core part 207 of the tack member 209 is parallel to the axial line of the through-holes 230 and 231, and the fixation is attained with no inclination of the axial line of the core part 207 relative to the axial line of the through-holes 230 and 231. Accordingly, the space in the through-holes 230 and 231 is not non-uniformly partitioned by the core part 207. In other words, a cylindrical space is formed between the outer peripheral face of the core part 207 and the inner peripheral face of the through-holes 230 and 231, and any broad space is not formed locally in the through-holes 230 and 231. Accordingly, the glass frit 206 is not filled in a broad space, and depressions can be prevented from being formed in the surface of the glass frit 206 by firing, and hollows can also be prevented from being formed inside the glass frit 206.

The pasty glass frit 206 contains bubbles inside it, in an amount according to the volume of the glass fit 206. Though the amount of the bubbles is very small, in case where the glass frit 206 filled in a broad space is fired, then the bubbles inside the glass fit 206 may evaporate and the volume of the glass frit 206 is thereby reduced with the result that the surface of the hardened glass frit 206 may have fine depressions formed in the surface thereof, or even after firing, the bubbles may still remain inside the hardened glass frit 206 to thereby often form fine hollows partly inside it.

Figure 63:
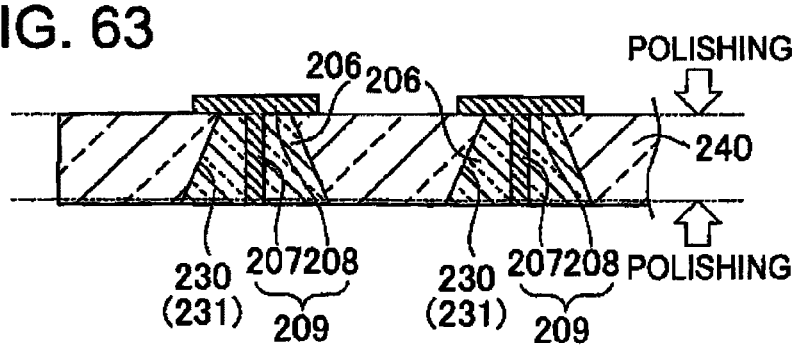
FIG. 63 is a view showing one step in manufacturing piezoelectric vibrators according to the flowchart shown in FIG. 53, and is a view showing the condition where, after the state shown in FIG. 62, the basis part of the tack member is polished.

After the firing step, the nipped condition kept by the holding jig B is released by making the pair of nip-release parts B2 closer to each other to thereby remove the holding jig B from the base substrate wafer 240; and thereafter, as shown in FIG. 63, a polishing step is attained for polishing and removing the basis part 208 of the tack member 209 and polishing the two faces of the base substrate wafer 240 to a predetermined thickness (S238). The polishing step in this embodiment comprises a first polishing step of removing the basis part 208 on the upper face side of the base substrate wafer 240, and a second polishing step of removing the glass frit 206 having adhered to the surface of the core part 207 in filling the glass frit 206 into the through-holes 230 and 231, from the lower face side of the base substrate wafer 240. As a result, the core part 207 serves as through-holes 232 and 233. The through-holes 232 and 233 are formed of the electroconductive core part 207 and secure stable electric conductivity.

In case where the glass frit 206 does not adhere to the surface of the core part 207, then the second polishing step may be omitted.

The above completes the through-electrode forming step.

Figure 64:
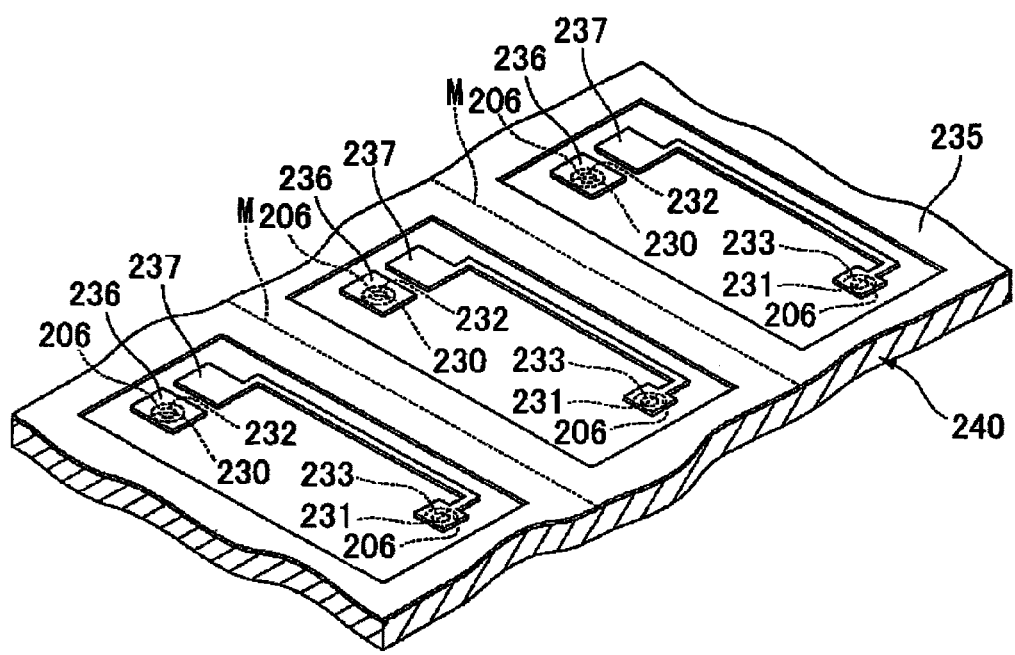
FIG. 64 is a view showing one step in manufacturing piezoelectric vibrators according to the flowchart shown in FIG. 53, and is a view showing the condition where, after the state shown in FIG. 63, bonding films and routing electrodes are patterned on the upper face of the base substrate wafer.
Figure 65:
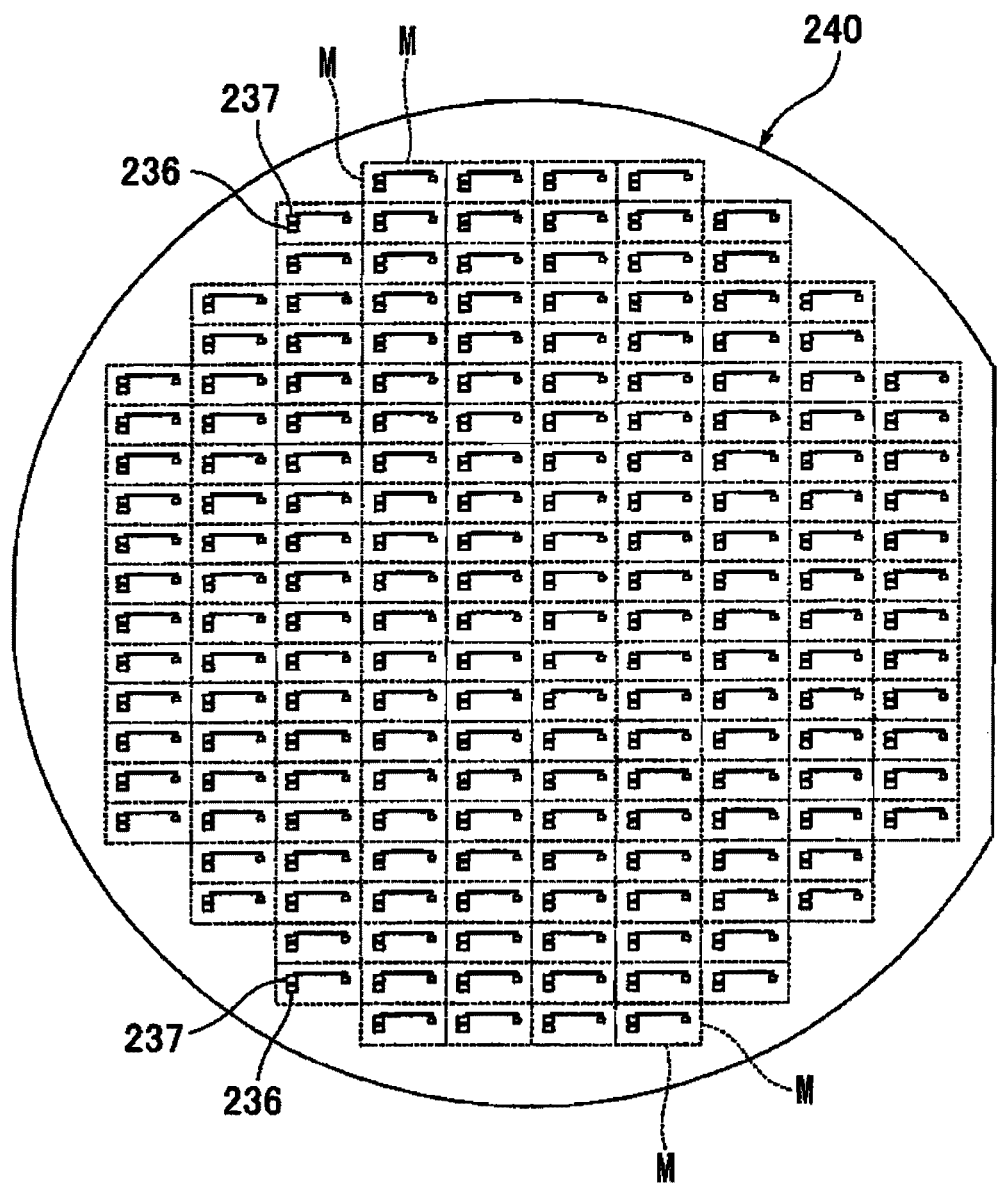
FIG. 65 is an entire view of the base substrate wafer in the state shown in FIG. 64.

Next, a bonding film forming step is attained for forming a bonding film 235 by patterning an electroconductive material on the upper face of the base substrate wafer 240, as shown in FIG. 64 and FIG. 65 (S239), and a routing electrode forming step is attained for forming a plurality of routing electrodes 236 and 237 connected electrically with the pair of through-electrodes 232 and 233, respectively (S240). The dotted line M shown in FIG. 64 and FIG. 65 means a section line for cutting in the subsequent cutting step.

At this point of time, the second wafer forming step is finished.

In FIG. 53, the process sequence is the bonding film forming step (S239) followed by the routing electrode forming step (S240); however, contrary to this, the routing electrode forming step (S240) may be followed by the bonding film forming step (S239), or the two steps may be attained at the same time. In any process sequence, the same advantage and effect can be exhibited. Accordingly, the process sequence may be optionally changed or modified in any desired order.

Next, a mounting step is attained for bonding the formed, plural piezoelectric vibration members 204 onto the upper face of the base substrate wafer 240 via the routing electrodes 236 and 237 (S250). First, a bump P of gold or the like is formed on the pair of routing electrodes 236 and 237. After the base 212 of the piezoelectric vibration member 204 is put on the bump P, the piezoelectric vibration member 204 is pressed against the bump P while the bump P is heated at a predetermined temperature (for example, at 300° C.). Accordingly, the piezoelectric vibration member 204 is mechanically supported by the bump P, and the mount electrodes 216 and 217 are electrically connected with the routing electrodes 236 and 237. Therefore, at this time, the pair of excitation electrodes 215 of the piezoelectric vibration member 204 are electrically connected to the pair of through-electrodes 232 and 233, respectively.

In particular, the piezoelectric vibration member 204 is bump-bonded, and therefore it is supported as spaced above from the upper face of the base substrate wafer 240. Since the melting point of the glass frit 206 is higher than the predetermined temperature for heating in the mounting step, the two do not melt, and the through-holes 230 and 231 are kept surely blocked up.

After the mounting of the piezoelectric vibration member 204 is finished, an overlaying step is attained for overlaying the base substrate wafer 240 and the lid substrate wafer 250 (S260). Concretely, the two wafers 240 and 250 are aligned in a correct position based on a reference mark or the like (not shown) as an index. Accordingly, the mounted piezoelectric vibration member 204 is kept housed in the cavity C surrounded by the recess 203a formed in the base substrate wafer 240 and the two wafers 240 and 250.

Figure 66:
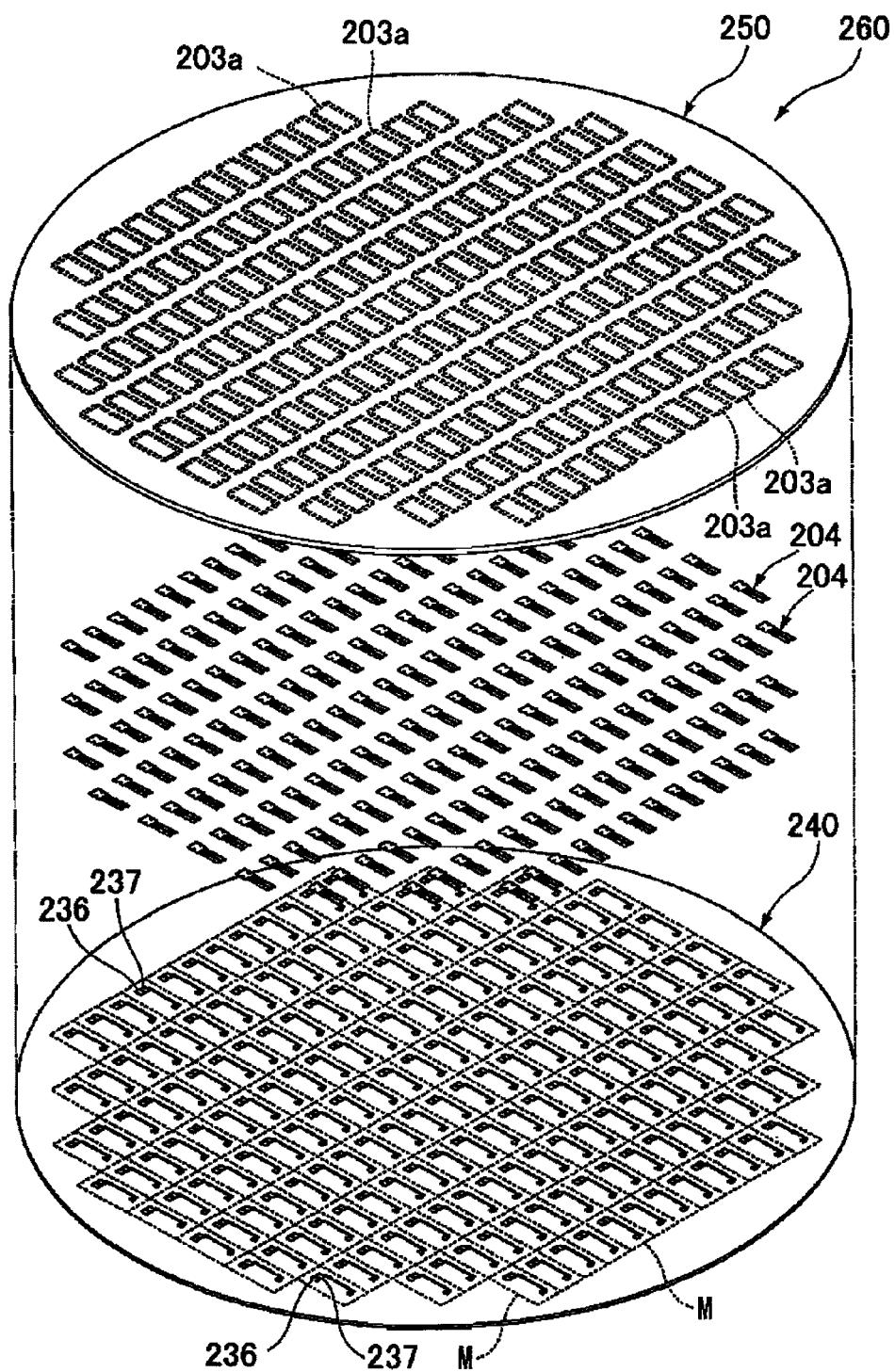
FIG. 66 is a view showing one step in manufacturing piezoelectric vibrators according to the flowchart shown in FIG. 53, and is a perspective exploded view of the wafer body in which the base substrate wafer and the lid substrate wafer are anodically-bonded and the piezoelectric vibration member is housed in the cavity.

After the overlaying step, a bonding step is attained for anodically bonding the overlaid two wafers 240 and 250 by putting them in an anodic bonding apparatus (not shown) and applying a predetermined voltage thereto in a predetermined temperature atmosphere (S270). Concretely, a predetermined voltage is applied between the bonding film 235 and the lid substrate wafer 250. With that, there occurs electrochemical reaction in the interface between the bonding film 235 and the lid substrate wafer 250, whereby the two firmly stick to each other to attain anodic bonding therebetween. Accordingly, the piezoelectric vibration member 204 can be sealed up in the cavity C, and a wafer body 260 as shown in FIG. 66 can be obtained in which the base substrate wafer 240 and the lid substrate wafer 250 are bonded to each other. FIG. 66 illustrates an exploded state of the wafer body 260 for facilitating the understating of the view, in which the illustrative constitution of from the base substrate wafer 240 to the bonding film 235 is omitted. The dotted line M shown in FIG. 66 means a section line for cutting in the subsequent cutting step.

In anodic bonding, the through-holes 230 and 231 formed in the base substrate wafer 240 are completely blocked up by the through-electrodes 232 and 233 and the glass frit 206, and therefore, the airtightness inside the cavity C is not broken by the through-holes 230 and 231. In particular, the through-electrodes 232 and 233 and the glass frit 206 are integrally fixed to each other by firing and these are firmly fixed to the through-holes 230 and 231, and therefore the airtightness inside the cavity C can be surely secured.

After the above-mentioned anodic bonding is finished, an external electrode forming step is attained for forming a plurality of pairs of external electrodes 238 and 239 electrically connected to the pairs of through-electrodes 232 and 233, respectively, by patterning an electroconductive material on the lower face of the base substrate wafer 240 (S280). As a result of this step, the piezoelectric vibration member 204 sealed up in the cavity C can be operated by utilizing the external electrodes 238 and 239.

Next, a fine-tuning step is attained for finely tuning the frequency of the individual piezoelectric vibration members 204 sealed up in the cavities C in the state of the wafer body 260 to make them fall within a predetermined range (S290). Concretely, a voltage is applied to the pair of external electrodes 238 and 239 formed on the lower face of the base substrate wafer 240 to thereby vibrate the piezoelectric vibration member 204. Then, with monitoring the frequency, this is irradiated with a laser light from the outside through the lid substrate wafer 250, to thereby evaporate the fine-tuning film 221b of the weight metal film 221. As a result, the weight of the top side of the pair of vibration arms 210 and 211 changes, and therefore the frequency of the piezoelectric vibration member 204 can be finely tuned so as to fall within a predetermined range of a nominal frequency.

After the fine-tuning of frequency is finished, a cutting step is attained for cutting the bonded wafer body 260 to thereby shred it into the individual pieces along the section line M shown in FIG. 66 (S300). As a result, a plurality of two-layer structure-type, surface-mount piezoelectric vibrators 201 as in FIG. 41 can be manufactured all at once, in which the piezoelectric vibration member 204 is sealed up in the cavity C formed between the base substrate 202 and the lid substrate 203 bonded to each other.

The process sequence may be in an order of the cutting step (S300) of shredding into the individual piezoelectric vibrators 201 followed by the fine-tuning step (S290). However, as so mentioned in the above, in case where the fine-tuning step (S290) is attained previously, then the tuning can be effected in the state of the wafer body 260 and therefore a plurality of piezoelectric vibrators 201 can be finely tuned more efficiently. Accordingly, it is favorable as increasing the throughput.

After this, the internal electric characteristics are inspected (S310). Specifically, the piezoelectric vibration member 204 is checked for the resonance frequency, the resonance resistance, the drive level characteristic (excitation power dependence of the resonance frequency and the resonance resistance), etc. In addition, it is checked also for the insulation resistance characteristic, etc. Finally, the piezoelectric vibrator 201 is checked for the appearance thereof in point of the dimension and the quality, etc. With that, the manufacture of the piezoelectric vibrator 201 is finished.

In particular, since the basis part 208 of the tack member 209 is fixed to the base substrate wafer 240 with no inclination, the contact area between the base substrate wafer 240 and the tack member 209 is broad, and when the basis part 208 is removed by polishing, the force acting on the base substrate wafer 240 is not locally concentrated. Therefore, the base substrate wafer 240 is prevented from cracking.

In addition, since the formation of a depressed part or a hollow in the glass frit 206 is inhibited, the bumps that may remain on the surface of the glass frit 206 after the polishing step may be extremely reduced, and the glass frit 206 can be made in a substantially flat condition relative to the base substrate wafer 240. Accordingly, the thickness of the routing electrodes 236 and 237 to be formed on the surface of the glass frit 206 can be prevented from fluctuating to be locally thinned, and the reliability of the routing electrodes 236 and 237 can be enhanced. Therefore, stable electric connection between the piezoelectric vibration member 204 and the through-electrodes 232 and 233 can be secured, and more stable electric connection between the piezoelectric vibration member 204 and the external electrodes 238 and 239 can be secured. As a result, the operation performance reliability of the devices can be enhanced and the quality thereof can be increased.

In addition, since the axial line of the core part 207 of the tack member 209 is not inclined relative to the axial line of the through-holes 230 and 231, the necessary thickness of the base substrate wafer 240 can be secured even after the core part 207 is exposed out via the polishing step.

Further, the airtightness inside the cavity C can be surely kept, and therefore the quality of the piezoelectric vibrator 201 can be increased.

According to the manufacturing method of this embodiment, a plurality of the above-mentioned piezoelectric vibrators 201 can be manufacture all at once, and therefore the manufacturing cost can be reduced.

In this embodiment, as the base substrate wafer 240 (base substrate 202), the glass frit 206 and the tack member 209 (through-electrodes 232 and 233), those having a substantially same thermal expansion coefficient are used; however, any others having a different thermal expansion coefficient may be used.

In this embodiment, the core part inserting step is followed by the fixing jig disposing step; however, the two steps may be attained at the same time by fitting the fixing jig A to the base substrate wafer 240 in the condition that the basis part 208 of the tack member 209 is disposed in the tack recess A3 of the fixing jig A.

In this embodiment, the fixing jig A is used in which the open end A31 of the tack recess A3 is tapered; however, a different one may also be used in which the open end A31 has a tapered cross section. In this, the positioning recess A2 is formed as the positioning part for positioning the base substrate wafer 240 relative to the fixing jig A; however, for example, a positioning pin may be used for the positioning part.

In this embodiment, as the holding jig B, one having a pair of nipping parts B1 is used; however, for example, the holding jig may be so designed that the fixing jig A and the base substrate wafer 240 are put on the basis part and the two are pressed by pushing them from the upper side thereof.

The shape of the tack member 209 is not limited to those illustrated in this embodiment; but, for example, it may have a rectangular basis part like the tack members 9 and 109 shown in the first embodiment and the second embodiment. The length of the core part 207 and the shape of the top thereof are not also limited to those shown in this embodiment; however, preferably, its length is substantially equal to or smaller than the thickness of the base substrate wafer 240 before the polishing step.

Fourth Embodiment

The fourth embodiment of the piezoelectric vibrator manufacturing method and the piezoelectric vibrator manufactured according to the manufacturing method of the invention is described below with reference to FIG. 67 to FIG. 87.

The piezoelectric vibrator 401 of this embodiment is, as shown in FIG. 67 to FIG. 71, a surface-mount piezoelectric vibrator that is formed to have a two-layer laminate boxy shape composed of a base substrate 402 and a lid substrate 403, in which a piezoelectric vibration member 404 is housed in the cavity C inside it.

Figure 71:
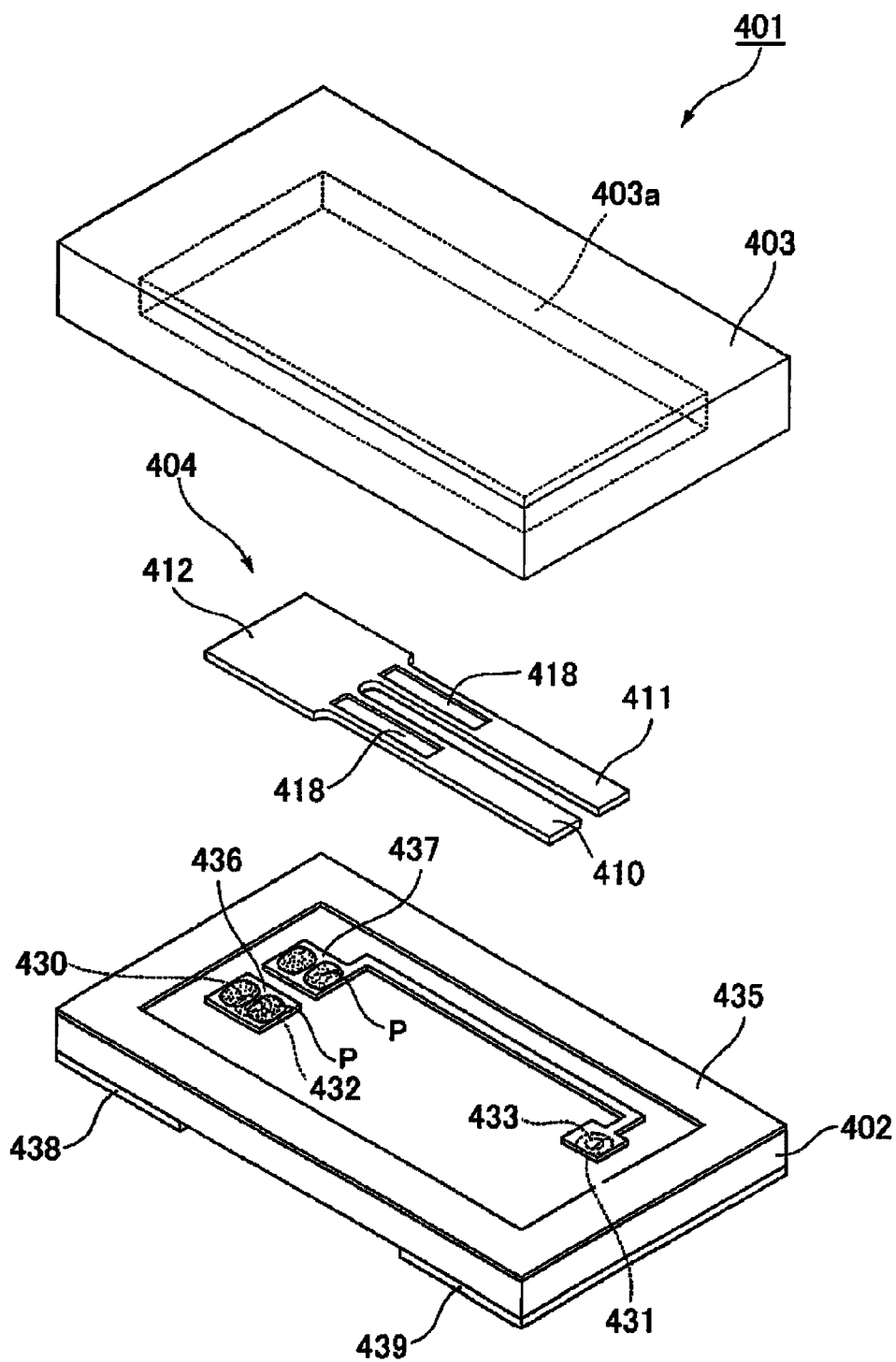
FIG. 71 is a perspective exploded view of the piezoelectric vibrator shown in FIG. 67.

The thickness of the base substrate 402 and the lid substrate 403 is, for example, from 150 μm to 200 μm each. In FIG. 71, an excitation electrode 415, routing electrodes 419 and 420, mount electrodes 416 and 417, and a weight metal film 421 to be mentioned below are omitted for facilitating the understating of the view.

Figure 72:
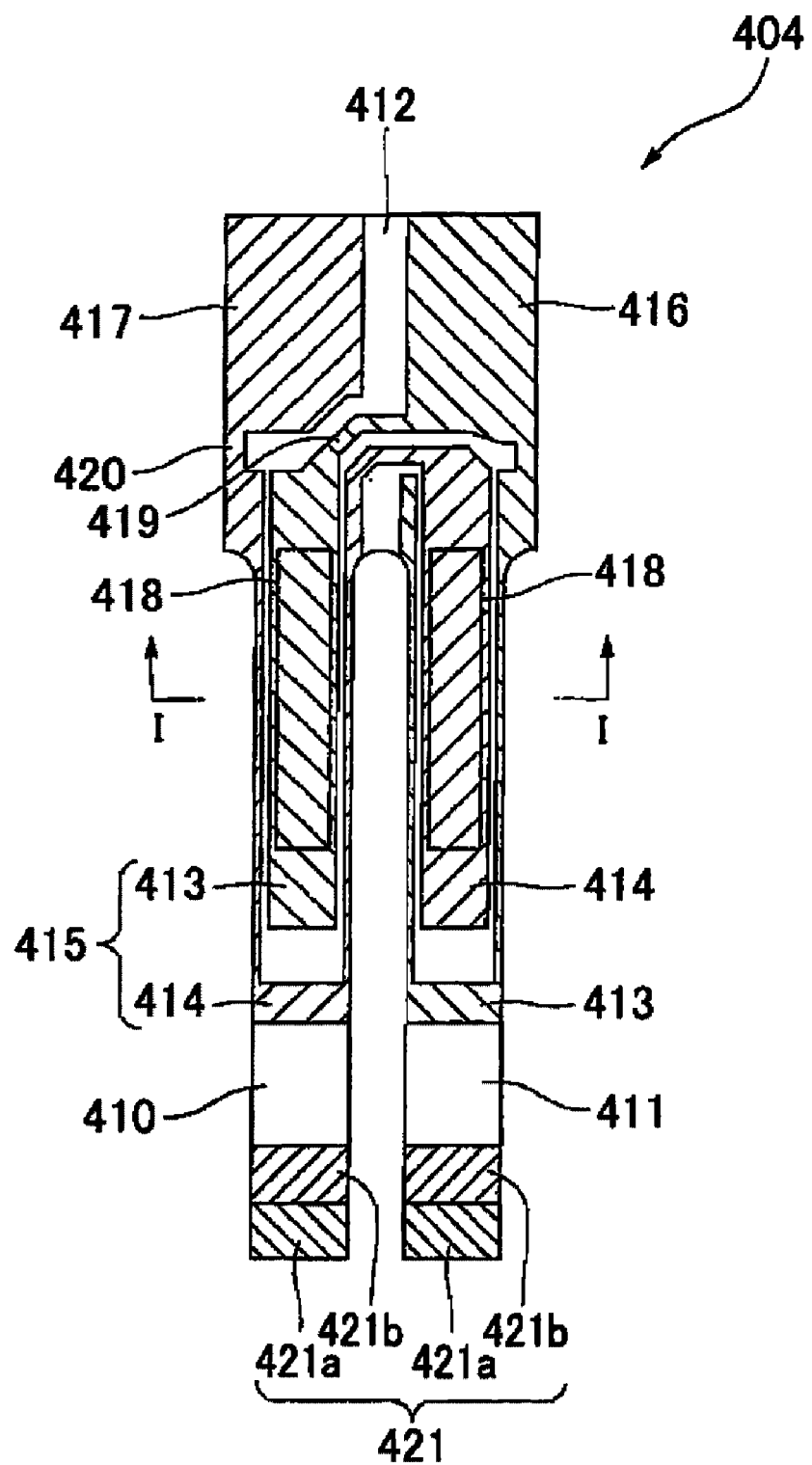
FIG. 72 is a top view of the piezoelectric vibration member constituting the piezoelectric vibrator shown in FIG. 67.
Figure 73:
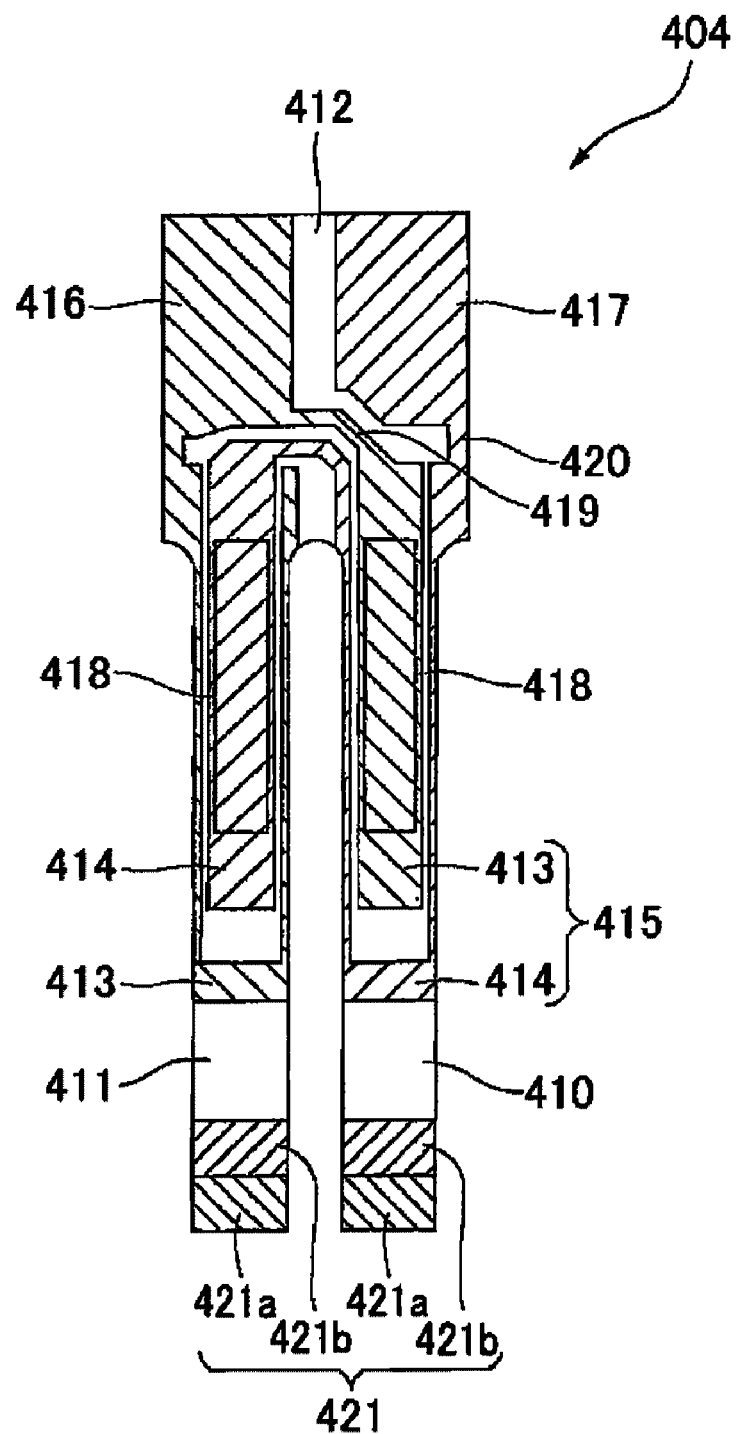
FIG. 73 is a bottom view of the piezoelectric vibration member shown in FIG. 72.
Figure 74:
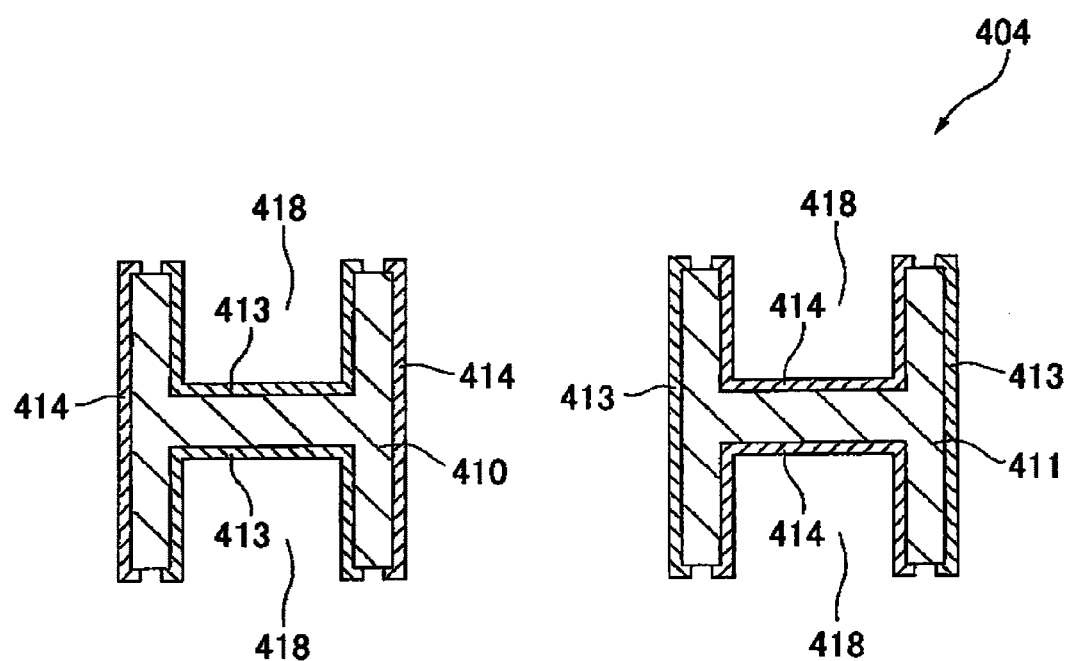
FIG. 74 is a cross-sectional outline view of I-I shown in FIG. 72.

As shown in FIG. 72 to FIG. 74, the piezoelectric vibration member 404 is a tuning fork-like vibration member formed of a piezoelectric material such as crystal, lithium tantalate, lithium niobate or the like, and this vibrates when a predetermined voltage is applied thereto.

The piezoelectric vibration member 404 has a pair of vibration arms 410 and 411 disposed in parallel to each other, a base 412 to integrally fix the base side of the pair of vibration arms 410 and 411, an excitation electrode 415 composed of a first excitation electrode 413 and a second excitation electrode 414 for vibrating the pair of the vibration arms 410 and 411, as formed on the outer surface of the pair of the vibration arms 410 and 411, and mount electrodes 416 and 417 electrically connected with the first excitation electrode 413 and the second excitation electrode 414.

The piezoelectric vibration member 404 in this embodiment comprises, on both the two main faces of the pair of vibration arms 410 and 411, a groove 418 formed along the longitudinal direction of the vibration arms 410 and 411. The groove 418 is formed from the base side to around the intermediate part of the vibration arms 410 and 411.

The excitation electrode 415 composed of the first excitation electrode 413 and the second excitation electrode 414 is an electrode to vibrate the pair of vibration arms 410 and 411 in the direction in which they come near to and get away from each other, at a predetermined resonance frequency, and this is patterned on the outer surface of the pair of vibration arms 410 and 411, as electrically insulated from each other. Concretely, as shown in FIG. 74, the first excitation electrode 413 is formed mainly on the groove 418 of one vibration arm 410 and on the two side faces of the other vibration arm 411, while the second excitation electrode 414 is formed mainly on the two side faces of one vibration arm 410 and on the groove 418 of the other vibration arm 411.

The first excitation electrode 413 and the second excitation electrode 414 are electrically connected to the mount electrodes 416 and 417 via the routing electrodes 419 and 420, respectively, on the two main faces of the base 412, as shown in FIG. 72 and FIG. 73. The piezoelectric vibration member 404 is given a voltage via the mount electrodes 416 and 417.

The above-mentioned excitation electrode 415, mount electrodes 416 and 417 and routing electrodes 419 and 420 are, for example, formed of a coating film of an electroconductive film of chromium (Cr), nickel (Ni), aluminium (Al), titanium (Ti) or the like.

The top of the pair of vibration arms 410 and 411 is coated with a weight metal film 421 for tuning the vibration condition of the arms themselves within a predetermined frequency range (frequency tuning). The weight metal film 421 is divided into two, a rough-tuning film 421a for use in roughly tuning the frequency and a fine-tuning film 421b for use in finely tuning it. With these rough-tuning film 421a and fine-tuning film 421b, the frequency is tuned, whereby the frequency of the pair of vibration arms 410 and 411 can be controlled to fall within a range of the nominal frequency of the device.

Figure 69:
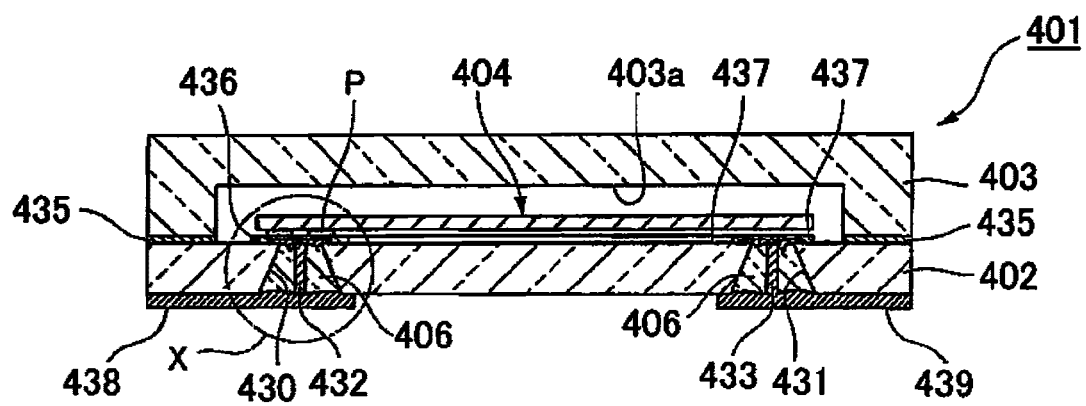
FIG. 69 is a cross-sectional view of the piezoelectric vibrator cut along the line H-H in FIG. 68.
Figure 70:
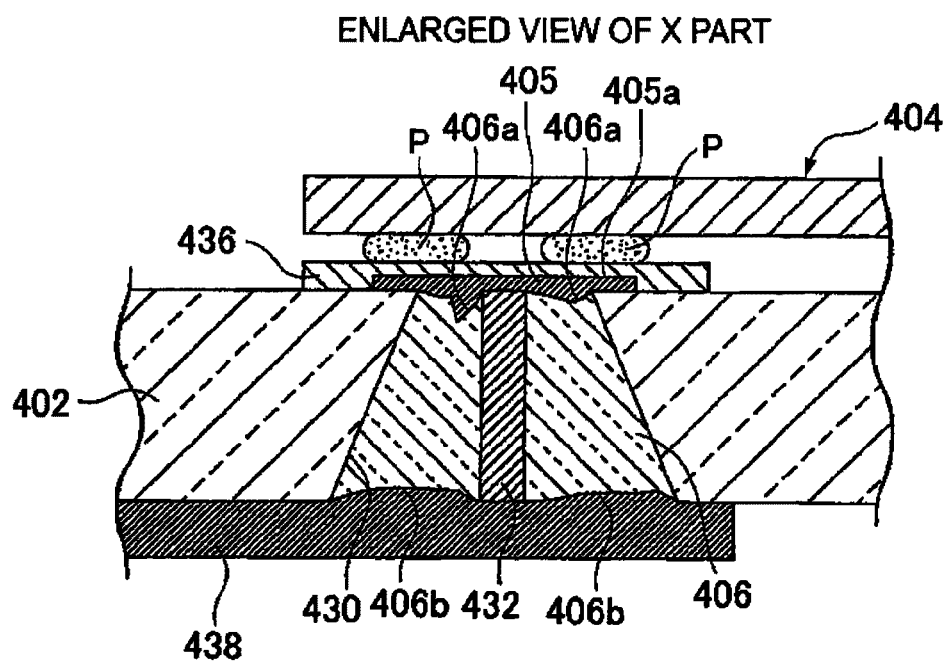
FIG. 70 is an enlarged view of the part X shown in FIG. 69.

The thus-constituted piezoelectric vibration member 404 is, as shown in FIG. 69 to FIG. 71, bump-bonded to the upper face of the base substrate 402 with a bump P of gold or the like. Precisely, on the two bumps P formed on the routing electrodes 436 and 437 to be mentioned below, as patterned on the upper face of the base substrate 402, a pair of mount electrodes 416 and 417 are bump-bonded as kept in contact with each other. Accordingly, the piezoelectric vibration member 404 is supported as spaced above from the upper face of the base substrate 402, and the mount electrodes 416 and 417 are electrically connected to the routing electrodes 436 and 437, respectively.

Figure 67:
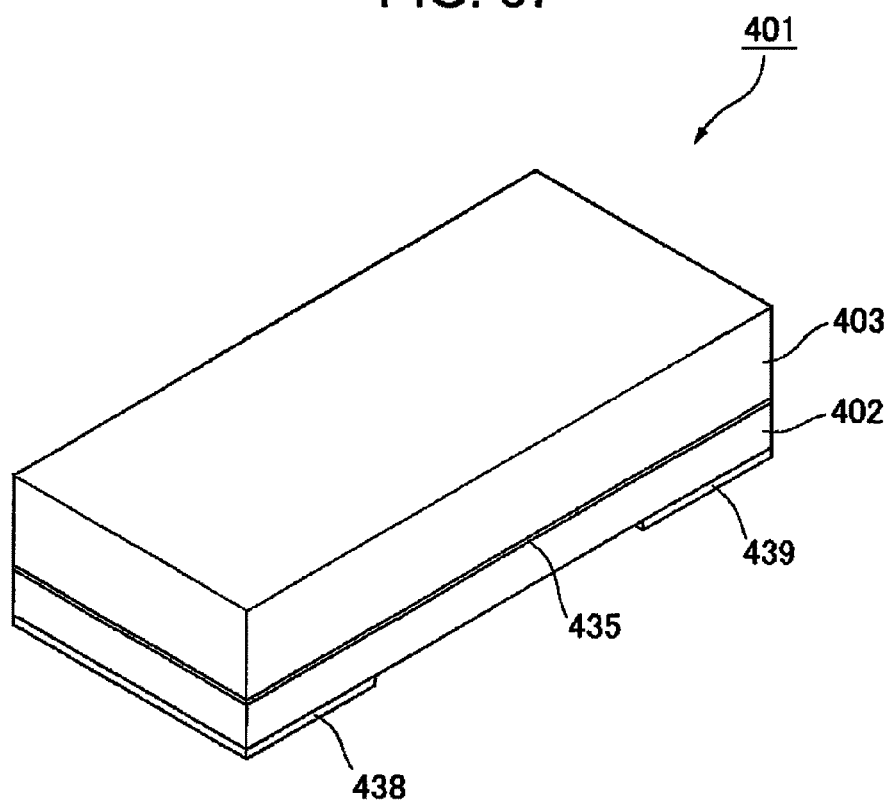
FIG. 67 is a perspective outline view showing the fourth embodiment of the piezoelectric vibrator of the invention.
Figure 68:
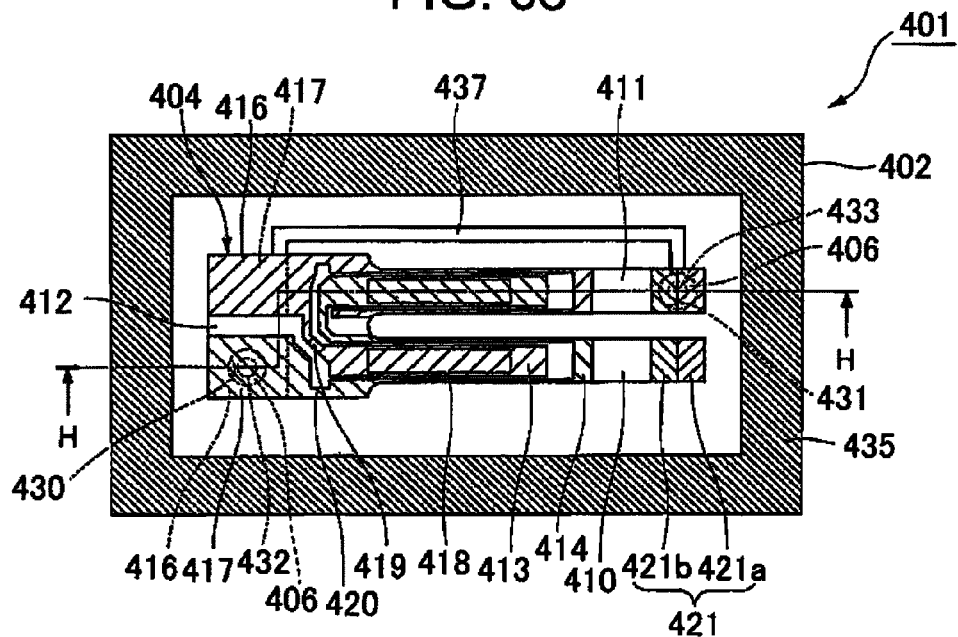
FIG. 68 is an internal configuration view of the piezoelectric vibrator shown in FIG. 67, and is a top view of the piezoelectric vibrator from which the lid substrate was removed.

The lid substrate 403 is a transparent insulating substrate formed of a glass material, for example, soda lime glass; and as shown in FIG. 67, FIG. 69 and FIG. 71, this is shaped to be tabular. On the bonding face side to which the base substrate 402 is bonded, formed is a rectangular recess 403a in which the piezoelectric vibration member 404 is housed. The recess 403a is a cavity recess to be a cavity C to house the piezoelectric vibration member 404 therein when the two substrates 402 and 403 are overlaid. The lid substrate 403 is anodically bonded to the base substrate 402 with the recess 403a kept facing the side of the base substrate 402.

The base substrate 402 is, like the lid substrate 403, a transparent insulating substrate formed of a glass substrate, for example, soda lime glass; and as shown in FIG. 67 to FIG. 71, this is formed to be tabular and have a size capable of being overlaid on the lid substrate 403.

The base substrate 402 is formed to have a pair of through-holes 430 and 431 running through the base substrate 402 in the vertical direction. The pair of through-holes 430 and 431 are so formed as to be housed inside the cavity C. More precisely, the through-holes 430 and 431 in this embodiment are so formed that one through-hole 430 is positioned on the side of the base 412 of the mounted piezoelectric vibration member 404 and the other through-hole 431 is positioned on the top side of the vibration arms 410 and 411. In this embodiment, a tapered through-hole of which the diameter of the cross section gradually increases to the lower face of the base substrate 402 is described as one example; but not limited to this case, the through-hole may also be a straight through-hole that runs straightly through the base substrate 402. Anyhow, the through-hole may be any one that runs through the base substrate 402.

In the pair of through-holes 430 and 431, disposed are a pair of through-electrodes 432 and 433 that are formed to run through the base substrate 402, and a glass frit 406 that fills up the space between the inner peripheral wall of the through-holes 430 and 431 and the through-electrodes 432 and 433.

These through-electrodes 432 and 433 and the glass frit 406 play a role of completely blocking up the through-holes 430 and 431 and keeping the airtightness inside the cavity C, and electrically connecting the external electrodes 438 and 439 with the routing electrodes 436 and 437 as described below.

The through-electrodes 432 and 433 in this embodiment are electroconductive core members formed of a metal material to be columnar, as shown in FIG. 69 and FIG. 70, and these are formed to have two flat ends and a thickness substantially equal to the thickness of the base substrate 402. The through-electrodes 432 and 433 are firmly fixed to the glass frit 406 through firing of the glass frit 406. The through-electrodes 432 and 433 are formed of, for example, Kovar, Dumet wire, Fe—Ni or the like, of which the thermal expansion coefficient is substantially equal to that of the glass frit 406.

The glass frit 406 is fired as implanted in the through-holes 430 and 431, and it firmly sticks to the inner peripheral wall of the through-holes 430 and 431. The melting point of the glass frit 406 is, for example, around 430° C. The hardness of the glass frit 406 is lower than the hardness of the glass material to form the base substrate 402 and the lid substrate 403. Further, the thermal expansion coefficient of the glass frit 406 is substantially equal to that of the base substrate 402 and the lid substrate 403.

In the upper face and the lower face of the glass frit 406, depressions 406a and 406b are formed, respectively, as shown in FIG. 70. The depressions 406a and 406b are formed as follows: In the process of manufacturing the piezoelectric vibrator 401, for example, in firing the glass fit 406, the glass frit 406 is hardened to surround the bubbles remaining between the basis part 408 of the tack member 409 to be mentioned below and the glass frit 406 or in the vicinity of the surface of the glass frit 406, and is exposed out of the surface thereof.

Regarding the depth in the vertical direction of the depressions 406a and 406b is, for example, the deepest part is from 6000 to 10000 angstroms. In the illustrated case, the depressions 406a and 406b are shown large as compared with the other constitutive members, for facilitating the understanding of the view.

The depression 406a formed in the upper face of the glass frit 406 is implanted with an implant member 405 to form a flat face 405a on the upper face side of the glass frit 406.

The implant member 405 is formed of an electroconductive material of which the hardness and the thermal expansion coefficient are substantially equal to those of the through-electrodes 432 and 433, for example, Kovar, Fe—Ni or the like. The melting point of the implant member 405 is, for example, not lower than 350° C. The implant member 405 is so disposed that it covers the glass frit 406 that blocks up the upper face of the through-holes 430 and 431 and that of the through-electrodes 432 and 433, and its upper face is a flat face 405a. In other words, the implant member 405 is electrically connected with the through-electrodes 432 and 433, and the flat face 405a is formed to cover the entire upper face of the glass frit 406 and that of the through-electrodes 432 and 433 and is electrically connected with the through-electrodes 432 and 433.

On the upper face side of the base substrate 402 (the bonding face side thereof to which the lid substrate 403 is bonded), an anodic-bonding film 435 and a pair of routing electrodes 436 and 437 are patterned with an electroconductive material (for example, aluminium), as shown in FIG. 67 to FIG. 71. Of those, the bonding film 435 is formed along the peripheral edge of the base substrate 402 so as to surround the periphery of the recess 403a formed in the lid substrate 403.

The routing electrodes 436 and 437 are two-layer electrode films composed of, for example, a lower layer of chromium and an upper layer of gold; and their thickness is, for example, 2000 angstroms. The pair of routing electrodes 436 and 437 are so patterned as to electrically connect one through-electrode 432 of the pair of through-electrodes 432 and 433, with one mount electrode 416 of the piezoelectric vibration member 404, and to electrically connect the other through-electrode 433 with the other mount electrode 417 of the piezoelectric vibration member 404. More precisely, one routing electrode 436 is formed just above one through-electrode 432 so as to be positioned just below the base 412 of the piezoelectric vibration member 404; and the other routing electrode 437 is so formed as to be positioned just above the other through-electrode 433 after routed from the position adjacent to one routing electrode 436 to the top of the vibration arms 410 and 411 along the vibration arms 410 and 411. As shown in FIG. 69 and FIG. 70, the routing electrodes 436 and 437 are so formed that the part thereof positioned just above the corresponding through-electrodes 432 and 433 covers the corresponding implant member 405.

As shown in FIG. 67 to FIG. 71, a bump P is formed on the pair of routing electrodes 436 and 437, and via the bump P, the piezoelectric vibration member 404 is mounted. Accordingly, one mount electrode 416 of the piezoelectric vibration member 404 is electrically connected to one through-electrode 432 via one routing electrode 436, and the other mount electrode 417 is electrically connected to the other through-electrode 433 via the other routing electrode 437.

On the lower face of the base substrate 402, formed are external electrodes 438 and 439 to be electrically connected to the pair of through-electrodes 432 and 433, respectively, as shown in FIG. 67, FIG. 69 to FIG. 71. In other words, one external electrode 438 is electrically connected to the first excitation electrode 413 of the piezoelectric vibration member 404 via one through-electrode 432 and one routing electrode 436. The other external electrode 439 is electrically connected to the second excitation electrode 414 of the piezoelectric vibration member 404 via the other through-electrode 433 and the other routing electrode 437. The external electrodes 438 and 439 are so formed as to fill up the depression 406b and have a substantially flat lower face. The external electrodes 438 and 439 are formed on the surface of the piezoelectric vibrator 401, and therefore, they may be sufficiently thick. Accordingly, the external electrodes 438 and 439 are not formed to be extremely thin as influenced by the depression 406b.

To operate the thus-constituted piezoelectric vibrator 401, a predetermined driving voltage is applied to the external electrodes 438 and 439 formed on the base substrate 402. Accordingly, a current is applied to the excitation electrode 415 composed of the first excitation electrode 413 and the second excitation electrode 414 of the piezoelectric vibration member 404, whereby the pair of vibration arms 410 and 411 are vibrated at a predetermined frequency in the direction in which they come near to and get away from each other. Based on the vibration of the pair of vibration arms 410 and 411, the vibrator can be used as a time source, a timing source of control signals or the like, a reference signal source, etc.

Figure 75:
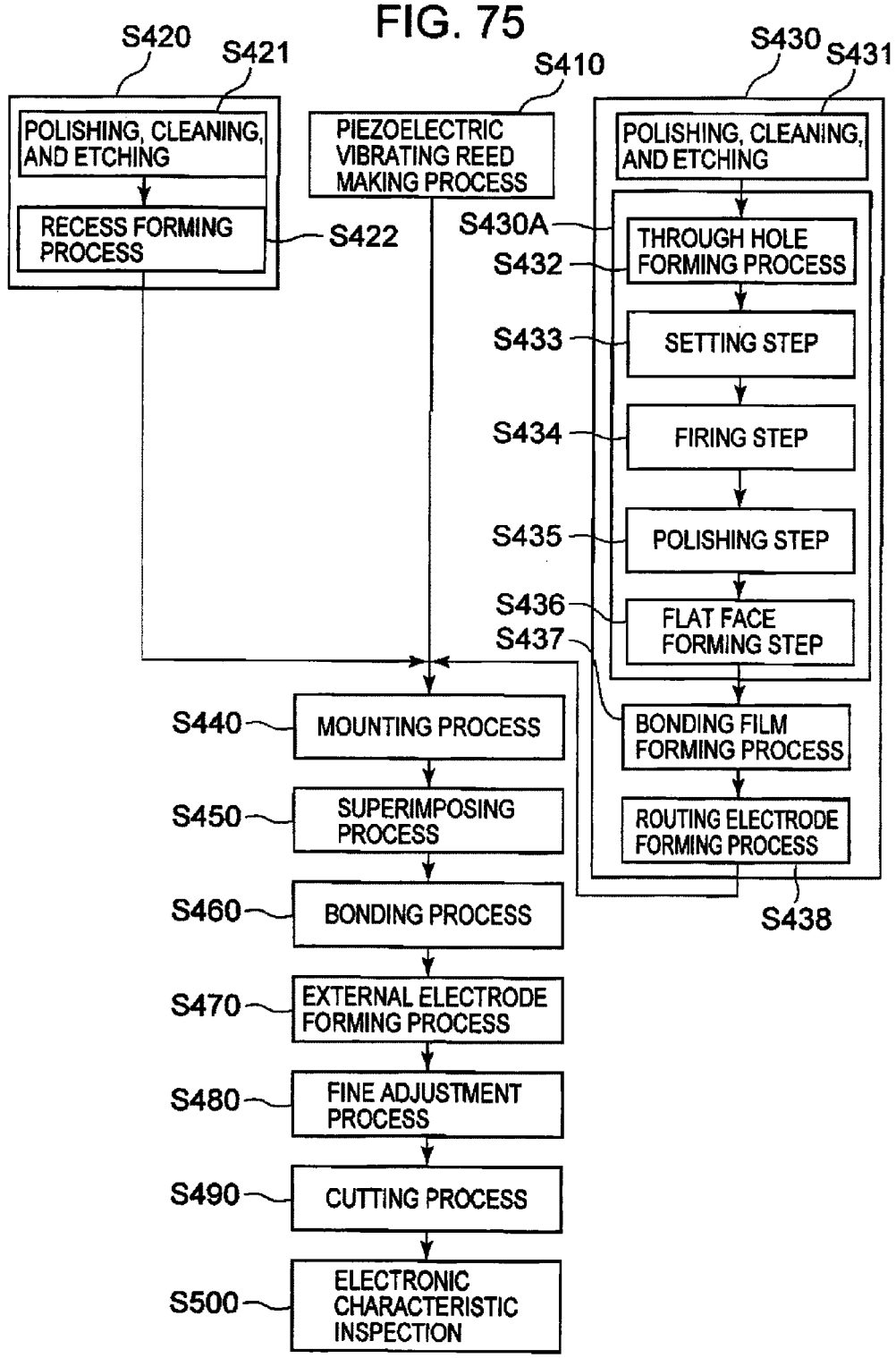
FIG. 75 is a flowchart showing the flow in manufacturing the piezoelectric vibrator shown in FIG. 67.

Next, described is a method for manufacturing a plurality of piezoelectric vibrators 401 mentioned above all at once, by utilizing the base substrate wafer 440 and the lid substrate wafer 450, with reference to the flowchart shown in FIG. 75.

First, a piezoelectric vibration member forming step is attained to form the piezoelectric vibration member 404 shown in FIG. 72 to FIG. 74 (S410). Concretely, first, a rough Lambertian quartz is sliced at a predetermined angle to give a wafer having a predetermined thickness. Next, the wafer is roughly worked by lapping, then the work-affected layer is removed by etching, and thereafter this is mirror-finished by polishing or the like to give a wafer having a predetermined thickness. Next, the wafer is suitably processed by washing or the like, and then the wafer is patterned into an external shape of the piezoelectric vibration member 404 through photolithography, and a metal film is formed and patterned to thereby form the excitation electrode 415, the routing electrodes 419 and 420, the mount electrodes 416 and 417, and the weight metal film 421. Accordingly, a plurality of piezoelectric vibration members 404 are formed.

After the piezoelectric vibration members 404 are formed, they are processed for rough-tuning of resonance frequency. This is attained by irradiating the rough-tuning film 421a of the weight metal film 421 with a laser light to partly evaporate it, thereby changing the weight thereof. Regarding the fine tuning for resonance frequency to a higher degree of resolution, the members are processed after mounting. This is described later.

Figure 76:
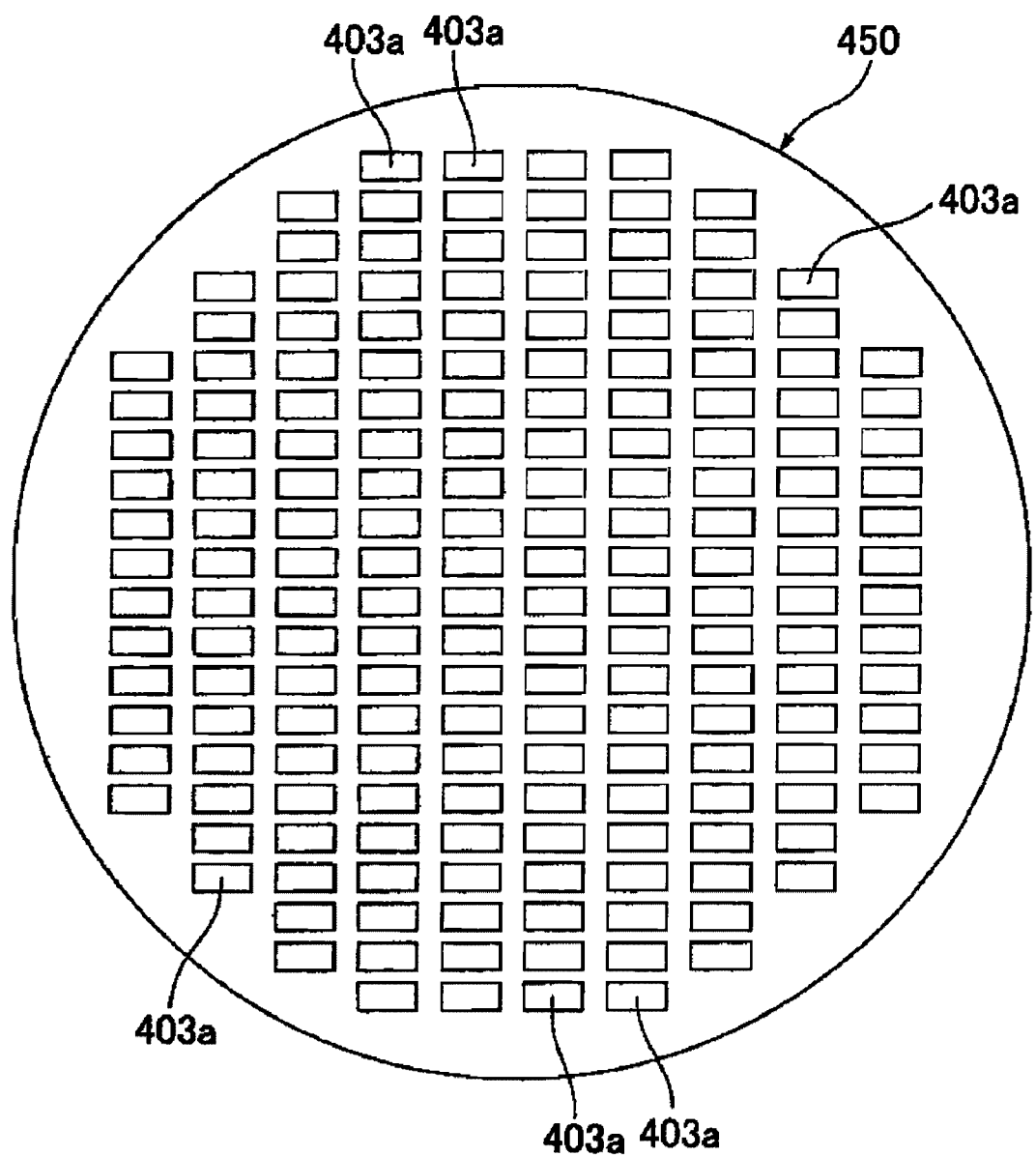
FIG. 76 is a view showing one step in manufacturing piezoelectric vibrators according to the flowchart shown in FIG. 75, and is a view showing the condition where a plurality of recesses are formed in a lid substrate wafer which is an original to be a lid substrate.

Next, a first wafer forming step is attained for forming a lid substrate wafer 450 to be the lid substrate 403 later up to the state just before anodic bonding (S420). First, soda lime glass is polished to a predetermined thickness, then washed, and the work-affected layer of the outermost surface is removed by etching or the like to give a disc-like lid substrate wafer 450 (S421). Next, as shown in FIG. 76, a recess forming step is attained for forming a plurality of cavity recesses 403a in the line direction by etching or the like in the bonding face of the lid substrate wafer 450 (S422). At this stage, the first wafer forming step is finished.

Next, at the same time or in a timing of before or after the above step, a second wafer forming step is attained for forming a base substrate wafer 440 to be the base substrate 402 later up to the state just before anodic bonding (S430). First, soda lime glass is polished to a predetermined thickness, then washed, and the work-affected layer of the outermost surface is removed by etching or the like to give a disc-like base substrate wafer 440 (S431). Next, a through-electrode forming step is attained for forming a pair of through-electrodes 432 and 433 in the base substrate wafer 440 (S430A). Here, the through-electrode forming step is described in detail.

Figure 77:
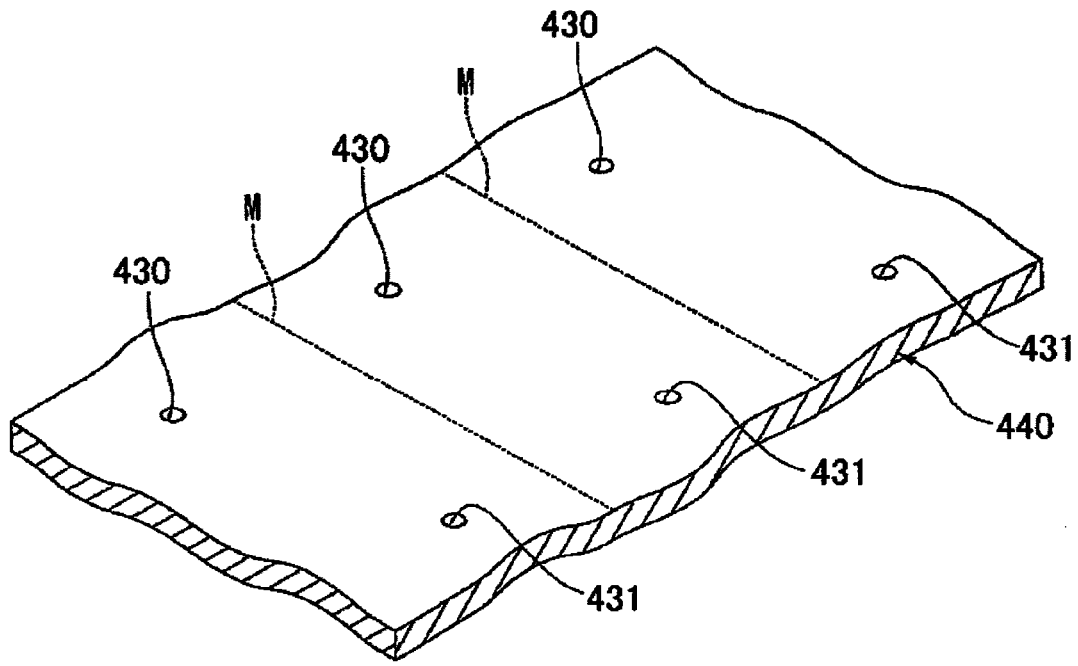
FIG. 77 is a view showing one step in manufacturing piezoelectric vibrators according to the flowchart shown in FIG. 75, and is a view showing the condition where pairs of through-holes are formed in a base substrate wafer which is an original to be a base substrate.
Figure 78:
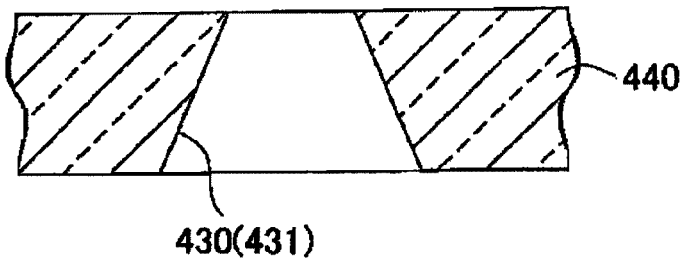
FIG. 78 is a cross-sectional view of the base substrate wafer in the condition shown in FIG. 77.

First, as shown in FIG. 77, a through-hole forming step (S432) is attained for forming a plurality of pairs of through-holes 430 and 431 in and through the base substrate wafer 440. The dotted line M shown in FIG. 77 means a section line for cutting in the subsequent cutting step. In this step, the wafer is processed, for example, according to a sand-blasting method or a pressing method. Accordingly, tapered through-holes 430 and 431 are formed, which run through the base substrate wafer 440 with its diameter gradually increasing from the upper face to the lower face thereof, as shown in FIG. 78. A plurality of pairs of through-holes 430 and 431 are so formed as to be housed in the recesses 403a formed in the lid substrate wafer 450, when the two wafers 440 and 450 are overlaid later. Further, they are so positioned that one through-hole 430 can be positioned on the side of the base 412 of the piezoelectric vibration member 404 and the other through-hole 431 can be on the top side of the vibration arms 410 and 411.

Next, a setting step is attained for inserting the core part 407 of a tack member 409 into these plural through-holes 430 and 431 and filling a glass frit 406 thereinto to block up the space between the inner peripheral wall of the through-holes 430 and 431 and the tack member 409 (S433).

Figure 79:
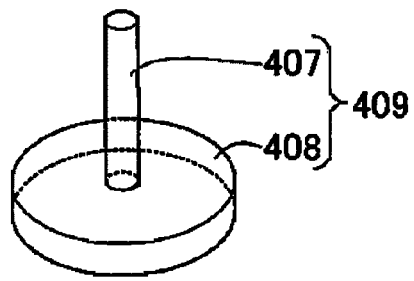
FIG. 79 is a perspective view of a tack member for use in manufacturing piezoelectric vibrators according to the flowchart shown in FIG. 75.

In this embodiment, as the tack member 409, used is an electroconductive one having a tabular basis part 408 and a core part 407 extending from the basis part 408, as shown in FIG. 79. In the illustrated case, the core part 407 is so formed that it extends from the basis part 408 toward the direction substantially perpendicular to the surface of the basis part 408 to a thickness substantially equal to the thickness of the base substrate wafer 440 and that it has a flat end. The basis part 408 of the tack member 409 is formed to be larger than the open end on the upper face side of the through-holes 430 and 431, on the planar view thereof. The tack member 409 is formed of, for example, Kovar, Dumet wire, Fe—Ni or the like, and its thermal expansion coefficient is substantially equal to that of the glass frit 406.

Figure 80:
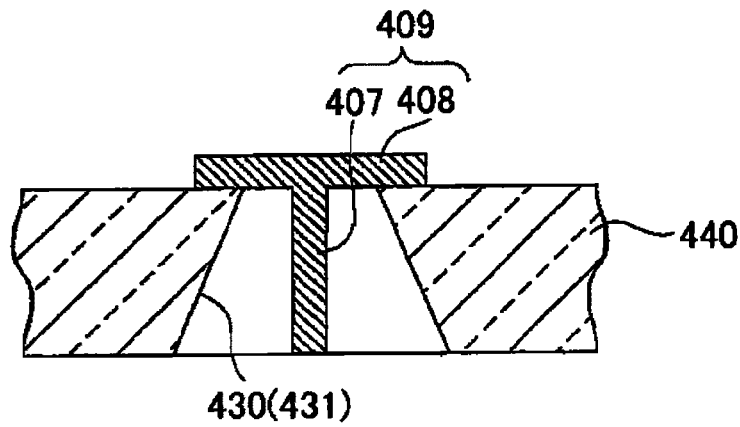
FIG. 80 is a view showing one step in manufacturing piezoelectric vibrators according to the flowchart shown in FIG. 75, and is a view showing the condition where, after the state shown in FIG. 78, the core part of a tack member is inserted into the through-hole.
Figure 81:
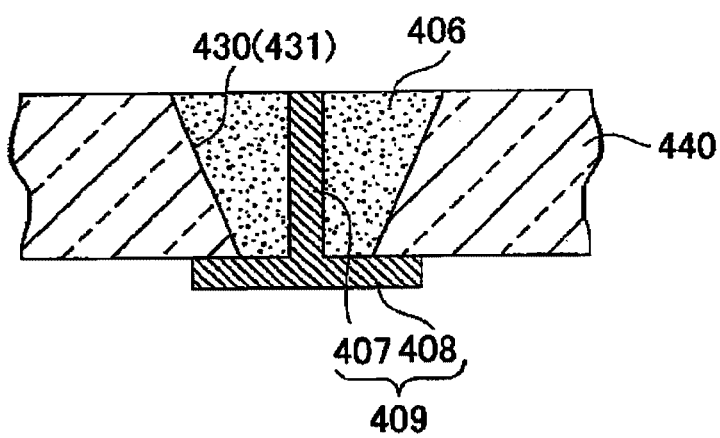
FIG. 81 is a view showing one step in manufacturing piezoelectric vibrators according to the flowchart shown in FIG. 75, and is a view showing the condition where, after the state shown in FIG. 80, a glass frit is implanted in the through-hole.

In the setting step, as shown in FIG. 80, the core part 407 of the tack member 409 is inserted from the upper face side of the base substrate wafer 440 until the basis part 408 thereof is kept in contact with the base substrate wafer 440. Next, using a jig or the like (not shown), the tack member 409 is fixed to the base substrate wafer 440, and then the upper and lower faces of the base substrate wafer 440 are turned upside down. Next, as shown in FIG. 81, a pasty glass frit (connection member) 406 is cast through the open end on the lower face side of the through-holes 430 and 431. The glass frit 406 may be previously defoamed, and in this case, the generation of bubbles to be mentioned below may be reduced. The glass frit 406 may not be pasty, but may be, for example, powdery.

In this stage, the core part 407 is so formed that it extends from the basis part 408 toward the direction substantially perpendicular to the surface of the basis part 408 to a thickness substantially equal to the thickness of the base substrate wafer 440 and that it has a flat end. Therefore, by the simple operation of pushing until the basis part 408 is kept in contact with the base substrate wafer 440, the two ends of the core part 407 can be easily and surely in a flat condition relative to the surface of the base substrate wafer 440. Accordingly, the workability in the setting step can be enhanced.

Next, a firing step is attained for firing the implanted glass frit 406 at a predetermined temperature (S434). Accordingly, the through-holes 430 and 431, the tack member 409 and the glass frit 406 can be fixed to each other. Since the firing is attained with the basis part 408 kept as such, they can be fixed to each other with the two ends of the core part 407 kept substantially in a flat condition relative to the surface of the base substrate wafer 440.

After the firing step, the upper and lower faces of the base substrate wafer 440 may be turned upside down. The case where the wafer is turned upside down is described below as an example.

Figure 82:
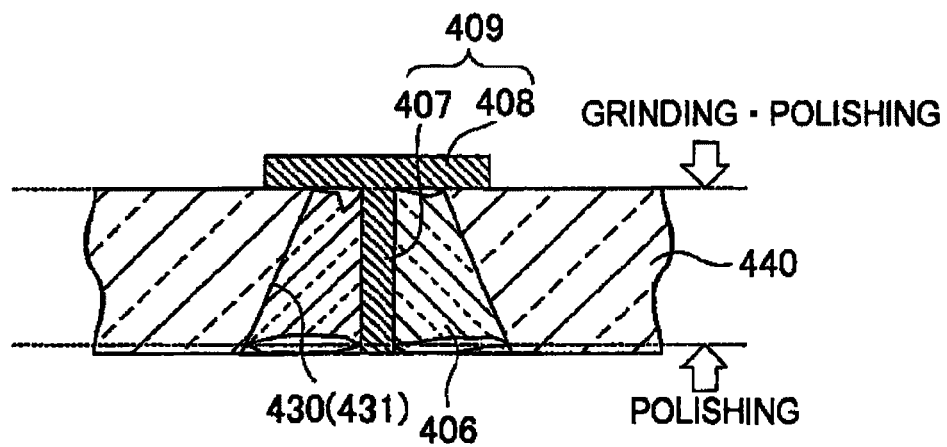
FIG. 82 is a view showing one step in manufacturing piezoelectric vibrators according to the flowchart shown in FIG. 75, and is a view showing the condition where, after the state shown in FIG. 81, the glass frit is fired.

Next, as shown in FIG. 82, a polishing step is attained after the firing, for polishing and removing the basis part 408 of the tack member 409 and polishing the two faces of the base substrate wafer until the core part of the tack member is exposed out (S435). In this embodiment, the polishing step is for removing the basis part 408 on the upper face side of the base substrate wafer 440 and for removing the glass frit 406 having adhered to the surface of the core part 407 in filling the glass frit 406 into the through-holes 430 and 431, on the lower face side of the base substrate wafer 440. As a result, the core part 407 serves as through-electrodes 432 and 433. The through-electrodes 432 and 433 are formed of the electroconductive core part 407 and therefore secure stable electroconductivity.

In case where the glass frit 406 does not adhere to the surface of the core part 407, then the lower face of the base substrate wafer 440 may not be polished.

Figure 83:
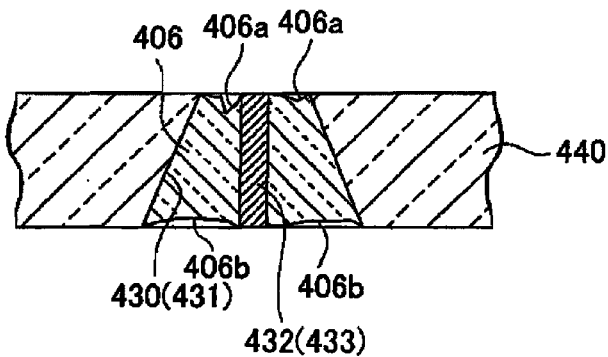
FIG. 83 is a view showing one step in manufacturing piezoelectric vibrators according to the flowchart shown in FIG. 75, and is a view showing the condition where, after the state shown in FIG. 82, the basis part of the tack member is polished.

In the polishing step, as shown in FIG. 83, the part hardened to surround the bubbles inside the fired glass frit 406 may be exposed out to form fine depressions 406a and 406b in the surface.

Figure 84:
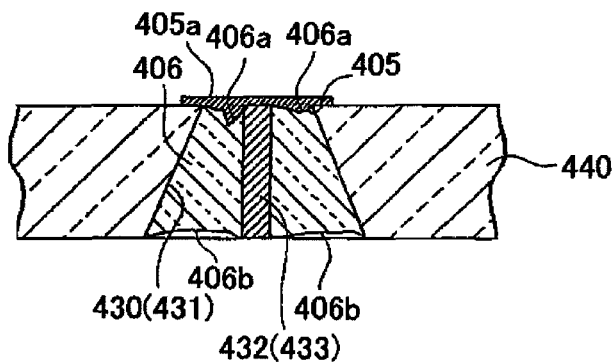
FIG. 84 is a view showing one step in manufacturing piezoelectric vibrators according to the flowchart shown in FIG. 75, and is a view showing the condition where, after the state shown in FIG. 83, an implant member is implanted into the depressions in the upper face of the glass frit.

Therefore, as shown in FIG. 84, a flat face forming step is attained for implanting the depression 406a in the upper face of the glass frit 406 with an implant member 405 thereby forming a flat face 405a on the upper face side of the glass fit 406 (S436). In this stage, the implant member 405 is so implanted that it covers the through-holes 430 and 431, the glass frit 406 and the through-electrodes 432 and 433 and that its upper face can be a flat face 405a. This step is attained, for example, by implanting the implant member 405 into the depression 406a through sputtering, vapor deposition or the like. If desired, after the implant member 405 is implanted to be thick, the surface of the implant member 405 may be polished to form the flat surface 405*a*.

The above completes the through-electrode forming step.

Figure 85:
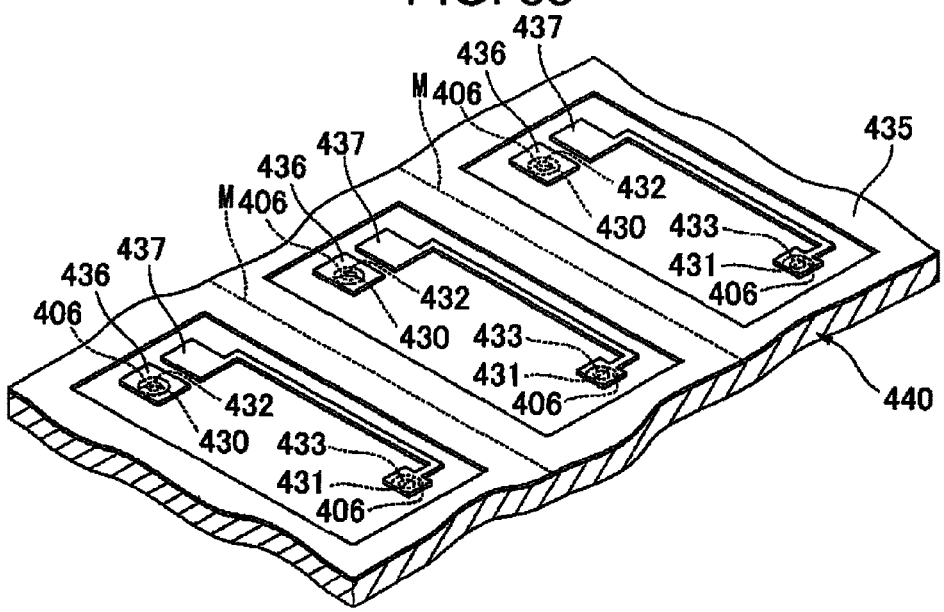
FIG. 85 is a view showing one step in manufacturing piezoelectric vibrators according to the flowchart shown in FIG. 75, and is a view showing the condition where, after the state shown in FIG. 84, bonding films and routing electrodes are patterned on the upper face of the base substrate wafer.
Figure 86:
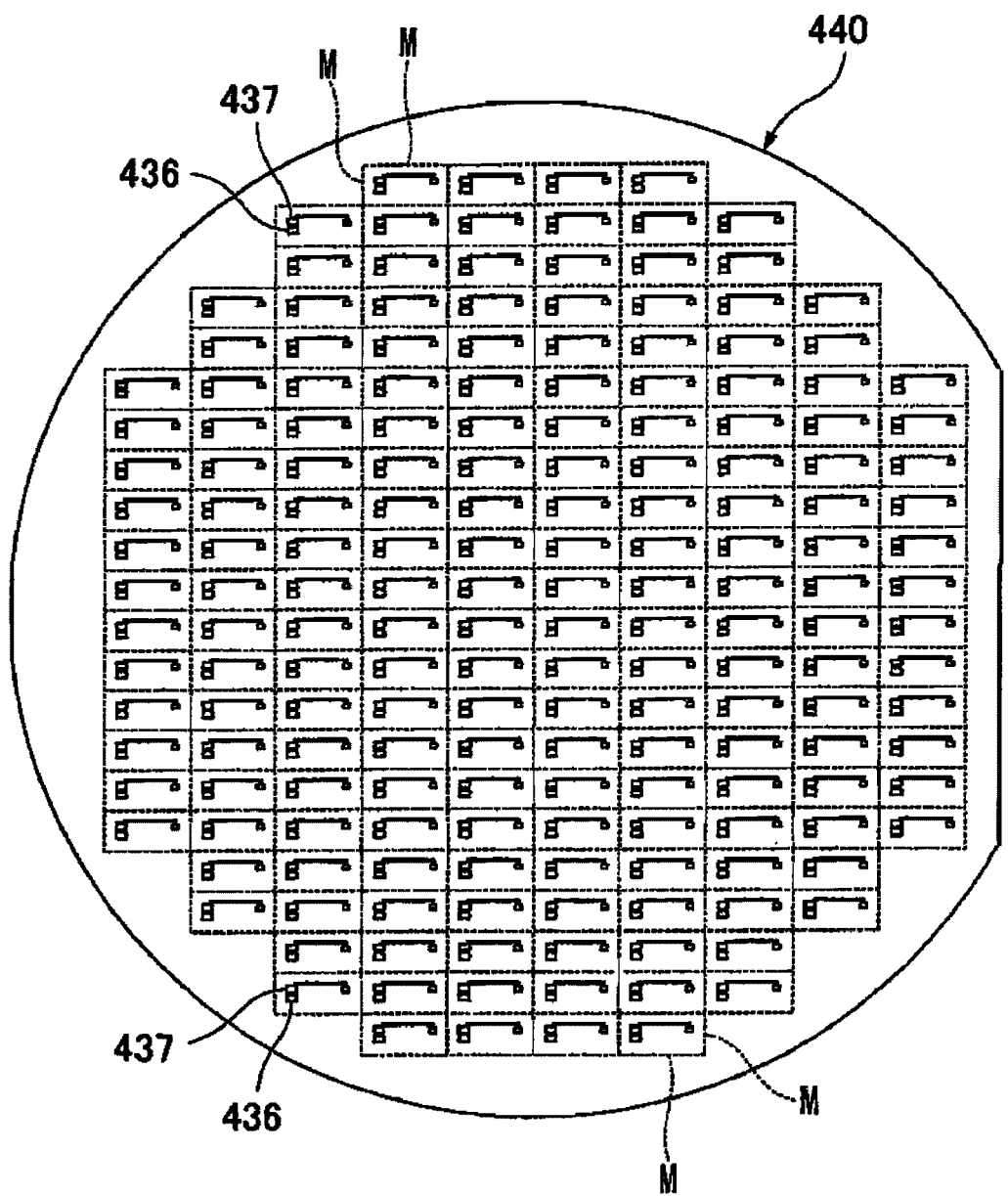
FIG. 86 is an entire view of the base substrate wafer in the state shown in FIG. 85.

Next, a bonding film forming step is attained for forming a bonding film 435 by patterning an electroconductive material on the upper face of the base substrate wafer 440, as shown in FIG. 85 and FIG. 86 (S437), and a routing electrode forming step is attained for forming a plurality of routing electrodes 436 and 437 connected electrically with the pair of through-electrodes 432 and 433, respectively (S438). In this stage, the routing electrodes 436 and 437 are so formed as to cover the implant member 405 disposed on the base substrate wafer 440. The dotted line M shown in FIG. 85 and FIG. 86 means a section line for cutting in the subsequent cutting step.

In particular, since the flat face 405*a* is formed on the upper face side of the glass frit 406, the routing electrodes 436 and 437 are not formed on the depression 406*a* in the routing electrode forming step, and therefore, the routing electrodes 436 and 437 can be formed surely in a uniform thickness.

At this point of time, the second wafer forming step is finished.

In FIG. 75, the process sequence is the bonding film forming step (S436) followed by the routing electrode forming step (S437); however, contrary to this, the routing electrode forming step (S437) may be followed by the bonding film forming step (S436), or the two steps may be attained at the same time. In any process sequence, the same advantage and effect can be exhibited. Accordingly, the process sequence may be optionally changed or modified in any desired order.

Next, a mounting step is attained for bonding the formed, plural piezoelectric vibration members 404 onto the upper face of the base substrate wafer 440 via the routing electrodes 436 and 437 (S440). First, a bump P of gold or the like is formed on the pair of routing electrodes 436 and 437. After the base 412 of the piezoelectric vibration member 404 is put on the bump P, the piezoelectric vibration member 404 is pressed against the bump P while the bump P is heated at a predetermined temperature (for example, at 300° C.). Accordingly, the piezoelectric vibration member 404 is mechanically supported by the bump P, and the mount electrodes 416 and 417 are electrically connected with the routing electrodes 436 and 437. Therefore, at this time, the pair of excitation electrodes 415 of the piezoelectric vibration member 404 are electrically connected to the pair of through-electrodes 432 and 433, respectively.

In particular, the piezoelectric vibration member 404 is bump-bonded, and therefore it is supported as spaced above from the upper face of the base substrate wafer 440. Since the melting point of the implant member 405 and the glass frit 406 is higher than the predetermined temperature for heating in the mounting step, the two do not melt, and the through-holes 430 and 431 are kept surely blocked up.

After the mounting of the piezoelectric vibration member 404 is finished, an overlaying step is attained for overlaying the base substrate wafer 440 and the lid substrate wafer 450 (S450). Concretely, the two wafers 440 and 450 are aligned in a correct position based on a reference mark or the like (not shown) as an index. Accordingly, the mounted piezoelectric vibration member 404 is kept housed in the cavity C surrounded by the recess 403*a* formed in the base substrate wafer 440 and the two wafers 440 and 450.

Figure 87:
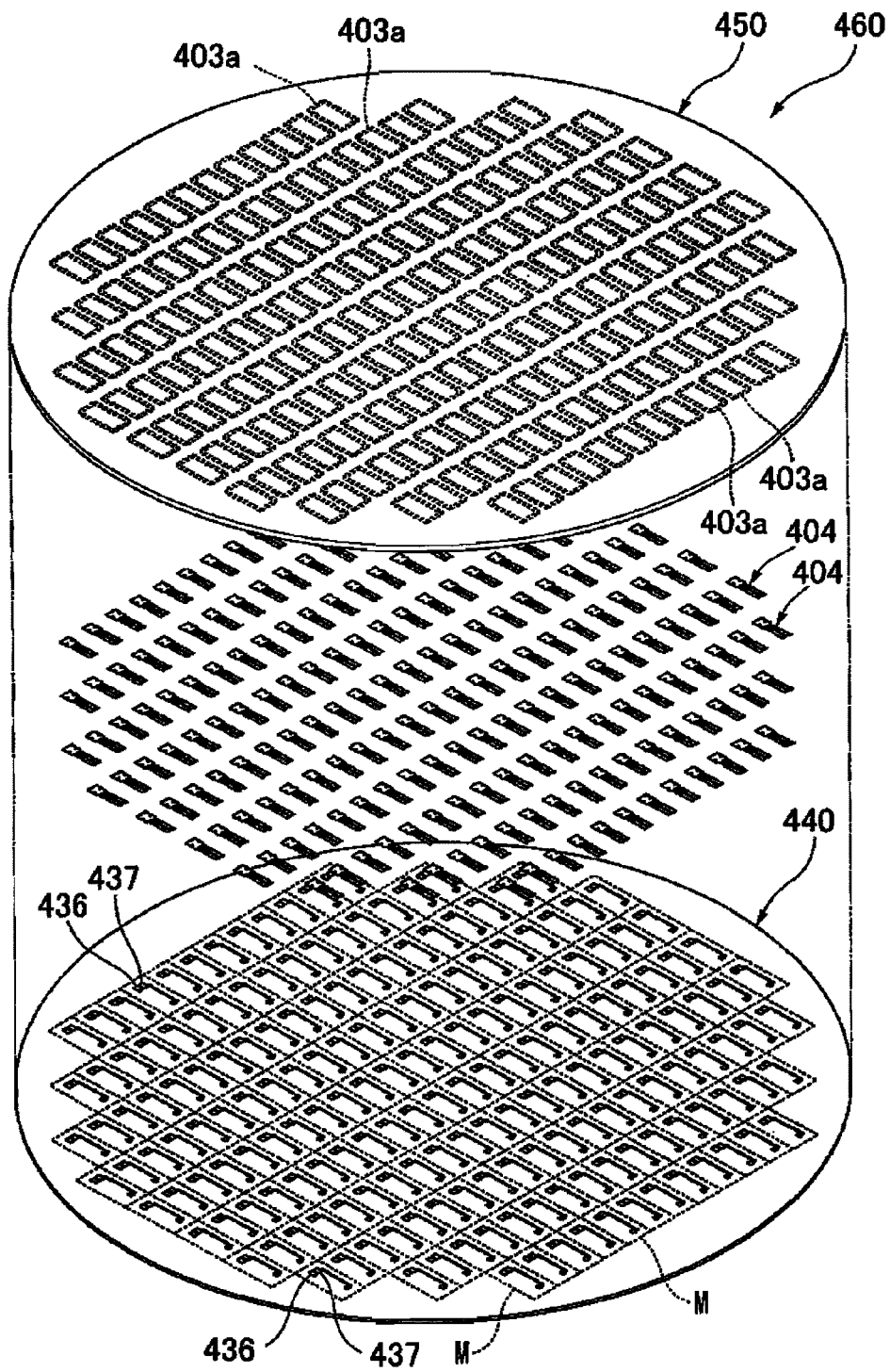
FIG. 87 is a view showing one step in manufacturing piezoelectric vibrators according to the flowchart shown in FIG. 75, and is a perspective exploded view of the wafer body in which the base substrate wafer and the lid substrate wafer are anodically-bonded and the piezoelectric vibration member is housed in the cavity.

After the overlaying step, a bonding step is attained for anodically bonding the overlaid two wafers 440 and 450 by putting them in an anodic bonding apparatus (not shown) and applying a predetermined voltage thereto in a predetermined temperature atmosphere (S460). Concretely, a predetermined voltage is applied between the bonding film 435 and the lid substrate wafer 450. With that, there occurs electrochemical reaction in the interface between the bonding film 435 and the lid substrate wafer 450, whereby the two firmly stick to each other to attain anodic bonding therebetween. Accordingly, the piezoelectric vibration member 404 can be sealed up in the cavity C, and a wafer body 460 as shown in FIG. 87 can be obtained in which the base substrate wafer 440 and the lid substrate wafer 450 are bonded to each other. FIG. 87 illustrates an exploded state of the wafer body 460 for facilitating the understating of the view, in which the illustrative constitution of from the base substrate wafer 440 to the bonding film 435 is omitted. The dotted line M shown in FIG. 87 means a section line for cutting in the subsequent cutting step.

In anodic bonding, the through-holes 430 and 431 formed in the base substrate wafer 440 are completely blocked up by the through-electrodes 432 and 433 and the glass frit 406, and therefore, the airtightness inside the cavity C is not broken by the through-holes 430 and 431. In particular, the through-electrodes 432 and 433 and the glass frit 406 are integrally fixed to each other by firing and these are firmly fixed to the through-holes 430 and 431, and therefore the airtightness inside the cavity C can be surely secured.

After the above-mentioned anodic bonding is finished, an external electrode forming step is attained for forming a plurality of pairs of external electrodes 438 and 439 electrically connected to the pairs of through-electrodes 432 and 433, respectively, by patterning an electroconductive material on the lower face of the base substrate wafer 440 (S470). As a result of this step, the piezoelectric vibration member 404 sealed up in the cavity C can be operated by utilizing the external electrodes 438 and 439.

Next, a fine-tuning step is attained for finely tuning the frequency of the individual piezoelectric vibration members 404 sealed up in the cavities C in the state of the wafer body 460 to make them fall within a predetermined range (S480). Concretely, a voltage is applied to the pair of external electrodes 438 and 439 formed on the lower face of the base substrate wafer 440 to thereby vibrate the piezoelectric vibration member 404. Then, with monitoring the frequency, this is irradiated with a laser light from the outside through the lid substrate wafer 450, to thereby evaporate the fine-tuning film 421*b* of the weight metal film 421. As a result, the weight of the top side of the pair of vibration arms 410 and 411 changes, and therefore the frequency of the piezoelectric vibration member 404 can be finely tuned so as to fall within a predetermined range of a nominal frequency.

After the fine-tuning of frequency is finished, a cutting step is attained for cutting the bonded wafer body 460 to thereby shred it into the individual pieces along the section line M shown in FIG. 87 (S490). As a result, a plurality of two-layer structure-type, surface-mount piezoelectric vibrators 401 as in FIG. 67 can be manufactured all at once, in which the piezoelectric vibration member 404 is sealed up in the cavity C formed between the base substrate 402 and the lid substrate 403 bonded to each other.

The process sequence may be in an order of the cutting step (S490) of shredding into the individual piezoelectric vibrators 401 followed by the fine-tuning step (S480). However, as so mentioned in the above, in case where the fine-tuning step (S480) is attained previously, then the tuning can be effected in the state of the wafer body 460 and therefore a plurality of piezoelectric vibrators 401 can be finely tuned more efficiently. Accordingly, it is favorable as increasing the throughput.

After this, the internal electric characteristics are inspected (S500). Specifically, the piezoelectric vibration member 404 is checked for the resonance frequency, the resonance resistance, the drive level characteristic (excitation power dependence of the resonance frequency and the resonance resistance), etc. In addition, it is checked also for the insulation resistance characteristic, etc. Finally, the piezoelectric vibrator 401 is checked for the appearance thereof in point of the dimension and the quality, etc. With that, the manufacture of the piezoelectric vibrator 401 is finished.

In particular, in the piezoelectric vibrator 401 of this embodiment, the routing electrodes 436 and 437 are formed to have a more uniform thickness, and therefore the risk of local breakage of the routing electrodes 436 and 437 owing to time degradation or the like may be extremely reduced. As a result, the electric connection between the through-electrodes 432 and 433 and the piezoelectric vibration member 404 can be stabilized, and stable electric connection between the piezoelectric vibration member 404 and the external electrodes 438 and 439 can be secured. Accordingly, the operation performance reliability of the piezoelectric vibrator 401 can be enhanced and the quality thereof can be increased.

The thermal expansion coefficient of the implant member 405 is substantially equal to that of the glass frit 406, and therefore, even in a case where the implant member 405 and the glass frit 406 are indirectly heated by heating the bump P for bonding the piezoelectric vibration member 404 in the mounting step, the close adhesion of the two can be stably maintained. Accordingly, the close adhesion between the routing electrodes 436 and 437 and the through-electrodes 432 and 433 can be maintained, and the electric connection between the two can be surely secured.

As the implant member 405, an electroconductive material is used; and therefore, even when the implant member 405 is disposed between the through-electrodes 432 and 433 and the routing electrodes 436 and 437, the electric connection between the two electrodes can be maintained. Accordingly, in the flat face forming step, even when the flat face 405a is formed to cover the through-electrodes 432 and 433, the above-mentioned electric connection can be secured. In other words, it is unnecessary to implant the implant member 405 only in the depression 406a in the upper face of the glass frit 406, as targeted thereto, and therefore, the flat face forming step can be attained with ease.

The airtightness inside the cavity C can be surely maintained, and therefore, the high quality of the piezoelectric vibrator 401 can be secured.

According to the manufacturing method of this embodiment, a plurality of the above-mentioned piezoelectric vibrators 401 can be manufactured all at once, and therefore the manufacture cost can be reduced.

In this embodiment, the implant member 405 is implanted to the surface, as the upper face, of the glass frit 406 on the base side of the core part 407; however, not limited thereto, it may be implanted to the surface, as the upper face, of the glass frit 406 on the top side of the core member 407.

In this embodiment, as the base substrate wafer 440 (base substrate 402), the glass frit 406 and the tack member 409 (through-electrodes 432 and 433), those having a substantially same thermal expansion coefficient are used; however, any others having a different thermal expansion coefficient may be used. Further, as the implant member 405 and the glass frit 406, those having a substantially same thermal expansion coefficient are used; however, any others having a different thermal expansion coefficient may be used.

The shape of the tack member 409 is not limited to those illustrated in this embodiment; but, for example, it may have a rectangular basis part like the tack members 9 and 109 shown in the first embodiment and the second embodiment. The length of the core part 207 and the shape of the top thereof are not also limited to those shown in this embodiment; however, preferably, its length is substantially equal to or smaller than the thickness of the base substrate wafer 240 before the polishing step.

Fifth Embodiment

The fifth embodiment of the piezoelectric vibrator manufacturing method and the piezoelectric vibrator manufactured according to the manufacturing method of the invention is described below with reference to FIG. 88 to FIG. 93. In the fifth embodiment, the same constitutive elements as those in the fourth embodiment are given the same reference numerals or signs, and their description is omitted. Here, only the differences are described.

Figure 88:
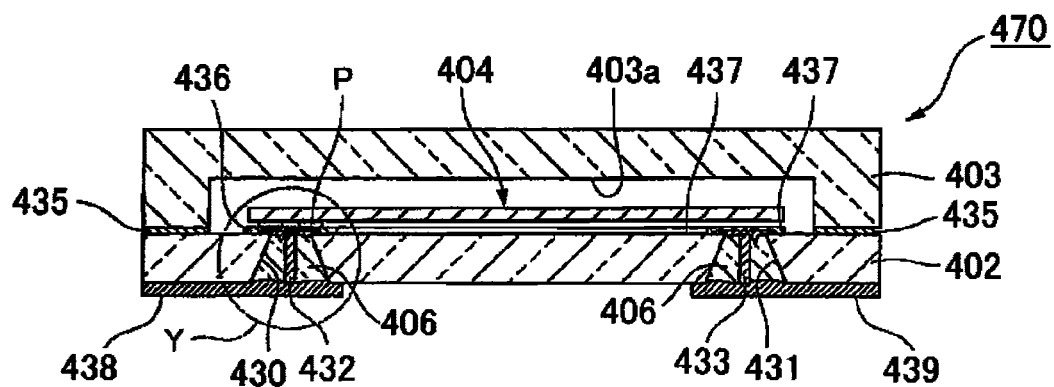
FIG. 88 is a cross-sectional view showing the fifth embodiment of the piezoelectric vibrator of the invention.
Figure 89:
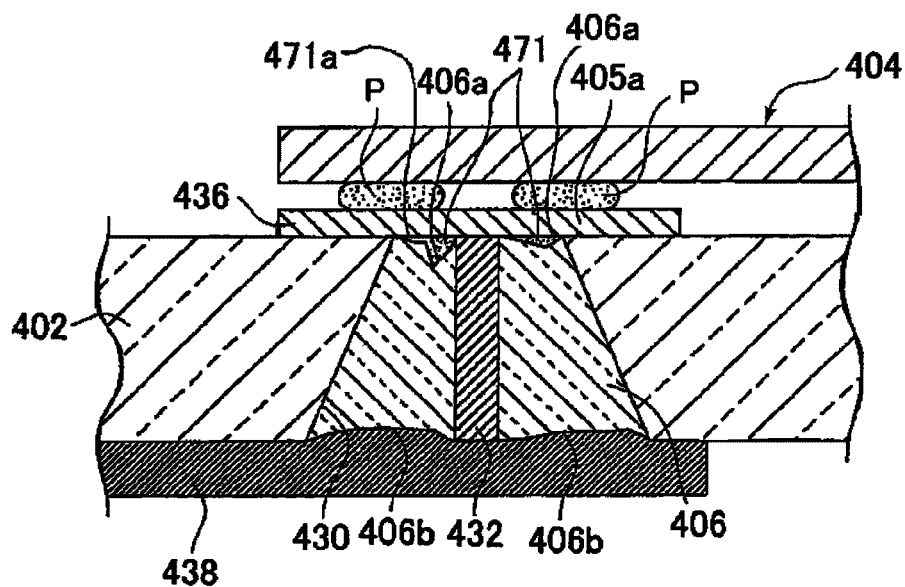
FIG. 89 is an enlarged view of the part Y shown in FIG. 88.

Regarding the implant member 471 in the piezoelectric vibrator 470 of this embodiment, as shown in FIG. 88 and FIG. 89, the surface of the implant member 471 and the upper face of the glass frit 406 form a flat face 471a that is on the same level as that of the upper face of the base substrate 402. In other words, the implant member 471 is implanted only in the depression 406a in the upper face of the glass frit 406. Accordingly, the surface of the implant member 471, the upper face of the glass frit 406 and the upper face of the base substrate 402 are in a flat condition. Further, in the illustrated case, the flat face 471a is also in a flat condition relative to the through-electrodes 432 and 433, or that is, it is electrically connected to the through-electrodes 432 and 433.

The implant member 471 is, for example, formed of a glass material, and its thermal expansion coefficient and hardness are substantially equal to those of the glass frit 406. The melting point of the implant member 471 is lower than the melting point of the glass frit 406, and is, for example, from 350° C. to 400° C.

Figure 90:
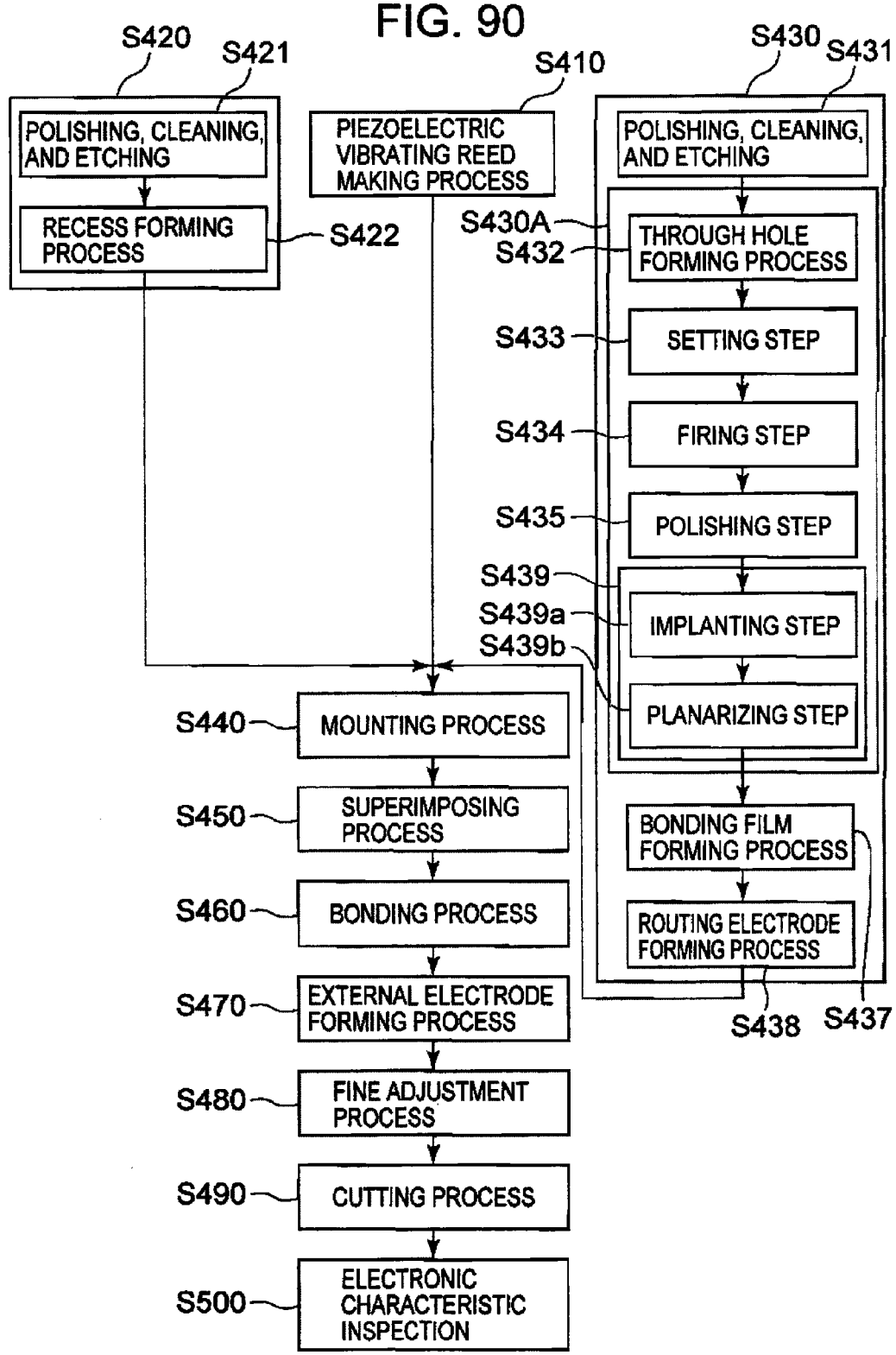
FIG. 90 is a flowchart showing the flow in manufacturing the piezoelectric vibrator shown in FIG. 88.

Next, the manufacturing method of the piezoelectric vibrator 470 of this embodiment is shown as the flowchart in FIG. 90. In the following, the flowchart is referred to, and the through-electrode forming step in this embodiment (S430B) is described.

In the through-electrode forming step in this embodiment, the process up to the polishing step (S435) is the same as in the fourth embodiment; and after the polishing step, the flat face forming step in this embodiment is attained (S439).

Figure 91:
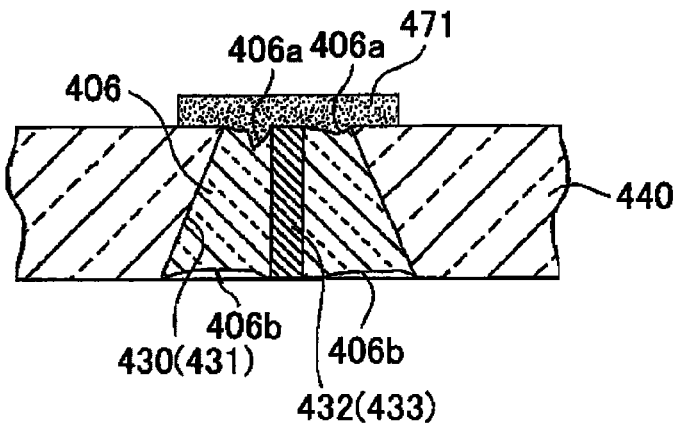
FIG. 91 is a view showing one step in manufacturing piezoelectric vibrators according to the flowchart shown in FIG. 90, and is a view showing the condition where, after the state shown in FIG. 83, an implant member is implanted into the depressions in the upper face of the glass frit.

As the flat face forming step, as shown in FIG. 91, first attained is an implanting step of implanting the implant member 471 into the depression 406a in the upper face of the glass frit 406 (S439a). In the illustrated case, the implant member 471 is so formed as to cover the glass frit 406 and the through-electrodes 432 and 433 that block up the through-holes 430 and 431. This step may be attained, for example, by melting the implant member 471 and adhering it to the depression 406a of the glass frit 406. In this case, as the implant member 471, one having a lower melting point than that of the glass frit 406 is used, and therefore, even when a melted implant member 471 is used, the depression 406a can be implanted with it not melting the glass frit 406.

After the implant member 471 is implanted, the excessive implant member 471 on the base substrate wafer 440 may be removed by scraping with a squeegee or the like so that the implant member 471 could remain only in the depression 406a.

Figure 92:
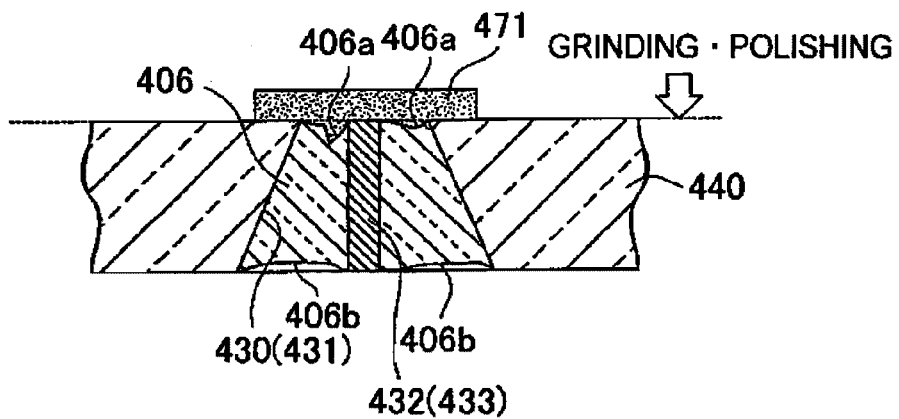
FIG. 92 is a view showing one step in manufacturing piezoelectric vibrators according to the flowchart shown in FIG. 90, and is a view showing the condition where, after the state shown in FIG. 91, the implant member is polished.
Figure 93:
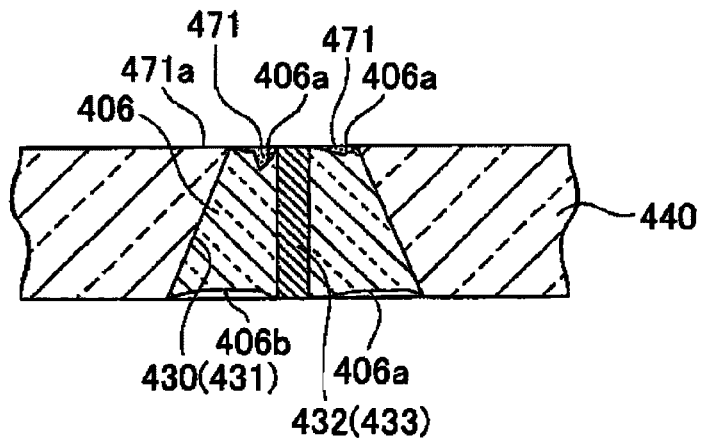
FIG. 93 is a view showing one step in manufacturing piezoelectric vibrators according to the flowchart shown in FIG. 90, and is a view showing the condition where, after the state shown in FIG. 92, the implant member was polished.

Next, as shown in FIG. 92, a planarizing step is attained for polishing the implant member 471 (S439b). Accordingly, as shown in FIG. 93, the surface of the implant member 471, the upper face of the glass frit 406 and the upper face of the base substrate 402 can be planarized. In the illustrated case, the upper face of the through-electrodes 432 and 433 is also planarized to be on the same level as the others.

After the planarizing step, the through-electrode forming step is finished.

According to the manufacturing method of this embodiment, the same advantage and effect as in the fourth embodiment can be exhibited, and in addition, since the surface of the implant member 471, the upper face of the glass frit 406 and the upper face of the base substrate 402 are planarized, the routing electrodes 436 and 437 are not formed on a bumped area, and the routing electrodes 436 and 437 can be formed more surely in a uniform thickness.

In the planarizing step, the implant member 471 is polished and the surface of the implant member 471 and the upper face of the glass frit 406 form the flat face 471*a*. Accordingly, in the implanting step where the implant member 471 is implanted in the depression 406*a* in the upper face of the glass frit 406, even when the implant member 471 is implanted to cover the through-electrodes 432 and 433, the part covering the through-electrodes 432 and 433 can be removed in the planarizing step, and therefore even when a glass material is used as the implant member 471, the electric connection between the through-electrodes 432 and 433 and the routing electrodes 437 and 438 can be secured. In other words, it is unnecessary to implant the implant member 471 only in the depression 406*a* in the upper face of the glass frit 406, as targeted thereto, and therefore, the flat face forming step can be attained with ease.

In this embodiment, the implant member 471 is a glass material; however, for example, the material shown in the first embodiment may also be used, or a resin material may be used.

In case where a resin material is used as the implant member 471, preferably, it is a thermoplastic heat-resistant resin material. In this case, even when the implant member 471 is heated in the process of manufacturing the piezoelectric vibrator 401 or during use thereof, the resin material does not generate gas. One specific example of the resin material is a polyimide resin material.

In this embodiment, the implanting step is attained by melting the implant member 471 and adhering it to the depression 406*a* of the glass frit 406; but it may also be attained, for example, by printing with the implant member 471.

In this embodiment, the melting point of the implant member 471 is lower than the melting point of the glass frit 406, to which, however, the invention is not limited.
(Oscillator)

Figure 94:
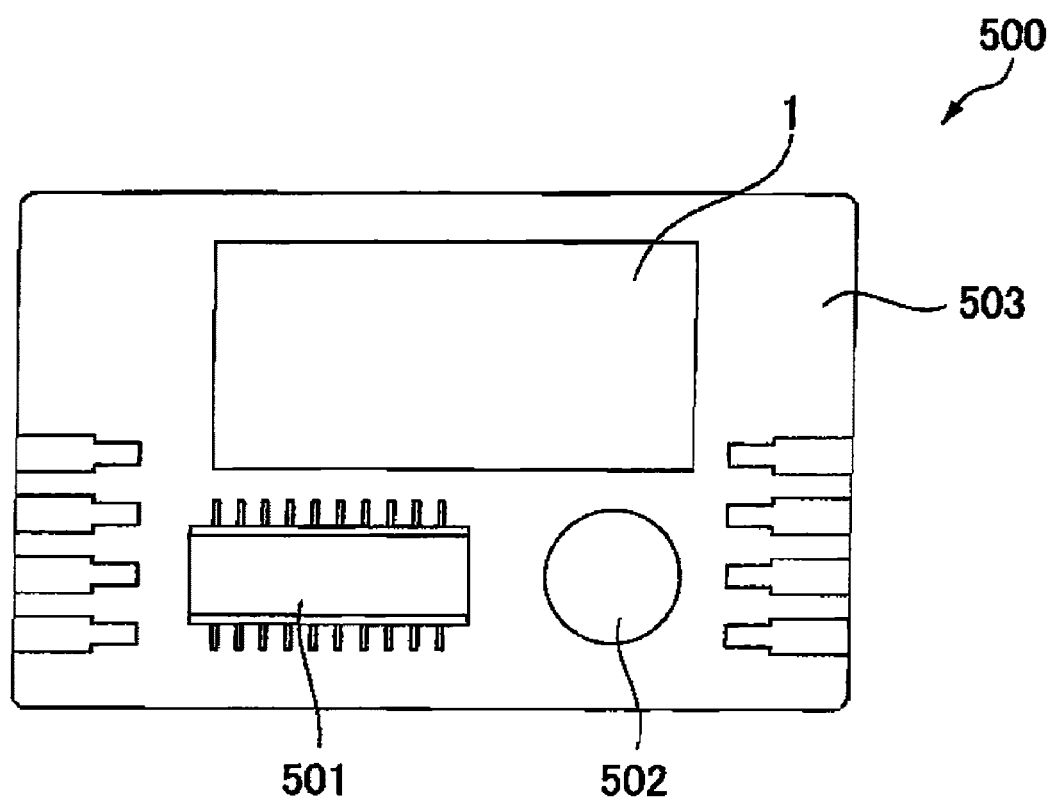
FIG. 94 is a configuration view showing one embodiment of the oscillator of the invention.

Next described is one embodiment of the oscillator of the invention, with reference to FIG. 94.

The oscillator 500 of this embodiment comprises the piezoelectric vibrator 1 shown in the first embodiment, as electrically connected to an integrated circuit 501 to be an oscillation member therein, as shown in FIG. 94. The oscillator 500 is provided with a substrate 503 on which an electronic part 502 such as a capacitor or the like is mounted. On the substrate 503, mounted is the above-mentioned integrated circuit 501 for oscillator, and in the vicinity of the integrated circuit 501, the piezoelectric vibrator 1 is mounted thereon. These electronic part 502, integrated circuit 501 and piezoelectric vibrator 1 are electrically connected to each other with a wiring pattern (not shown). The constitutive parts each are molded with a resin (not shown).

In the thus-constituted oscillator 500, when a voltage is applied to the piezoelectric vibrator 1, then the piezoelectric vibration member 4 in the piezoelectric vibrator 1 is vibrated. The vibration is converted into an electric signal owing to the piezoelectric characteristic that the piezoelectric vibration member 4 has, and the electric signal is inputted into the integrated circuit 501. The thus-inputted electric signal is processed variously in the integrated circuit 501, and is outputted as a frequency signal. Accordingly, the piezoelectric vibrator 1 functions as an oscillation member.

In case where the integrated circuit 501 is, for example, so constituted that an RTC (real time clock) module or the like is defined therein selectively on demand, then the oscillator may act as a single-function oscillator for clocks or the like, or a function of controlling the operation date or time of the device or its external devices or providing a time, a calendar or the like may be added to the oscillator.

The oscillator 500 of this embodiment comprises the high-quality piezoelectric vibrator 1, in which the airtightness inside the cavity C is secured and of which the operation reliability has been improved, and therefore, the operation reliability of the oscillator 500 itself can also be enhanced and the quality thereof can be increased. In addition, the oscillator may give stable and precision frequency signals for a long period of time.

An example comprising the piezoelectric vibrator 1 of the first embodiment is described in the above; however, the piezoelectric vibrators 101, 201, 401 and 470 of the other embodiments can exhibit the same advantage and effect.
(Electronic Device)

Figure 95:
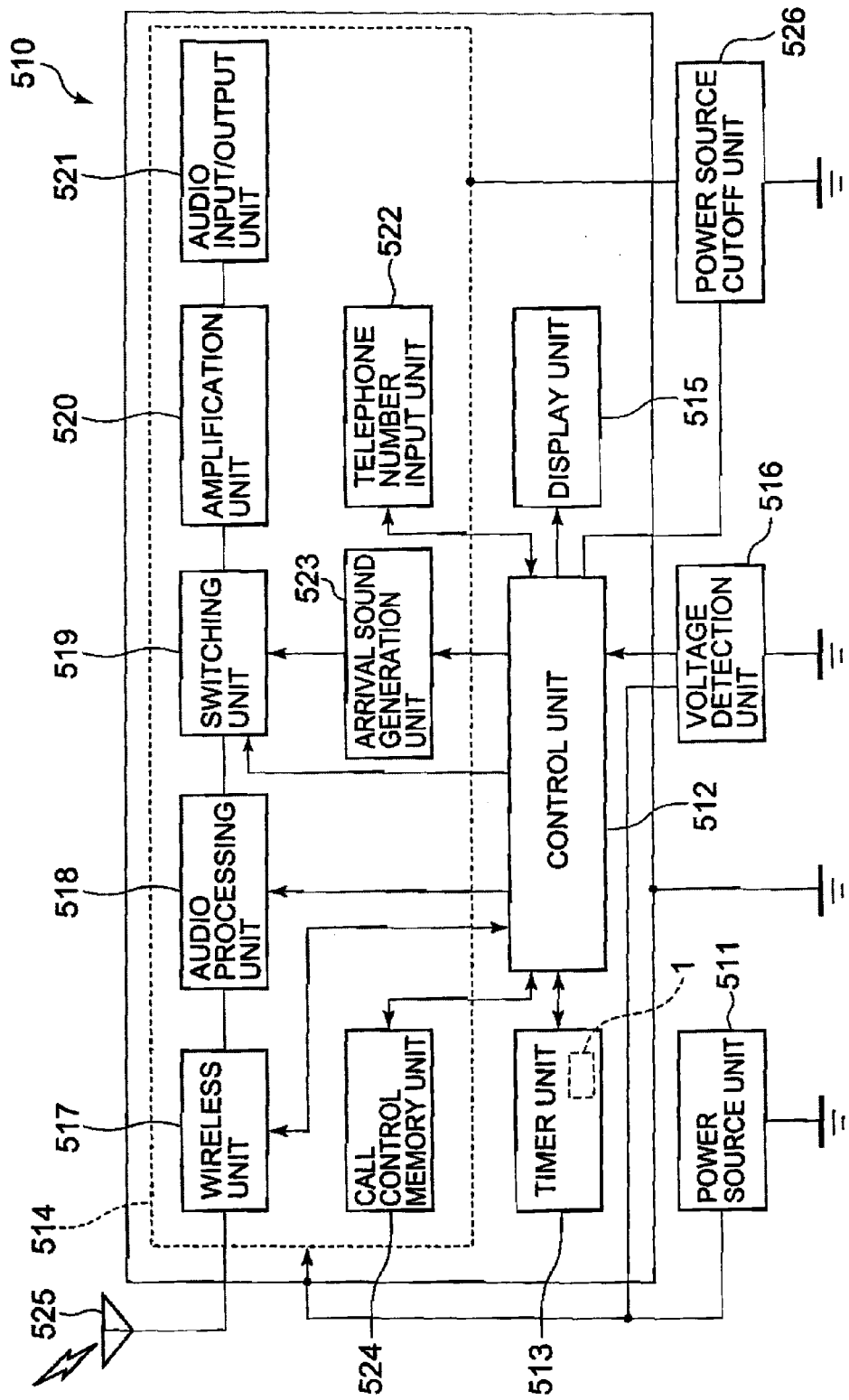
FIG. 95 is a constitutive view showing one embodiment of the electronic device of the invention.

Next described is one embodiment of the electronic device of the invention, with reference to FIG. 95. As the electronic device, a portable information device 510 having the piezoelectric vibrator 1 of the first embodiment is illustrated below. First, the portable information device 510 of this embodiment is, for example, typically a portable telephone, which is developed and improved from a prior-art wristwatch. Its appearance is similar to a wristwatch, and a liquid-crystal display is disposed in the part corresponding to the dial plate, and the current time or the like can be displayed on the panel. In case where it is utilized as a communication device, then it is taken off from the wrist, and via the speaker or the microphone built in the inside part of the band, communication can be attained like in the case of prior-art portable telephones. However, as compared with conventional portable telephones, the device of the invention is remarkably down-sized and weight-saved.

Next described is the constitution of the portable information device 510 of this embodiment. The portable information device 510 is provided with the piezoelectric vibrator 1 and a power source part 511 for power supply, as shown in FIG. 95. The power source part 511 comprises, for example, a lithium secondary battery. To the power source part 511, connected are a control part 512 for various control, a timer part 513 for counting time and the like, a communication part 514 for external communication, a display part 515 for displaying various information, and an voltage detection part 516 for detecting the voltage of the individual functional parts, all in parallel to each other. Via the power source part 511, power is supplied to the respective functional parts.

The control part 512 controls the individual functional parts, transmits and receives voice data, and counts and displays the current time, therefore controlling the operation of the entire system. The control part 512 is provided with ROM where a program is previously written, CPU for reading out the program written in ROM and executing it, and RAM to be used as a work area of CPU, etc.

The timer part 513 is provided with an integrated circuit that comprises an oscillation circuit, a register circuit, a counter circuit, an interface circuit and the like all built therein, and the piezoelectric vibrator 1. When a voltage is applied to the piezoelectric vibrator 1, then the piezoelectric vibration member 4 is vibrated and the vibration is converted into an electric signal owing to the piezoelectric characteristic that the quartz crystal has, and the electric signal is inputted into the oscillation circuit. The output from the oscillation circuit is binarized and counted by the resistor circuit and the counter circuit. Then, two-way signal transmission to the control part 512 is attained via the interface circuit, and the current time, the current date, the calendar information and the like are displayed in the display part 515.

The communication part 514 has the same function as that of a conventional portable telephone, and is provided with a wireless part 517, a voice processing part 518, a switch part 519, an amplification part 520, a voice input/output part 521, a telephone number input part 522, a ring alert generation part 523, and a call control memory part 524.

The wireless part 517 undergoes two-way transmission of various data such as voice data and the like to the base station via an antenna 525. The voice processing part 518 codes and decodes the voice signal inputted from the wireless part 517 or the amplification part 520. The amplification part 520 amplifies the signal inputted from the voice processing part 518 or the voice input/output part 521 up to a predetermined level. The voice input/output part 521 comprises a speaker, a microphone or the like, and this amplifies the ring alert or the received voice, or collects the voice.

The ring alert generation part 523 generates a ring alert in accordance with the call from the base station. The switch part 519 turns the amplification part 520 connected to the sound processing part 518 to the ring alert generation part 523 only in calling whereby the ring alert generated in the ring alert generation part 523 is outputted to the voice input/output part 521 via the amplification part 520.

The call control memory part 524 houses a program relating to communication incoming/outgoing call control. The telephone number input part 522 is provided with number keys of, for example, from 0 to 9 and other keys, and by pushing these number keys and others, the calling telephone number or the like is inputted.

The voltage detection part 516 detects the voltage depression and notifies it to the control part 512, when the voltage applied to the various functional parts such as the control part 512 and others from the power source part 511 has fallen below the predetermined level. The predetermined voltage is a value previously set as the minimum voltage necessary for stable operation of the communication part 514, and is, for example, around 3 V. The control part 512 that has received the notice of voltage depression from the voltage detection part 516 inhibits the operation of the wireless part 517, the voice processing part 518, the switch part 519 and the ring alert generation part 523. In particular, the operation stopping of the wireless part 517 that consumes much power is indispensable. Further, the display part 515 displays the unavailability of the communication part 514 owing to the shortage of the battery residue.

Specifically, the voltage detection part 516 and the control part 512 inhibit the operation of the communication part 514, which may be displayed on the display part 515. The display may be a letter message, or for more intuitive expression, a mark (x) (unavailability mark) may be given to the telephone icon to be displayed in the upper part of the display panel of the display part 515.

A power shutdown part 526 capable of selectively shutting down the power relating to the function of the communication part 514 may be provided whereby the function of the communication part 514 may be more surely stopped.

The portable information device 510 of this embodiment comprises the high-quality piezoelectric vibrator 1, in which the airtightness inside the cavity C is secured and of which the operation reliability has been improved, and therefore, the operation reliability of the portable information device itself can also be enhanced and the quality thereof can be increased. In addition, the device can exhibit stable and precision time information for a long period of time.

An example comprising the piezoelectric vibrator 1 of the first embodiment is described in the above; however, the piezoelectric vibrators 101, 201, 401 and 470 of the other embodiments can exhibit the same advantage and effect.

(Radio-Controlled Watch)

Figure 96:
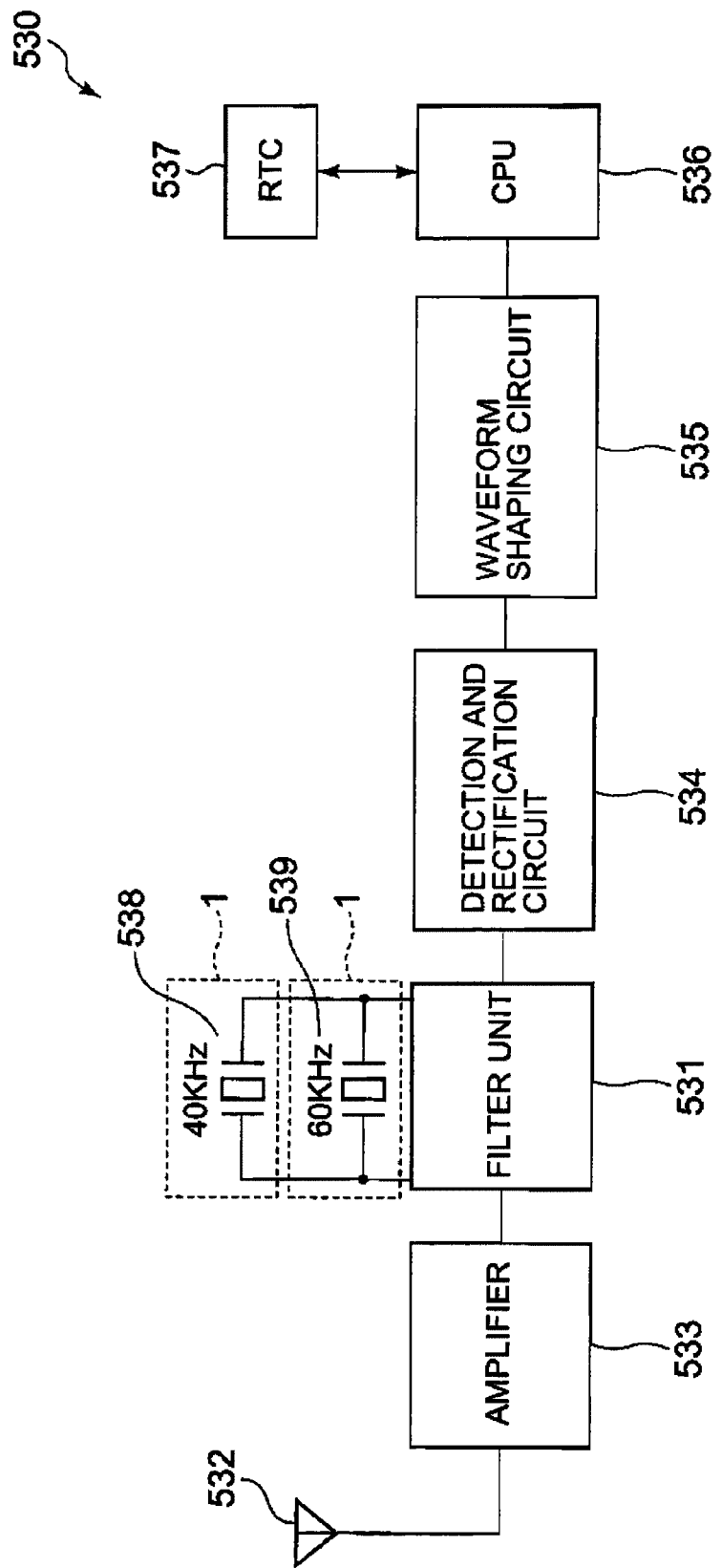
FIG. 96 is a constitutive view showing one embodiment of the radio-controlled watch of the invention.
Figure 97:
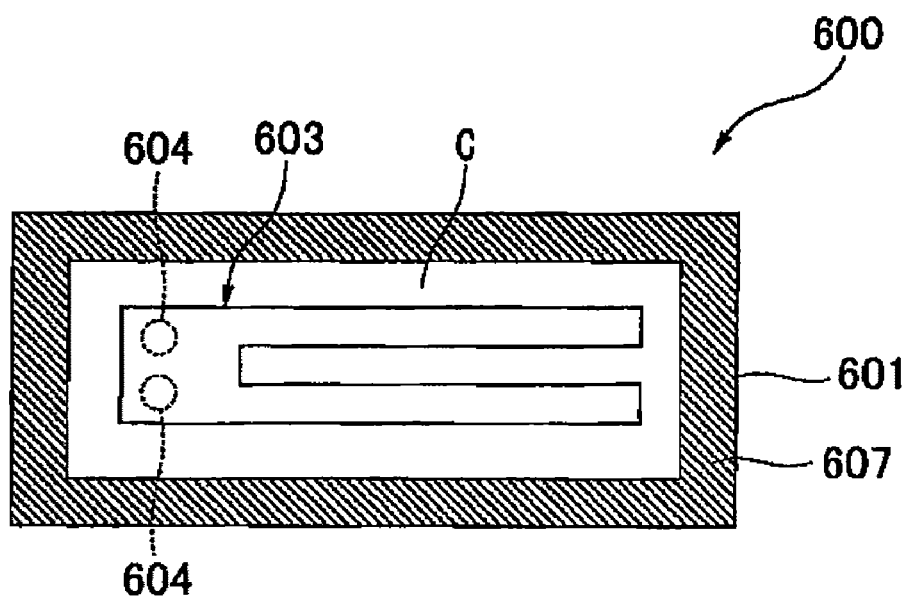
FIG. 97 is an internal configuration view of a conventional piezoelectric vibrator, and is a top view of the piezoelectric vibration member thereof from which the lid substrate was removed.
Figure 98:
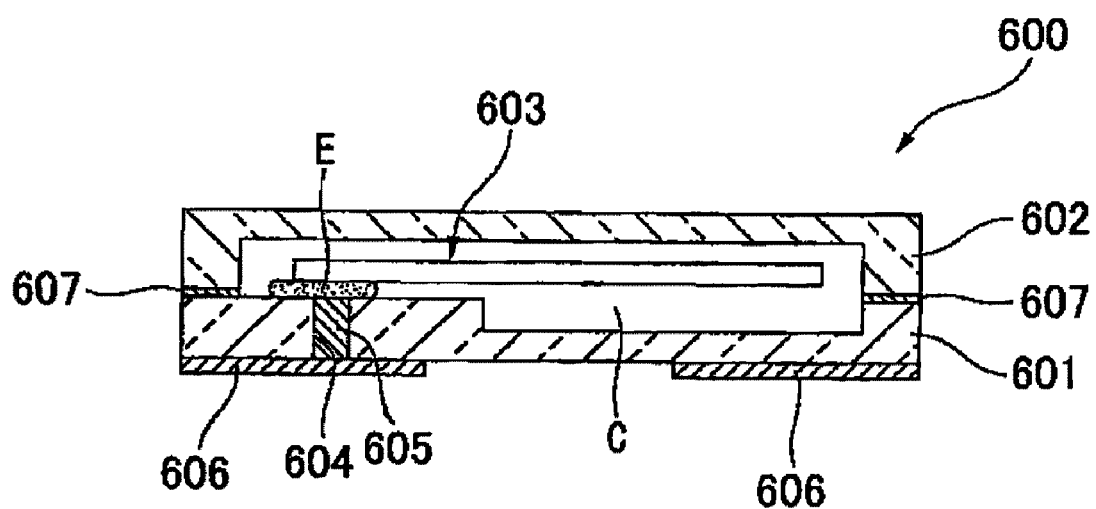
FIG. 98 is a cross-sectional view of the piezoelectric vibrator shown in FIG. 23.

Next described is one embodiment of the radio-controlled watch of the invention, with reference to FIG. 96.

The radio-controlled watch 530 of this embodiment comprises the piezoelectric vibrator 1 electrically connected to a filter part 531, as shown in FIG. 96, and this is a watch having the function of receiving standard waves that include time information, automatically correcting it to a correct time and displaying the time.

In Japan, there are transmitter stations for transmitting standard waves in Fukushima prefecture (40 kHz) and Saga prefecture (60 kHz), and they transmit standard waves. The long wave of 40 kHz or 60 kHz has both the property or passing on the land surface and the property of reflecting on the ionosphere and the land surface and passing thereon; and therefore, its passing region is broad, and the above-mentioned two transmitter stations cover everywhere in Japan.

The details of the functional constitution of the radio-controlled watch 530 are described below.

The antenna 532 receives a long standard wave of 40 kHz or 60 kHz. For the long standard wave, a carrier wave of 40 kHz or 60 kHz is processed for AM modulation with a time information referred to as a time code. The received long standard wave is amplified by the amplifier 533, and filtered and synchronized by the filter part 531 paving a plurality of piezoelectric vibrators 1.

The piezoelectric vibrators 1 in this embodiment each are provided with a quartz crystal vibration member 538 or 539 having the same resonance frequency of 40 kHz or 60 kHz as the above-mentioned carrier frequency.

Further, the filtered signal having a predetermined frequency is detected and demodulated by the detection/rectification circuit 534. Subsequently, via the waveform shaper circuit 535, the time code is taken out, and counted in CPU 536. In CPU 536, information such as the current year, the accumulated date, the week day, the time and the like are read out. The read-out information is reflected by RTC 537, and the accurate time information is thereby displayed.

The carrier wave is 40 kHz or 60 kHz, and therefore, the quartz crystal vibration members 538 and 539 are preferably the above-mentioned, tuning fork-like vibrators.

The above explanation is for an example in Japan; however, the frequency of the long standard wave differs in foreign countries. For example, in Germany, a standard wave of 77.5 kHz is employed. Accordingly, in case where a radio-controlled watch 530 applicable to foreign use is built in a portable device, it further requires the piezoelectric vibrator 1 of which the frequency differs from that in Japan.

The radio-controlled watch 530 of this embodiment comprises the high-quality piezoelectric vibrator 1, in which the airtightness inside the cavity C is secured and of which the operation reliability has been improved, and therefore, the operation reliability of the radio-controlled watch itself can also be enhanced and the quality thereof can be increased. In addition, the watch can count time stably with accuracy for a long period of time.

An example comprising the piezoelectric vibrator 1 of the first embodiment is described in the above; however, the piezoelectric vibrators 101, 201, 401 and 470 of the other embodiments can exhibit the same advantage and effect.

The technical scope of the invention is not limited to the above-mentioned embodiments, and various changes may be given thereto not overstepping the scope and the spirit of the invention.

For example, in the above-mentioned embodiments, an example of a grooved piezoelectric vibration member 4, 104, 204 or 404 having a groove 18, 118, 218 or 418 formed in both faces of the vibration arms 10 and 11, 110 and 111, 210 and 211, or 410 and 411 is illustrated as one example of the piezoelectric vibration member; however, a piezoelectric vibration member not having the groove 18, 118, 218 or 418 may also be employed herein. However, forming the groove 18, 118, 218 or 418 may increase the field effect efficiency between a pair of excitation electrodes 15, 115, 215 or 415 when a predetermined voltage is applied to the pair of excitation electrodes 15, 115, 215 or 415, and therefore the vibration loss may be reduced and the vibration characteristics may be further enhanced. In other words, the CI value (crystal impedance) may be further reduced, and the performance of the piezoelectric vibration member 4, 104, 204 or 404 can be further enhanced. In this respect, forming the groove 18, 118, 218 or 418 is preferred.

In the above-mentioned embodiments, an example of a tuning folk-type piezoelectric vibration member 4, 104, 204 or 404 is illustrated; however, the vibration member is not limited to the tuning folk-type one. For example, it may be a thickness-shear vibration member.

In the above-mentioned embodiments, the base substrate 2, 102, 202 or 402 and the lid substrate 3, 103, 203 or 403 are anodically bonded via a bonding film 35, 135, 235 or 435; but the bonding mode is not limited to anodic bonding. However, anodic bonding is preferred as capable of firmly bonding the two substrates 2, 102, 202 or 402, and 3, 103, 203 or 403.

In the above-mentioned embodiments, the piezoelectric vibration member 4, 104, 204 or 404 is bump-bonded, but the bonding mode is not limited to bump-bonding. For example, the piezoelectric vibration member 4, 104, 204 or 404 may be bonded with an electroconductive adhesive. However, bump-bonding makes it possible to space the piezoelectric vibration member 4, 104, 204 or 404 from the upper face of the base substrate 2, 102, 202 or 402, and naturally ensures the minimum vibration gap necessary for vibration. Accordingly, bump-bonding is preferred.

In the above-mentioned embodiments, the through-hole 1, 101, 201, 401 or 470 is formed to have a pair of through-electrodes; however, the number of the through-electrode formed in the manner as above may be one, or may be 3 or more. In other words, in the piezoelectric vibrator provided with at least one external electrode, at least one of the connection electrodes of electrically connecting the individual external electrodes and the piezoelectric vibration member therein may be the through-electrode formed in the manner as defined herein.

The piezoelectric vibrator manufacturing method of the invention is not limited to the above-mentioned embodiments, so far as an electroconductive tack member comprising a tabular basis part and a core part extending from the basis part in the direction substantially perpendicular to the surface of the basis part is used in the through-electrode forming step therein. For example, as the connection member, a cylindrical body of a glass material and a pasty glass frit may be used as combined.

In addition, not overstepping the spirit and the scope of the invention, the constitutive elements in the above-mentioned embodiments may be substituted with any known constitutive elements, and modifications from the above embodiments may be suitably combined.

The invention claimed is:

1. A method for manufacturing a plurality of piezoelectric vibrators in which a piezoelectric vibration member is sealed up in a cavity formed between a base substrate and a lid substrate bonded to each other by utilizing a base substrate wafer and a lid substrate wafer, the method comprising:
   a recess forming step of forming, in the lid substrate wafer, a plurality of cavity recesses for forming cavities when the base substrate and lid wafers are overlaid;
   a through-electrode forming step of forming a plurality of through-electrodes in and through the base substrate wafer by utilizing an electroconductive tack member having a tabular basis part and a core part extending from the basis part toward a direction nearly perpendicular to a surface of the tabular basis part;
   a routing electrode forming step of forming a plurality of routing electrodes connected electrically with the through-electrodes, on an upper face of the base substrate wafer;
   a mounting step of bonding the plural piezoelectric vibration members to the upper face of the base substrate wafer via the routing electrodes;
   an overlaying step of overlaying the base substrate wafer and the lid substrate wafer thereby to house the piezoelectric vibration members in the cavities surrounded by the recesses and the base substrate and lid substrate wafers;
   a bonding step of bonding the base substrate wafer and the lid substrate wafer thereby to seal up the piezoelectric vibration members in the cavities;
   an external electrode forming step of forming a plurality of external electrodes connected electrically with the through-electrodes, on a lower face of the base substrate wafer; and
   a cutting step of cutting the bonded base substrate and lid substrate wafers thereby to shred them into the plural piezoelectric vibrators;
   wherein the through-electrode forming step includes:
   a through-hole forming step of forming a plurality of through-holes in and through the base substrate wafer;
   a setting step of inserting the core part of the electroconductive tack member into each of these plural through-holes until the basis part is kept in contact with the base substrate wafer, and disposing a connection member formed of a glass material in a space between the core part and each of the through-holes;
   a firing step of firing the connection member at a predetermined temperature to thereby integrally fix each of the through-holes, the connection member and the tack member to each other; and
   a polishing step of, after the firing step, polishing at least the upper and lower faces of the base substrate wafer, having the tabular basis part disposed thereon, to thereby remove the tabular basis part and to expose the core part out of both the upper and lower faces of the base substrate wafer.

2. The method for manufacturing piezoelectric vibrators as claimed in claim 1;
   wherein the core part is formed to extend to a length substantially equal to the thickness of the base substrate wafer and is formed to have a flat end;

as the connection member, a cylindrical body is formed to have two flat ends and a thickness substantially equal to that of the base substrate wafer;

in the setting step, the cylindrical body is implanted in the plural through-holes and the core part of the tack member is inserted into the center hole of the cylindrical body until the tabular basis part thereof is kept in contact with the base substrate wafer;

in the polishing step, the tabular basis part is polished and removed.

3. The method for manufacturing piezoelectric vibrators as claimed in claim 2;

wherein the cylindrical body is one that is previously temporary-fired before the firing step.

4. The method for manufacturing piezoelectric vibrators as claimed in claim 1;

wherein as the connection member, a pasty glass frit is used;

in the setting step, the core part of the tack member is disposed in the plural through-holes and the glass frit is applied onto a face of the base substrate wafer opposite to a face of the base substrate wafer on which the basis part is disposed to thereby fill the glass frit into a space between the through-hole and the core part of the tack member;

in the polishing step, the tabular basis part is removed by polishing the faces of the base substrate wafer on which the tabular basis part is disposed, and the core part is exposed out by polishing the face of the base substrate wafer opposite to the face of the base substrate wafer on which the tabular basis part is formed;

the length of the core part, before the polishing step, is shorter than the thickness of the base substrate wafer.

5. The method for manufacturing piezoelectric vibrators as claimed in claim 4;

wherein the setting step includes a glass frit removing step of removing the glass frit excessively given to the face of the base substrate wafer opposite to the face of the base substrate on which the tabular basis part is disposed, with a squeegee;

the length of the core part is so defined that the squeegee and the core part of the tack member are not brought into contact with each other in the glass frit removing step.

6. The method for manufacturing piezoelectric vibrators as claimed in claim 5;

wherein the length of the core part is shorter by at least 0.02 mm than the thickness of the base substrate wafer.

7. The method for manufacturing piezoelectric vibrators as claimed in claim 1;

wherein as the connection member, a glass frit is used; the setting step includes:

a core part inserting step of inserting the core part of the tack member into an inside of the plural through-holes formed in the base substrate wafer, from one side of the base substrate wafer;

a fixing jig disposing step of disposing a fixing jig that is to regulate a posture of the tack member by putting the basis part of the tack member in the state having the core part thereof inserted into the base substrate wafer, between the base substrate wafer and the jig, on the one side of the base substrate wafer;

a frit filling step of filling a glass frit so as to block up the space between the inner peripheral wall of the through-hole and the tack member; and a tucking step of tucking the basis part of the tack member into the space between the base substrate wafer and the fixing jig by a holding jig that is mutually closely holding the fixing jig and the base substrate wafer, to thereby make the surface of the basis part kept in contact with the base substrate wafer so as to regulate the posture of the tack member in such a manner that and axial line of the core part of the tack member can be in parallel to an axial line of the through hole;

in the firing step, the firing is attained while the basis part of the tack member is kept tucked in the space between the base substrate wafer and the fixing jig by the holding jig;

in the polishing step, the basis part of the tack member is removed by polishing and the upper and lower faces of the base substrate wafer are polished.

8. The method for manufacturing piezoelectric vibrators as claimed in claim 7;

wherein in the tucking step, the fixing jig and the base substrate wafer overlaid with each other are held by the holding jig on respective outer surfaces of the base substrate wafer and the fixing jig.

9. The method for manufacturing piezoelectric vibrators as claimed in claim 1;

wherein as the connection member, a glass frit is used;

in the setting step, the core part of the tack member is inserted into the inside of each of the plural through-holes until the basis part thereof is kept in contact with the substrate wafer, and the glass frit is filled so as to block up the space between the inner peripheral wall of the through-hole and the tack member;

in the polishing step, the basis part of the tack member is polished and removed and the upper and lower faces of the base substrate wafer are polished;

the through-electrode forming step includes a flat face forming step after the polishing step for implanting an implant member into depressions of the upper face of the glass frit and forming a flat face on the upper face side of the glass frit.

10. The method for manufacturing piezoelectric vibrators as claimed in claim 9;

wherein the implant member is an electroconductive material.

11. The method for manufacturing piezoelectric vibrators as claimed in claim 9;

wherein the flat face forming step includes:

an implanting step of implanting the implant member into depressions in an upper face of the glass frit; and a planarizing step of polishing the implant member to thereby form the flat face that is on the same level as that of the upper face of the base substrate wafer by the surface of the implant member and the upper face of the glass frit.

12. The method for manufacturing piezoelectric vibrators as claimed in claim 9;

wherein the implant member is one of which the thermal expansion coefficient is substantially equal to that of the glass frit.

13. The method for manufacturing piezoelectric vibrators as claimed in claim 9;

wherein the implant member is one of which the melting point is lower than that of the glass frit.

14. The method for manufacturing piezoelectric vibrators as claimed in claim 1;

wherein the base substrate wafer and the core part each have the thermal expansion coefficient that is substantially equal to that of the connection member.

15. The method for manufacturing piezoelectric vibrators as claimed in claim 1;

wherein the base substrate wafer is formed of the same glass material as that of the connection member; and the core part has a thermal expansion coefficient that is substantially equal to that of the connection member.

16. The method for manufacturing piezoelectric vibrators as claimed in claim 1;

wherein prior to the mounting step, the method comprises a bonding film forming step of forming, on the upper face of the base substrate wafer, a bonding film to surround a periphery of the recesses when the base substrate wafer and the lid substrate wafer are overlaid;

in the bonding step, the base substrate and lid substrate wafers are anodically bonded via the bonding film.

17. The method for manufacturing piezoelectric vibrators as claimed in claimed 1;

wherein in the mounting step, the piezoelectric vibration members are bump-bonded with an electroconductive bumb.

* * * * *

UNITED STATES PATENT AND TRADEMARK OFFICE
CERTIFICATE OF CORRECTION

PATENT NO. : 8,032,997 B2
APPLICATION NO. : 12/857234
DATED : October 11, 2011
INVENTOR(S) : Masashi Numata et al.

Page 1 of 1

It is certified that error appears in the above-identified patent and that said Letters Patent is hereby corrected as shown below:

In the Claims

In column 68, claim 17, line 9, replace "bumb." with --bump.--.

Signed and Sealed this
Seventeenth Day of April, 2012

David J. Kappos
*Director of the United States Patent and Trademark Office*